(12) United States Patent
Lam et al.

(10) Patent No.: US 7,793,028 B1
(45) Date of Patent: Sep. 7, 2010

(54) LONG LATENCY INTERFACE PROTOCOL

(75) Inventors: Yat-Tung Lam, Palo Alto, CA (US);
Pantas Sutardja, San Jose, CA (US)

(73) Assignee: Marvell International, Ltd., Hamilton (BM)

(*) Notice: Subject to any disclaimer, the term of this patent is extended or adjusted under 35 U.S.C. 154(b) by 0 days.

(21) Appl. No.: 12/364,608

(22) Filed: Feb. 3, 2009

Related U.S. Application Data

(63) Continuation of application No. 11/973,633, filed on Oct. 9, 2007, now Pat. No. 7,487,268, which is a continuation of application No. 09/759,151, filed on Jan. 16, 2001, now Pat. No. 7,281,065.

(60) Provisional application No. 60/225,748, filed on Aug. 17, 2000, provisional application No. 60/236,180, filed on Sep. 29, 2000, provisional application No. 60/249,287, filed on Nov. 17, 2000.

(51) Int. Cl.
*G06F 13/14* (2006.01)

(52) U.S. Cl. .................. 710/305; 710/14; 710/60

(58) Field of Classification Search .......... 710/300, 710/305, 55, 56, 58, 62; 714/769; 713/400, 713/600
See application file for complete search history.

(56) References Cited

U.S. PATENT DOCUMENTS

| | | | |
|---|---|---|---|
| 3,571,806 A | 3/1971 | Makie et al. | |
| 4,346,440 A | 8/1982 | Kyu et al. | |
| 4,607,348 A | 8/1986 | Sheth | |
| 4,771,378 A * | 9/1988 | Halford | ............ 713/400 |
| 4,779,196 A | 10/1988 | Manga | |
| 4,803,567 A * | 2/1989 | Wilkinson et al. | ............ 386/122 |
| 5,133,060 A | 7/1992 | Weber et al. | |
| 5,151,999 A | 9/1992 | Marzucco et al. | |
| 5,164,867 A * | 11/1992 | Hagiwara et al. | ........ 360/77.05 |
| 5,218,686 A | 6/1993 | Thayer | |
| 5,228,129 A | 7/1993 | Bryant et al. | |
| 5,235,683 A | 8/1993 | Dahlerud | |
| 5,264,958 A | 11/1993 | Johnson | |
| 5,274,772 A | 12/1993 | Dunn et al. | |

(Continued)

OTHER PUBLICATIONS

Hans-Peter Messmer, "The Indispensable PC Hardware Book", 1995, Addison-Wesley Publishers, Ltd., 2nd Ed. pp. 1072-1077.

(Continued)

*Primary Examiner*—Khanh Dang

(57) ABSTRACT

An interface supports a signaling protocol between a first hardware component and a second hardware component. The interface includes a first pin to provide a first clock signal sourced from the first hardware component to the second hardware component during a first operation, the first operation being an operation in which data is being transferred from the first hardware component to the second hardware component. A second pin to receive a second clock signal sourced from the second hardware component during a second operation, the second operation being an operation in which data is being transferred from the second hardware component to the first hardware component. A third pin to provide a first gate control signal sourced from the first hardware component to the second hardware component, the first gate control signal to synchronize data transfer between the first hardware component and the second hardware component during both the first operation and the second operation. The first gate control signal is gated based on the first clock signal or the second clock signal.

17 Claims, 37 Drawing Sheets

U.S. PATENT DOCUMENTS

| | | | |
|---|---|---|---|
| 5,313,340 A * | 5/1994 | Takayama et al. | 360/48 |
| 5,339,395 A | 8/1994 | Pickett et al. | |
| 5,444,857 A | 8/1995 | Rowland | |
| 5,544,334 A | 8/1996 | Noll | |
| 5,555,380 A | 9/1996 | Suzuki | |
| 5,561,823 A * | 10/1996 | Anderson | 710/52 |
| 5,564,027 A | 10/1996 | Bui et al. | |
| 5,568,470 A | 10/1996 | Ben-Nun et al. | |
| 5,592,632 A | 1/1997 | Leung et al. | |
| 5,592,682 A | 1/1997 | Chejlava et al. | |
| 5,596,737 A | 1/1997 | Strang, Jr. | |
| 5,603,052 A | 2/1997 | Chejlava et al. | |
| 5,613,136 A | 3/1997 | Casavant et al. | |
| 5,652,848 A | 7/1997 | Bui et al. | |
| 5,675,829 A | 10/1997 | Oskouy et al. | |
| 5,694,614 A | 12/1997 | Bennett | |
| 5,758,191 A | 5/1998 | Kasebayashi et al. | |
| 5,802,554 A | 9/1998 | Caceres et al. | |
| 5,835,144 A | 11/1998 | Matsumura et al. | |
| 5,838,934 A | 11/1998 | Boutaud et al. | |
| 5,844,920 A | 12/1998 | Zook et al. | |
| 5,905,601 A * | 5/1999 | Tsunoda | 360/51 |
| 5,920,709 A | 7/1999 | Hartung et al. | |
| 5,963,386 A | 10/1999 | Assouad | |
| 6,009,549 A | 12/1999 | Bliss et al. | |
| 6,034,829 A * | 3/2000 | Suzuki et al. | 360/25 |
| 6,088,754 A | 7/2000 | Chapman | |
| 6,147,826 A | 11/2000 | Hashimura | |
| 6,167,461 A | 12/2000 | Keats et al. | |
| 6,178,057 B1 | 1/2001 | Kuroda et al. | |
| 6,272,589 B1 | 8/2001 | Aoki | |
| 6,272,651 B1 | 8/2001 | Chin et al. | |
| 6,278,568 B1 * | 8/2001 | Cloke et al. | 360/51 |
| 6,286,061 B1 | 9/2001 | Ross | |
| 6,298,408 B1 | 10/2001 | Park | |
| 6,301,633 B1 | 10/2001 | Chapman | |
| 6,378,007 B1 | 4/2002 | Southwell | |
| 6,393,506 B1 | 5/2002 | Kenny | |
| 6,407,913 B1 | 6/2002 | Peachey et al. | |
| 6,513,105 B1 | 1/2003 | Pontius | |
| 6,519,667 B2 | 2/2003 | Kondo et al. | |
| 6,539,439 B1 | 3/2003 | Nguyen et al. | |
| 6,556,365 B2 | 4/2003 | Satoh | |
| 6,581,141 B1 | 6/2003 | Kelley et al. | |
| 6,636,906 B1 | 10/2003 | Sharma et al. | |
| 6,668,290 B1 | 12/2003 | Nelson | |
| 6,711,225 B1 | 3/2004 | Sutardja et al. | |
| 6,757,698 B2 | 6/2004 | McBride et al. | |
| 6,871,251 B1 | 3/2005 | Azimi | |
| 6,931,473 B2 | 8/2005 | Graham et al. | |
| 7,110,200 B2 | 9/2006 | Tomimoto | |
| 7,117,498 B2 | 10/2006 | Li | |
| 7,281,065 B1 | 10/2007 | Lam et al. | |
| 7,487,268 B1 * | 2/2009 | Lam et al. | 710/33 |

OTHER PUBLICATIONS

Lee, ChangHwan, "IEEE Standard 1394 Serila Bus", 1998, Pusan National University, 8 pages.

T. Chelcea, "A Low-Latency FIFO for Mixed-Clock Systems", Department of Computer Science, Columbia University, 45 pages.

\* cited by examiner

| SF_HEADER | User data for Multiple codewords | END_SECTOR |

Fig. 23

| SF_HEADER | 1st set user data | SF_HEADER | 2nd set user data | SF_HEADER | 3rd set user data | END_SECTOR |

Fig. 24

LONG LATENCY INTERFACE PROTOCOL

CROSS-REFERENCE TO RELATED APPLICATIONS

This application is a continuation of U.S. patent application Ser. No. 11/973,633, filed Oct. 9, 2007 now U.S. Pat. No. 7,487,268, which is a continuation of U.S. patent application Ser. No. 09/759,151 (now U.S. Pat. No. 7,281,065), filed Jan. 16, 2001, which application claims priority under 35 U.S.C. §119(e) from U.S. Provisional Application No. 60/225,748, filed Aug. 17, 2000; U.S. Provisional Application No. 60/236,180, filed Sep. 29, 2000; and U.S. Provisional Application No. 60/249,287, filed Nov. 17, 2000. The disclosures of the above applications are incorporated herein by reference in their entirety.

This application is related to U.S. Pat. No. 6,871,251, entitled "High Latency Interface Between Hardware Components," issued Mar. 22, 2005, the contents of which are incorporated by reference herein.

BACKGROUND OF THE INVENTION

1. Field of the Invention

The present invention relates to a versatile, latency-independent interface between hardware components, such as between a read/write (R/W) channel or read channel (RDC) and a hard disk controller (HDC). Such an interface is flexible enough to support high read and write latencies of greater than one sector, a split sector format, and a second sector mark.

2. Description of the Related Art

As is shown in FIG. 1, a typical disk drive system includes a hard disk controller (HDC) 12 that interfaces with a R/W channel or RDC 14 which is in communication with a disk 16. Data transfer between HDC 12''' and the R/W channel is synchronized by read gate (RGATE) and write gate (WGATE) control signals. In a read operation, R/W channel 14 processes an incoming analog signal from disk 16 and transfers the data to HDC 12. In a write operation, data is transferred from HDC 12''' to the R/W channel to be written to the disk. Latency refers to the time or byte delay that data remains in the R/W channel. Some disk drive systems have latencies of about 20 bytes which, depending on the particular system, amounts to a time delay of between about 800 ns and 5 ms.

Technology such as iterative turbo coding, which is being introduced into modern disk drive systems, requires more processing before the data is available, which, in turn, requires R/W channels or RDCs with higher latencies. One problem is that the interface used in the shorter latency systems is not capable of supporting the higher latencies. Accordingly, a new interface is needed that supports higher latency R/W channel or RDC designs.

SUMMARY OF THE INVENTION

According to a first aspect of the present invention, a latency-independent interface between first and second hardware components is provided comprising, a serial control data circuit that transmits a serial control data signal and a data circuit that transmits or receives data under the control of the serial data gate signal. The serial control data signal comprises information as to whether the data is one of split and non-split.

According to a second aspect of the present invention, a latency-independent interface between first and second hardware components, comprising a serial control data circuit that transmits a serial control data signal, a data circuit that transmits or receives data under the control of the serial control data signal, and a sync mark transceiver that transmits or receives sync mark information. During a write operation a first assertion by the first hardware component of the sync mark information indicates a start of sync mark insertion and a second assertion by the first hardware component of the sync mark information indicates a start of writing of padding data, and during a read operation by the second hardware component information that a sync mark was detected.

According to a third aspect of the present invention, a latency-independent interface between first and second hardware components, comprises a serial control data circuit that transmits a serial control data signal, a data circuit that transmits or receives data under the control of the serial data gate signal, and a ready transceiver that transmits or receives a ready signal. During a write operation the ready signal indicates the second hardware component is ready to receive data from the first hard component; and during a read operation the ready signal indicates the first hardware component is ready to receive data from the second hard.

According to a third aspect of the present invention, a method of transmitting and receiving signals between first and second hardware components comprises the steps of transmitting a serial control data signal, and transmitting or receiving data under the control of the serial control data signal. The serial control data signal comprises information as to whether the data is one of split and non-split.

According to a fourth aspect of the present invention, computer program for transmitting and receiving signals between first and second hardware components, comprises the steps of receiving a serial control data signal and transmitting or receiving data under the control of the serial control data signal. The serial control data signal comprises information as to whether the data is one of split and non-split.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts.

FIG. 23 is a schematic diagram of a data format without a split, in accordance with the second embodiment of the invention;

FIG. 24 is a schematic diagram of a data format with a split, in accordance with the second embodiment of the invention;

DESCRIPTION OF THE PREFERRED EMBODIMENTS

First Embodiment

Figure 1:
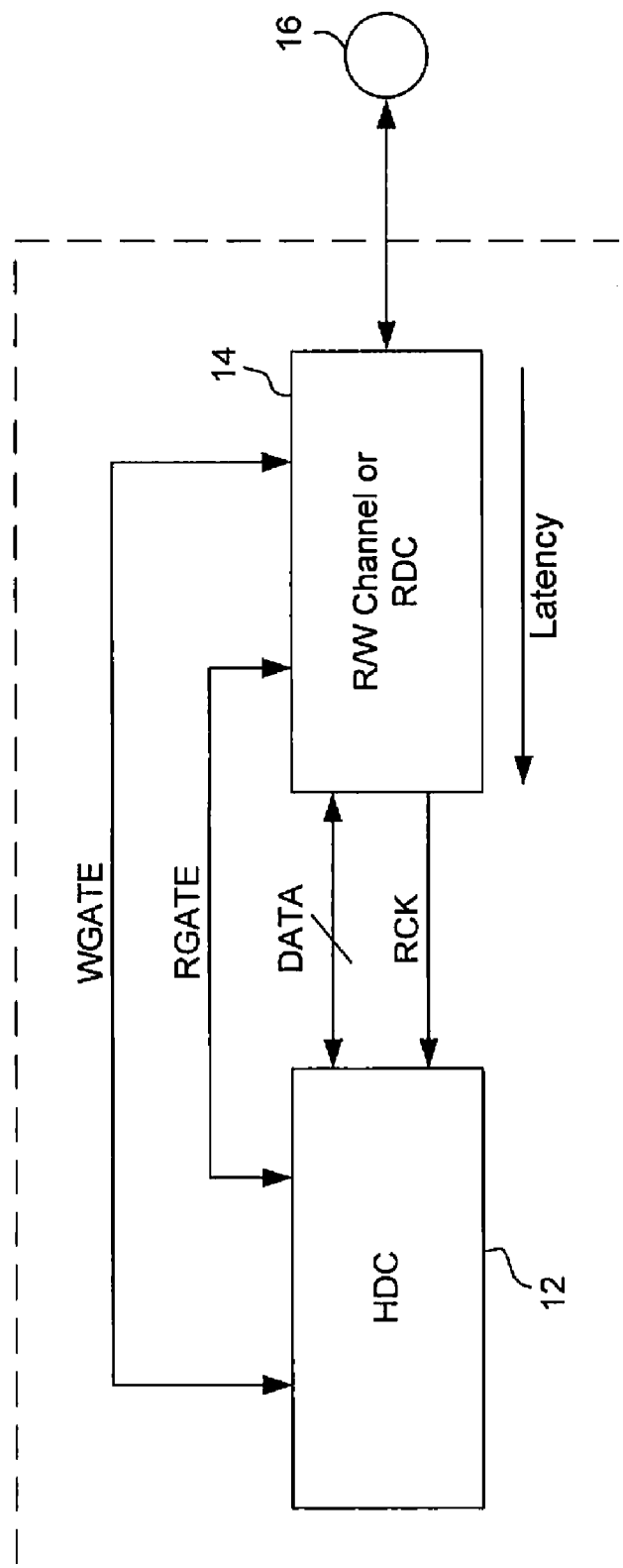
FIG. 1 is a block diagram of a conventional RDC/HDC interface.
Figure 2:
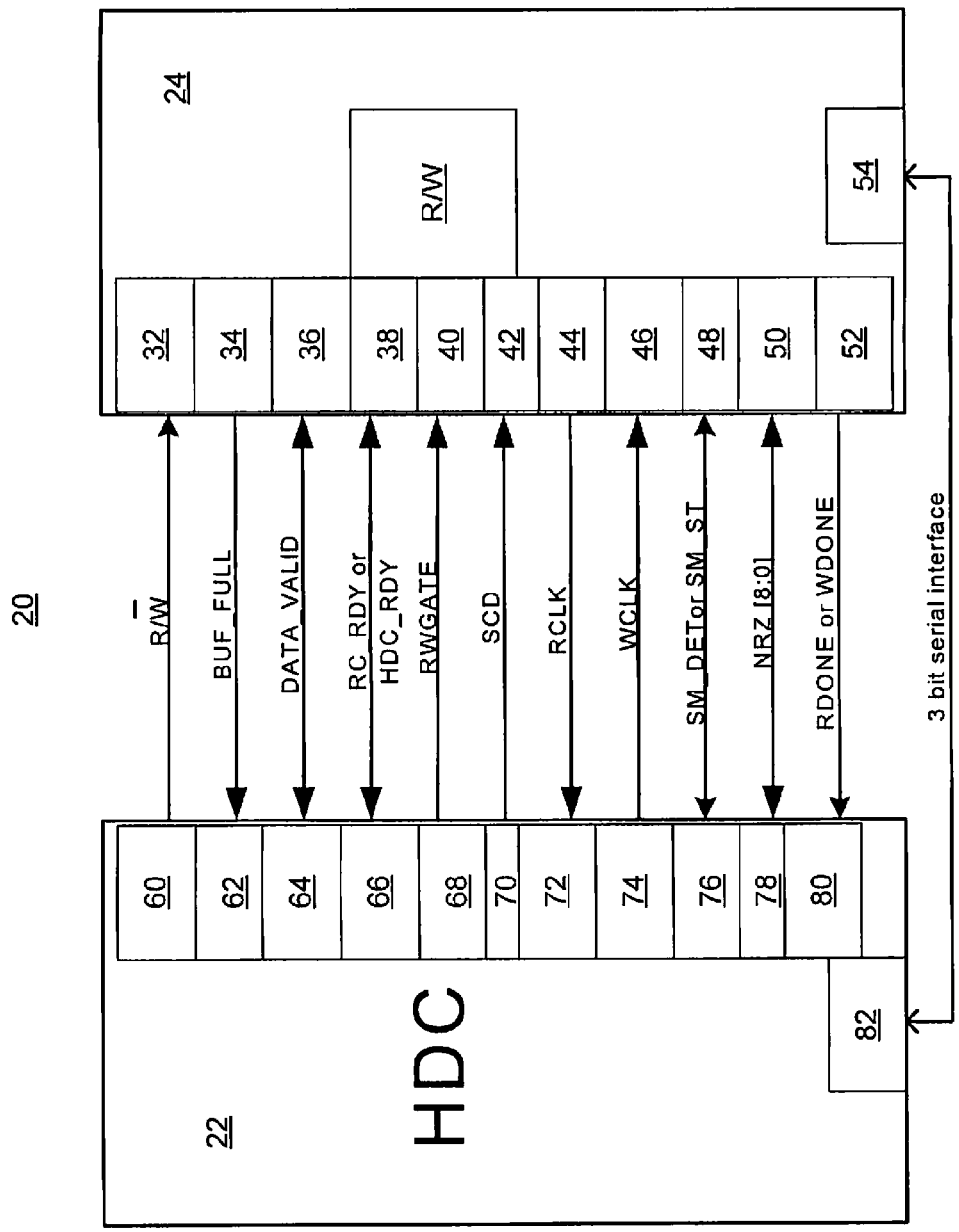
FIG. 2 is a block diagram of an interface between two hardware components, such as an HDC and an RDC or R/W channel, in accordance with a first embodiment of the invention.

Referring to FIG. 2, a block diagram of an interface 20 between a first hardware component 22 and a second hardware component 24, in accordance with a first embodiment of the present invention, is illustrated. In a preferred embodiment, first hardware component 22 is a hard disk controller (HDC) and second hardware component 14 is a read/write (R/W) channel or read channel (R/W channel 24), although the invention is not so limited. Rather, interface 20 of the present invention may be employed in connection with other suitable functional hardware components between which data is transferred.

In accordance with the invention, interface 20 employs a new signaling protocol, which decouples the timing of the conventional read, and writes gate control signals by replacing them with a single RWGATE signal. Additionally, five more signals are added in the preferred embodiment. A description of these signals is described below. The interface supports the following features:

multiple sectors of read and write delay;

multiple codewords per sector;

multiple splits per sector;

multiple codeword sizes per sector;

expandable serial interface (SCD pin—Serial Control Data); and data recovery between $1^{st}$ sync mark and $2^{nd}$ sync mark.

In the illustrated embodiment, the interface 20 of the present invention employs a read clock signal (RCLK), sourced from R/W channel 24 and output during read operations, and a write clock signal (WCLK) sourced from HDC 22 and output during write operations. A R/W signal, sourced from HDC 22, is provided in which a "1" indicates a read operation and a "0" indicates write operation. Of course, as will be appreciated by one of ordinary skill in the art, other bit configurations may be utilized for the R/W signal. Alternatively, this signal may be replaced by programming an internal register. A BUF_FULL signal, source from the R/W channel 24 indicates an internal buffer from R/W channel 24 is almost full. More specifically, once the BUF_FULL signal goes high, only 8 more bytes of data can be transferred. During a write operation if BUF_FULL goes high, HDC 22 either asserts a RWGATE signal to flush out the data from the internal buffer or HDC 22 resets R/W channel 24. Otherwise R/W channel 24 will continue to wait.

During a read operation, BUF_FULL goes high only when HDC 22 is not ready for data transfer and RWGATE stays high. HDC 22 will then need to either assert a HDC_RDY signal or to reset R/W channel 24.

A DATA_VALID signal can be source from either HDC 22 or R/W channel 24. During a write operation, DATA_VALID is sourced from HDC 24 and indicates the 9-bit NRZ data bus is valid when it goes high. Therefore, R/W channel 24 can latch the NRZ data from the bus correctly at the rising edge of WCLK. During a read operation, Data_Valid is sourced from R/W channel 24 and indicates the 9-bit NRZ data bus is valid when it high. Therefore, HDC can latch the data from the bus correctly at the rising edge of RCLK.

A RDY signal comprises a RC_RDY during the write operation and a HDC_RDY, during the read operation. RC_RDY signal is source by R/W channel 24 goes high when R/W channel 24 is ready for HDC 22 to assert RWGATE. HDC_RDY signal is sourced by HDC 22 and goes high when HDC 22 is ready for R/W channel 24 to assert DATA_VALID. The RWGATE signal is source by HDC 22. When R/W is set for the read operation (or =1) RWGATE=RGATE, and when R/W is set for the write operation (or =0) RWGATE=WGATE.

The Serial Control Data Transfer utilizes the SCD pin to transfer important control information from HDC 22 to R/W channel 24 for both read and write operations. Each serial transfer contains one START bit followed by 10 bits of control data and one END bit. If the END bit goes low at the end of a transfer, it indicates the completion of the transfer. Otherwise, another 10 bits of control data and one END bit are expected. Therefore, HDC 22 can transfer for unlimited number of times 10-bit control data to the R/W channel 24 as long as every END bit is "1". This facility provides flexibility and allows for expandable and additional feature sets for any future development.

For a write operation, the START bit gated with DATA_VALID is used to indicate the beginning of a transfer. Similarly for a read operation, the START bit gated with RWGATE is used to indicate the beginning of a transfer. However, the data on SCD pin has slightly different definition during Read and Write operations. Detailed description of the SCD pin can be found in Table 1 below.

SCD Functional Description

TABLE 1

SCD Pin Function Descriptions

| Bit Definition | Description |
| --- | --- |
| Start Bit | "1" means start a transfer. Once started the R/W channel 24 looks for End bit to stop. |
| Instruction Bit | Only available in read operation. "1" means long instruction and "0" means short instruction. |
| Split Bit | Only available in Write Operation. "1" means split and "0" means non-split |
| Mode Bit[1:0] | During Read Operation, it indicates sector types as following: 00 = non-split 01 = first-split 10 = continue-split 11 = last-split During Write Operation: Not used or Reserved |
| Reserve Bit[2:0] | Reserved. |
| Counter[13:0] | During Read Operation: If Instruction Bit = 1, Counter[13:0] is the read counter value which indicates the number of bytes expected to be read during current RWGATE. If Instruction Bit = 0, Counter[7:0] is the read counter value which indicates the number of bytes expected to be read during current RWGATE. During Write Operation: 14-bit write counter value to indicate the total number of bytes to write for one sector. |
| Codeword_Size[9:0] | 10-bit codeword size used for the current sector. In the presence of multiple codeword sizes, Codeword_Size can be sent to the R/W channel 24 one by one. |

Interface 20 also comprises an RCLK signal sourced by R/W channel 24 having a constant width of 8 times R/W channel 24 clock and an WCLK signal sourced by HDC 22 having the same clock frequency as RCLK but at a different phase.

A SM_ST or a SM_DET signal is also provided. During the write operation, SM_ST is asserted by HDC 22 twice for each RWGATE. The first assertion indicates the start of Sync Mark insertion. The second assertion indicates the start of Write padding data. Therefore, HDC 22 can freely control the lengths of Sync Field and Write padding data. At the same time, R/W channel 24 knows the number of data bytes written by counting the number of WCLK's between the two SM_ST assertions. Since iterative encoding adds 28 bytes per codeword, HDC 22 need to add 28 times the number of words per sector bytes into the total write padding length.

During the read operation, SM_DET is asserted by R/W channel 24 to indicate that the Sync Mark is found after RWGATE is asserted. The NRZ[8:0] signal is source by either HDC 22 or R/W channel 24. During the write operate NRX[8:0] is source by HDC 22 as an input to R/W channel 24. NRZ[8] is the parity bit and NRZ[7:0] is the user data including data permuted by ECC (error correcting code) and/or RLL (run length limited coding). HDC 22 functions to ensure user data is in 8-bit form. If the last user data in a string is less than 8 bits, HDC 22 pads the last string so that it is 8 bits. During the read operation NRZ[8:0] is sourced by R/W channel 24. NRZ[8] is a multi-purpose bit and NRZ[7:0] is the user data, which is read back.

Interface 20 may contain a RDONE or a WDONE signal. During the write operation, WDONE indicates one RWGATE write completion, and during the read operation, RDONE indicates one RWGATE read completion.

Each of HDC 22 and the R/W channel 24 include appropriate circuitry for transmitting and receiving the various signals, data and mode selection information between the two hardware components. For example, HDC 22 includes a R/W transmit circuit 60 that transmits the R/W signal to R/W receiver circuit 32 on R/W channel 24, a data valid transceiver circuit 64 that transmits the DATA_VALID signal to and receives the DATA_VALID signal from a data valid transceiver circuit 36 on R/W channel 24. A ready transceiver 66 is provided in HDC 22 to transmit HDC_RDY signal to and receive RC_RDY signal from a ready transceiver circuit 38 on R/W channel 24. HDC 22 also comprises a RWGATE transmit circuit 68 which transmits the RWGATE signal to RWGATE receive circuit 40 of R/W channel 24. HDC 22 also includes a write clock transmit circuit 74 to transmit the WCLK signal to write clock receive circuit 46 on R/W channel 24. HDC 22 comprises a SM transceiver 76, which transmits the SM_DET or SM_ST signal to and receives the SM_DET or SM_ST signal from the SM transceiver 48 on R/W channel 24. HDC 22 and R/W channel 24 comprise respective NRZ transceivers 78 and 50, respectively, for exchanging NRZ data and serial transceivers 82 and 54 respectively for exchanging serial data. R/W channel 24 comprises a buffer full transmit circuit 34 to transmit the BUF_FULL signal to a buffer full receive circuit 62 on HDC 22, a receive clock transmit circuit 44 to transmit RCLK signal to a receive clock receive circuit 72 on HDC 22. R/W channel 24 comprises done transmit circuit 52 to transmit the RDONE or WRITE done signal to done receive circuit 80.

Signal and data transmitting, receiving and transceiving circuits are generally known, and based on the teachings provided herein, one skilled in the art would be able to construct and implement transmitting and receiving circuits to carry out the specific signaling protocol described herein.

Figure 3:
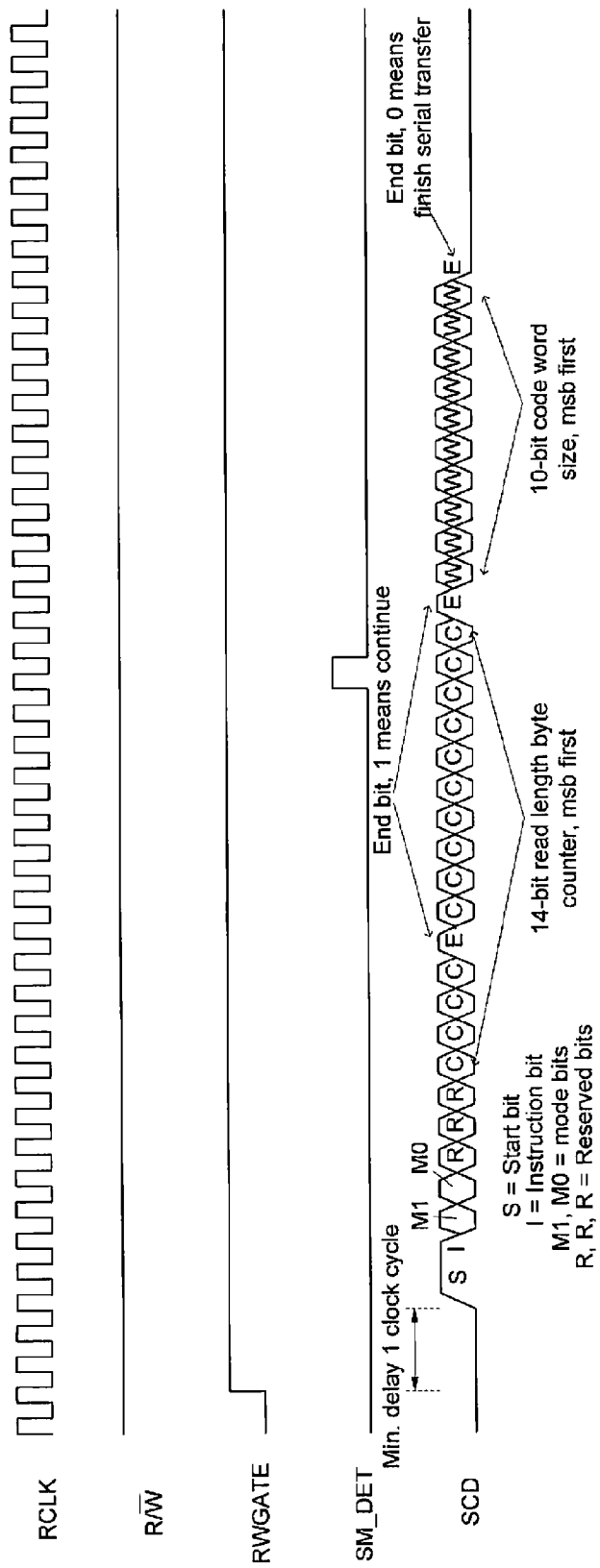
FIG. 3 is a timing diagram of a read operation with a long instruction in accordance with the first embodiment of the present invention.

FIG. 3 is a timing diagram of a read operation with a long instruction in accordance with the first embodiment of the present invention. The SCD transfer occurs during the read operation right after RWGATE is asserted. As shown therein, in the SCD signal, the first or START bit, goes from low to high indicating the start of a transfer. The next bit is an Instruction Bit. In FIG. 3, it is set to "1" to indicate a long instruction. The next 2 bits, Mode Bit[1:0], indicate sector type of this RWGATE. It can be non-split, first-split, continue-split or last-split sector. The next 3 bits are reserved. The last 4 bits for this 10-bit SCD data are the most significant bits (MSBits) of a 14-bit read counter. The least significant (LSBits) 10 bits are provided in the next 10-bit SCD data transfer.

At the end of the 10-bit SCD data transfer, an END bit is appended to indicate the continuation or termination of the transfer. In the example of FIG. 3, the END bit is set to "1", indicating that there will be a continuation of data transfer in the next SCD data. In the example illustrated herein, the LSBits 10 bits are provided in the next 10-bit SCD data.

The next 10-bit SCD data contains the LSBits of the read counter. In this example the End bit is set to "1" to indicate another 10-bit SCD data transfer. The next (or third) 10-bit SCD data contains the codeword size information. The End bit is set to "0" to indicate the end of the SCD data transfer.

Figure 4:
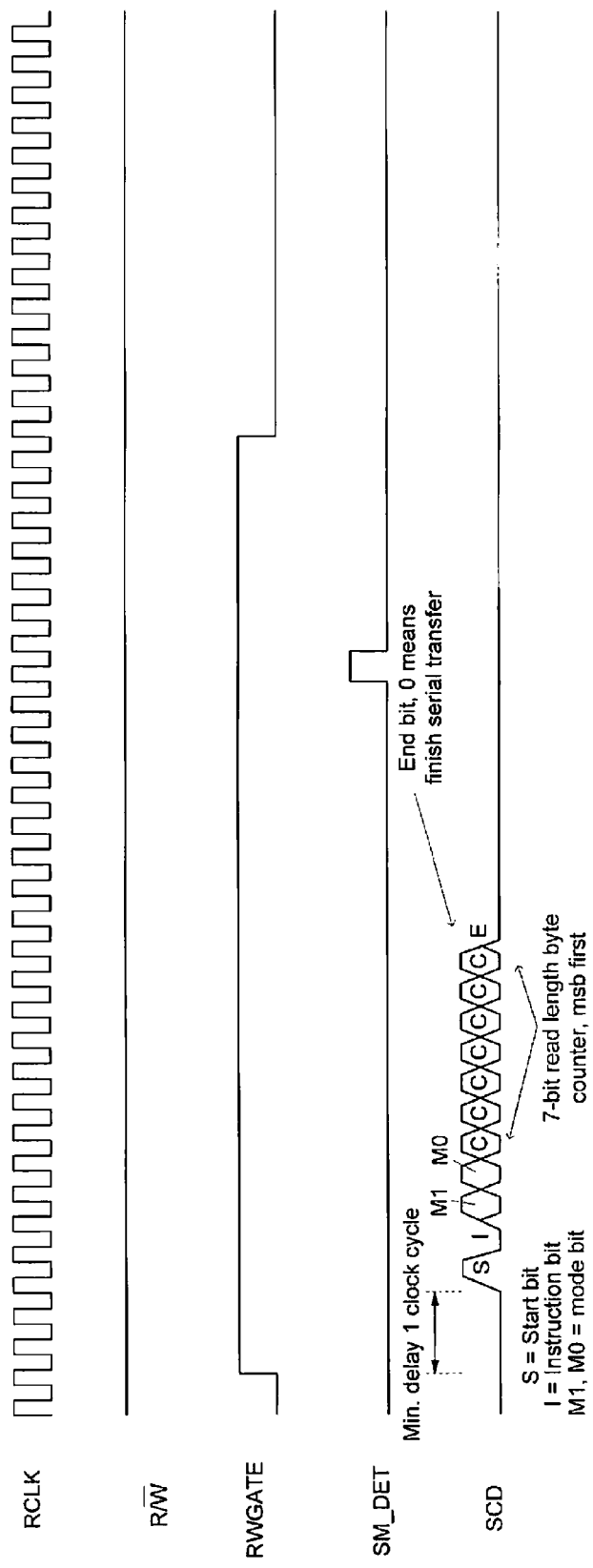
FIG. 4 is a timing diagram of a read operation with a Short Instruction in accordance with the first embodiment of the present invention.

FIG. 4 illustrates a timing diagram of a read operation with a Short Instruction in accordance with the first embodiment of the present invention. For this operation, the first bit, START Bit, goes from low to high indicating the start of a transfer. As shown therein, the first bit of the 10-bit SCD data is Instruction Bit which is set to "0" indicating a short instruction. The next 2 bits, Mode Bit[1:0], indicate sector type of this RWGATE. It can be non-split, first-split, continue-split or last-split sector. The next 7 bits are the value of the 7-bit read counter. For a read operation expected to read the data less than 127 bytes it is advantageous to use the Short Instruction.

Figure 5:
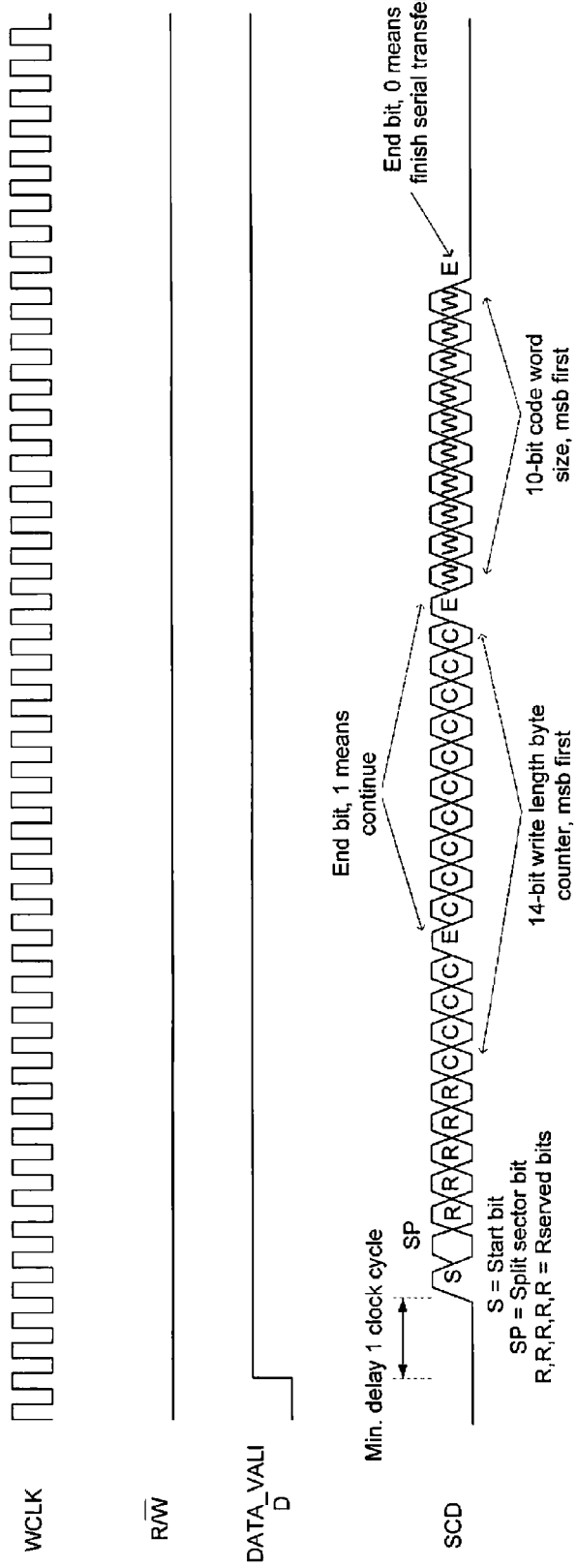
FIG. 5 is a timing diagram of a write operation of an SCD serial transfer occurring right after a DATA_VALID assertion in accordance with the first embodiment of the present invention.

FIG. 5 illustrates a timing diagram of a write operation of an SCD serial transfer occurring right after a DATA_VALID assertion in accordance with the first embodiment of the present invention. In this write operation, the first bit (START Bit) goes from low to high indicating the start of a transfer. The first bit of the following 10-bit SCD data is Split Sector Bit, which is set to "1" indicating a split sector. The next 5 bits are reserved. The last 4 bits for this 10-bit SCD data are the MSBits of a 14-bit write counter. At the end of the current 10-bit SCD data transfer, an END bit is set to "1", and is appended to indicate the continuation of the transfer. In this example, the least significant 10 bits of the 14 bit write counter are sent in the next 10-bit SCD data transfer. The End bit of "1" is asserted to indicate another 10-bit SCD data transfer. The 10-bit SCD data is the codeword size information. For this 10-bit SCD data the End bit of "0" is asserted to indicate the end of the SCD data transfer.

Figure 6:
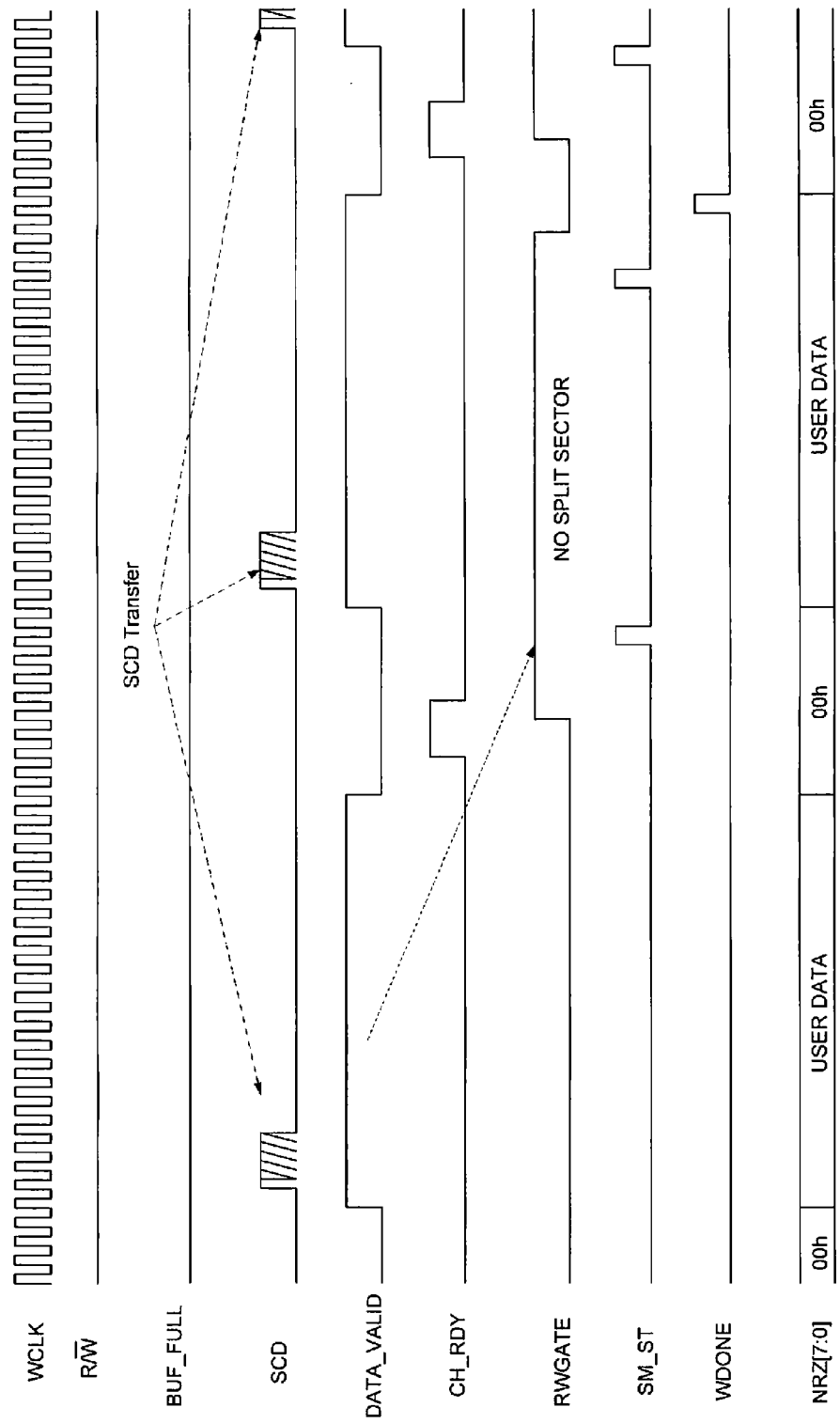
FIG. 6 is a timing diagram of a write operation for a single codeword per sector without split in accordance with the first embodiment of the present invention.

FIG. 6 is a timing diagram of a write operation for a single codeword per sector without split, in accordance with the first embodiment of the present invention. As shown therein, a write operation of 1 codeword per sector without split is performed. The sector control information is sent through the SCD pin at the beginning of the DATA_VALID signal. HDC 22 sends the sector type, total number of user data bytes and the codeword size information for this sector to R/W channel 24.

After R/W channel 24 finishes the iterative encoding, CH_RDY is asserted by R/W channel 24 to indicate that it is ready to transfer the encoded data. Then HDC 22 asserts RWGATE, and thereafter HDC 22 asserts the first SM_ST to indicate the start of Sync Mark and the second one to indicate the start of Write padding data operation. As a result of this interface, HDC 22 can freely control the lengths of the Sync Field and the Write padding data for each RWGATE asserted during a write operation.

Figure 7:
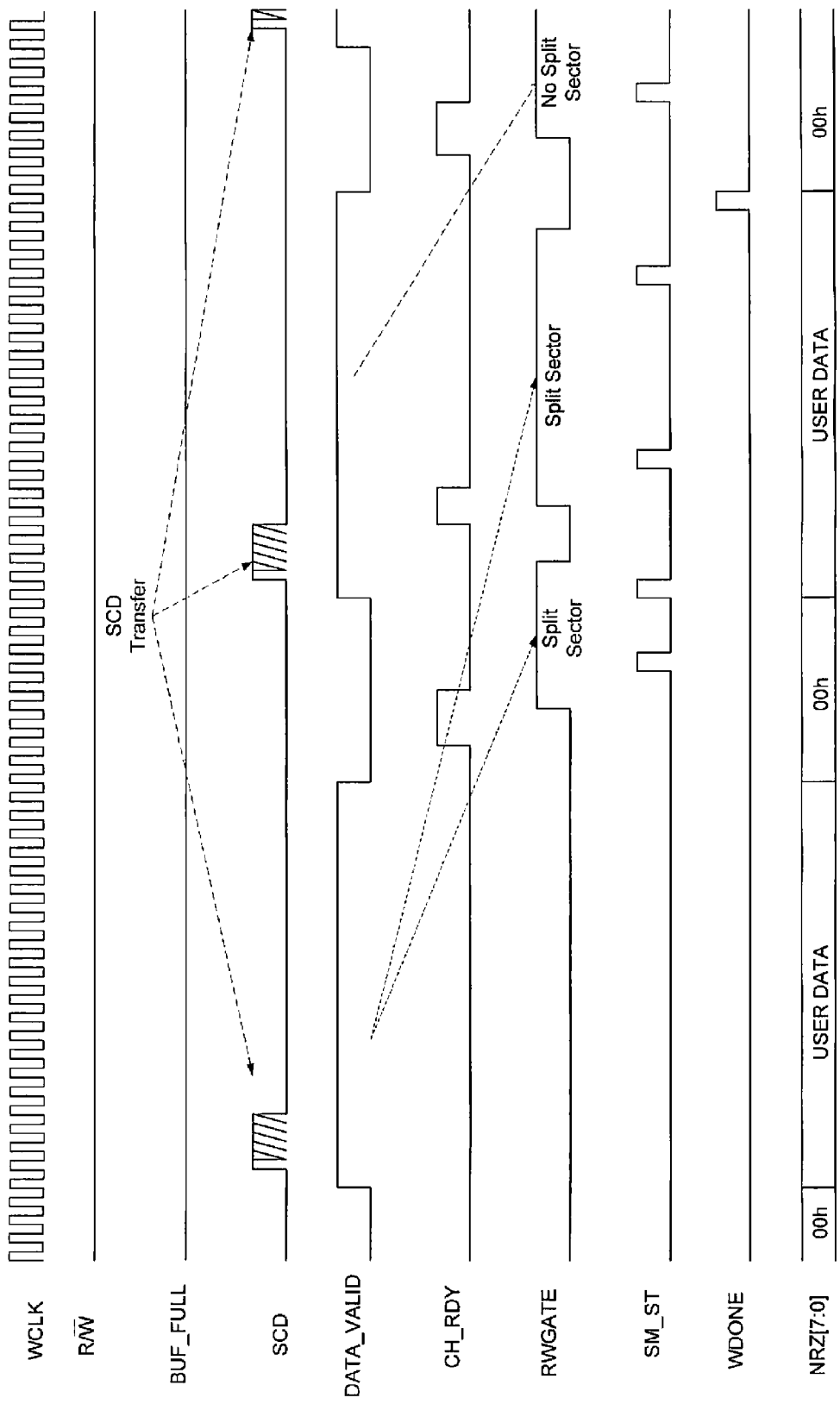
FIG. 7 is a timing diagram for a write operation for a single codeword per sector with split assertion in accordance with the first embodiment of the present invention.

FIG. 7 is a timing diagram for a write operation for a single codeword per sector with split assertion in accordance with the first embodiment of the present invention. In FIG. 7, a write operation of 1 codeword per sector with 1 split is performed. First, the entire codeword of user data is transferred to R/W channel 24. HDC 22 uses DATA_VALID to qualify the NRZ data bus. At the beginning of DATA_VALID assertion, HDC 22 transfers sector control data information to R/W channel 24 via SCD pin. In order to track the completion of one user data sector transfer, R/W channel 24 counts between each pair of SM_ST during each RWGATE and adds all the counts up to the expected number of bytes to be transferred.

Figure 8:
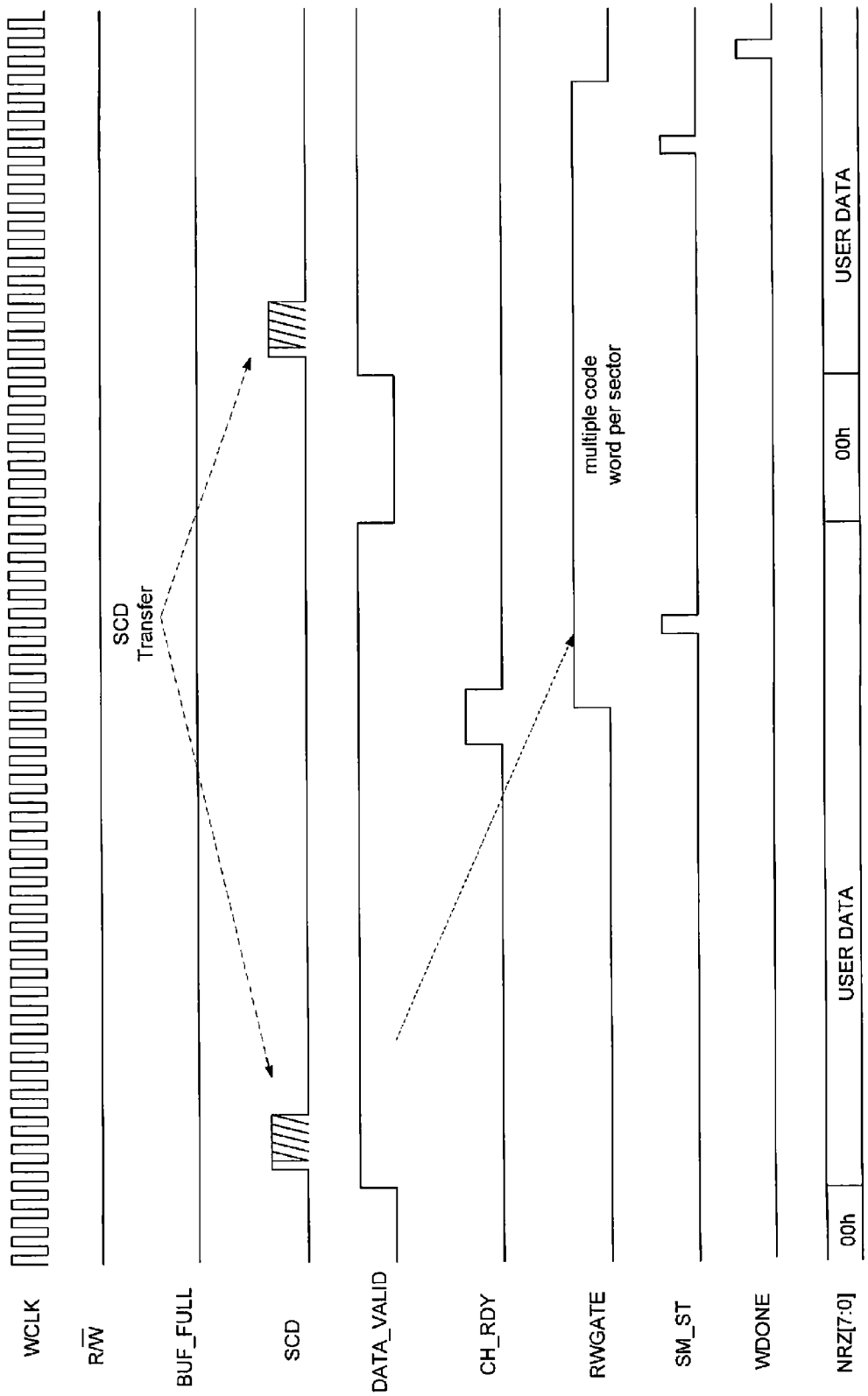
FIG. 8 is a timing diagram for a write operation for multiple codewords per sector without split in accordance with the first embodiment of the present invention.

FIG. 8 illustrates a timing diagram for a write operation for multiple codewords per sector without split, in accordance with the first embodiment of the present invention. The write operation shown in FIG. 8 is the same as the one codeword per sector case except CH_RDY is set to "1" with a latency of 10 bytes per additional codeword. Once RWGATE is asserted by HDC 22 after CH_RDY goes high, R/W channel 24 must write out the data in a non-stop manner. As a result, R/W channel 24 requires a longer latency and larger buffer to handle the multiple codewords per sector case. In addition, HDC should continuously transfer data to R/W channel in order to avoid buffer underflow. If buffer underflow happens, the write operation may fail.

Figure 9:
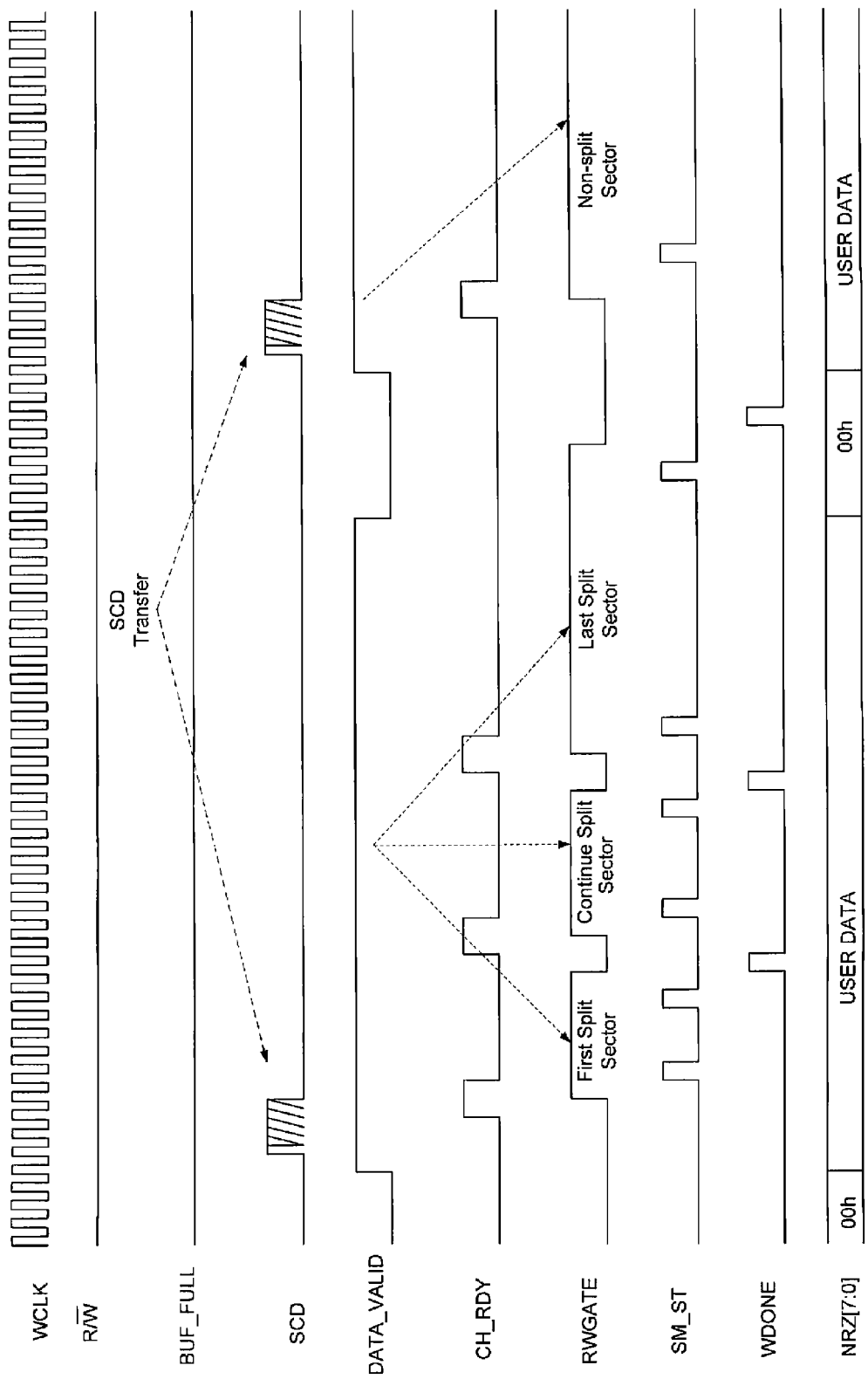
FIG. 9 is a timing diagram for a write operation for multiple codewords per sector with multiple splits in accordance with the first embodiment of the present invention.

FIG. 9 illustrates a timing diagram for a write operation for multiple codewords per sector with multiple splits, in accordance with the first embodiment of the present invention. This write operation is the same as the write operation of the one codeword per sector with one split case except the first CH_RDY comes later due to the requirement of R/W channel 24 relating to buffer underflow.

Figure 10:
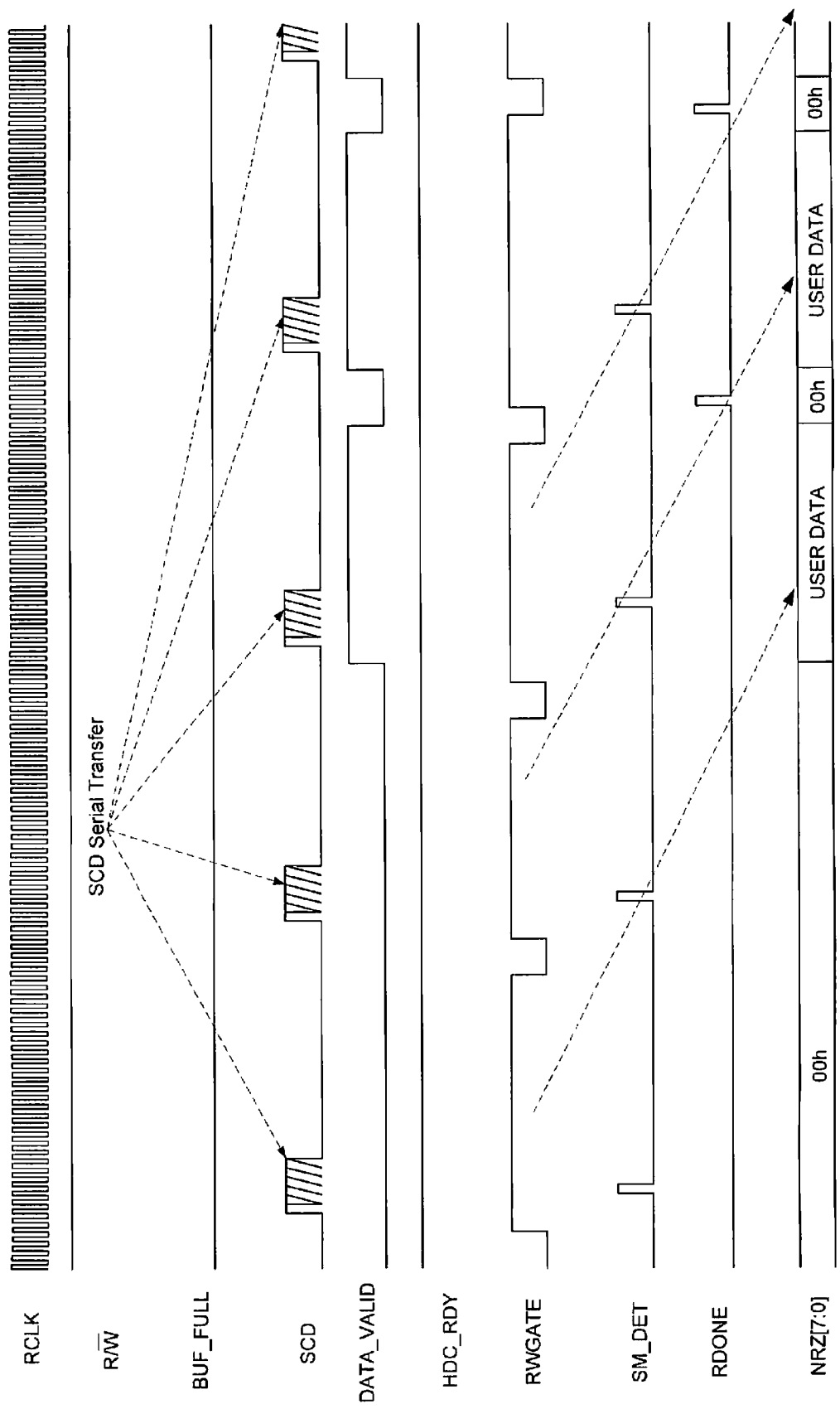
FIG. 10 is a timing diagram for a read operation for a single codeword per sector without split in accordance with the first embodiment of the present invention.

FIG. 10 illustrates a timing diagram for a read operation for a single codeword per sector without split, in accordance with the first embodiment of the present invention. At the beginning of each RWGATE assertion, sector control information such as sector type, read counter value and codeword size are sent by HDC 22 via SCD pin. After R/W channel 24 finishes decoding and HDC_RDY is set to "1", R/W channel 24 starts to send the user data to HDC 22 via NRZ data bus along with DATA_VALID which is set to "1".

Figure 11:
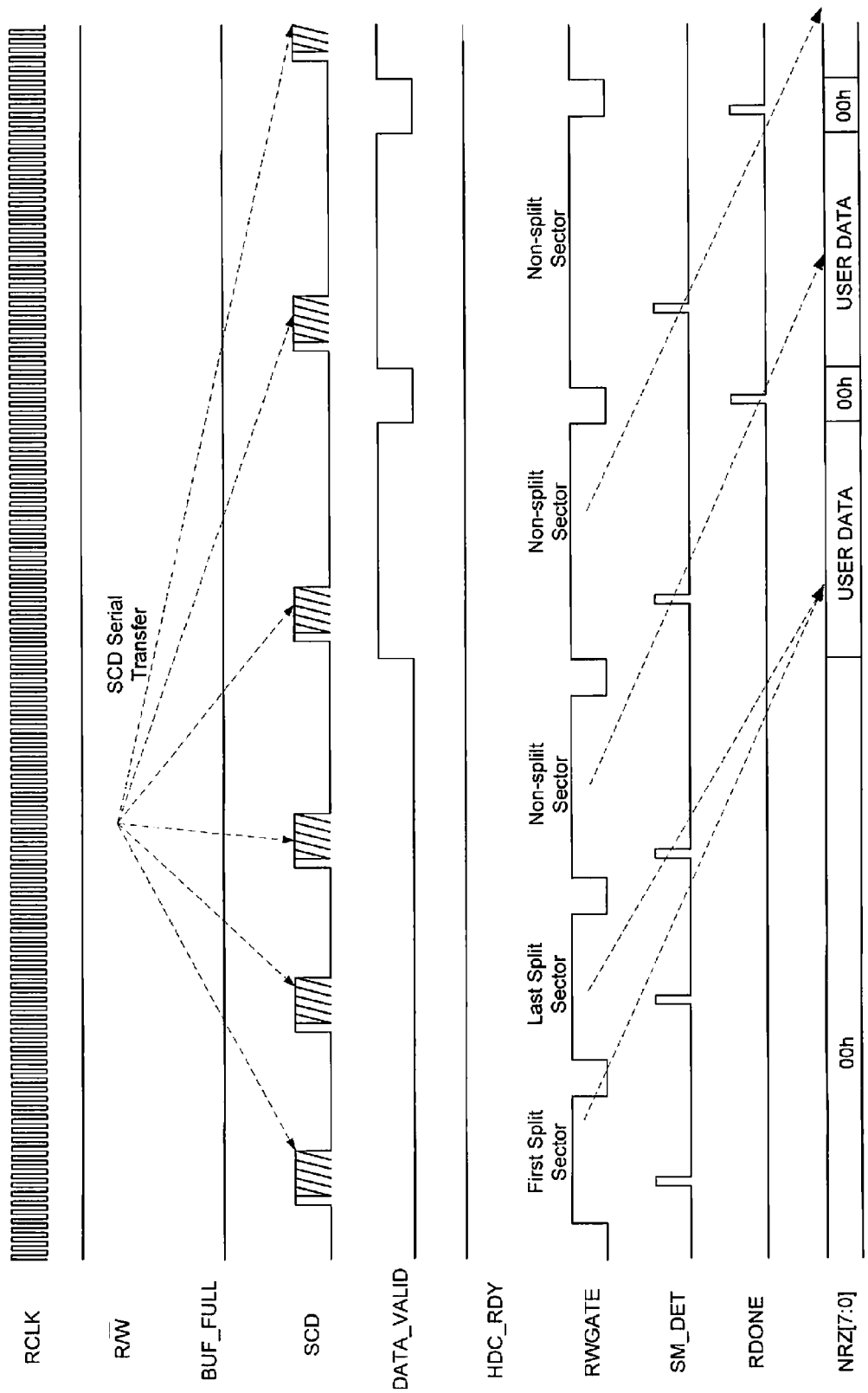
FIG. 11 is a timing diagram for a read operation for a single codeword per sector with split in accordance with the first embodiment of the present invention.

FIG. 11 illustrates a timing diagram for a read operation for a single codeword per sector with split in accordance with the first embodiment of the present invention. In FIG. 11, consecutive read operations of 1 codeword per sector with split are performed. At the beginning of each RWGATE assertion, sector control information such as sector type, read counter value and codeword size are sent by HDC 22 via SCD pin. After collecting the first-split and the last-split sectors, R/W channel 24 merges the two split sectors and then transfers the decoded data to HDC 22 via NRZ data bus.

Figure 12:
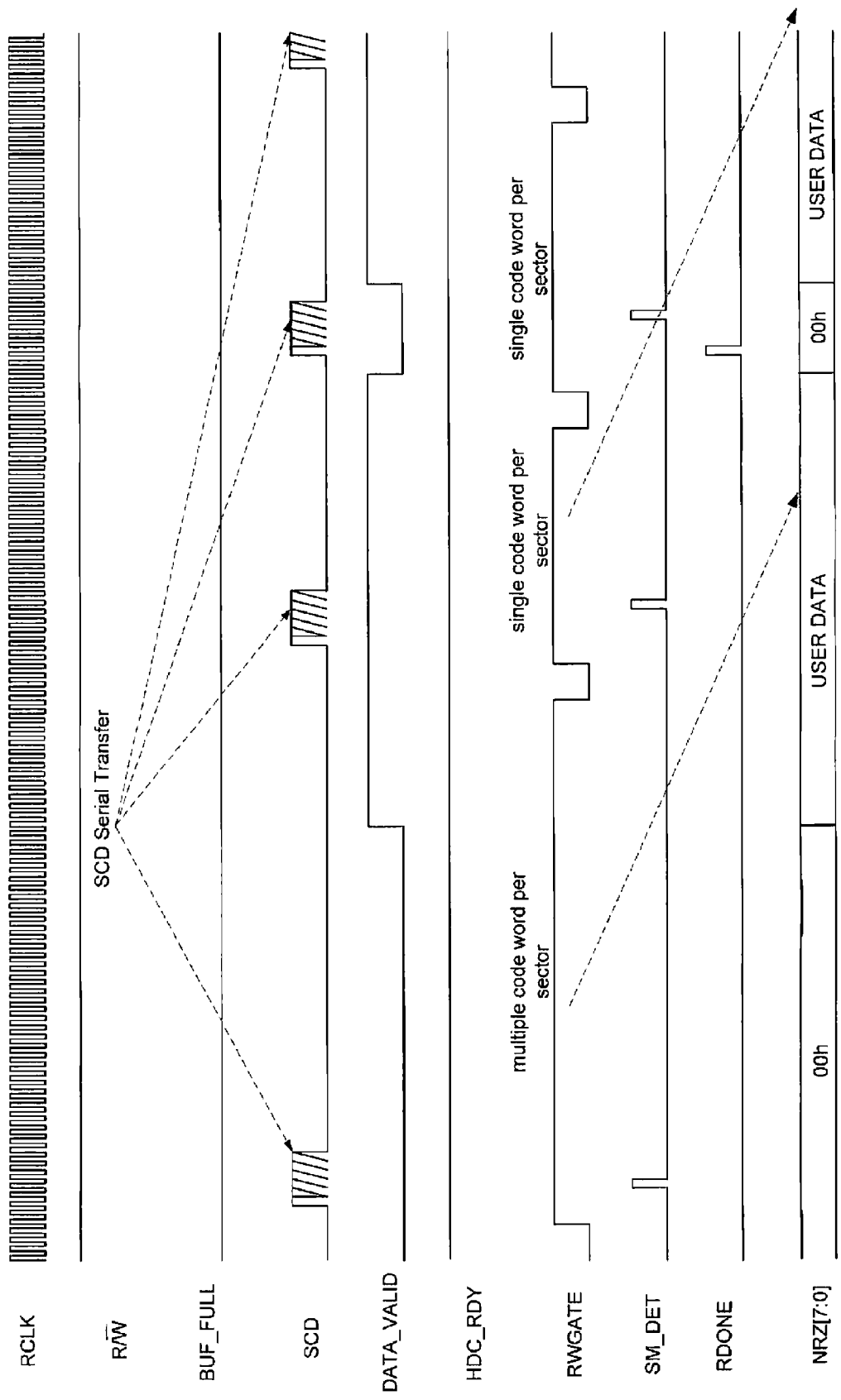
FIG. 12 is a timing diagram for a read operation for multiple codewords per sector without split in accordance with the first embodiment of the present invention.

FIG. 12 illustrates a timing diagram for a read operation for multiple codewords per sector without split, in accordance with the first embodiment of the present invention. HDC 22 uses SCD pin to send the sector control information to R/W channel 24. As soon as R/W channel 24 finishes decoding one codeword, R/W channel 24 asserts DATA_VALID and transfers the user data to HDC 22 via NRZ data bus. If HDC_RDY is not set to "1" for a long period of time after RWGATE assertion, R/W channel 24 buffer may overflow.

Figure 13:
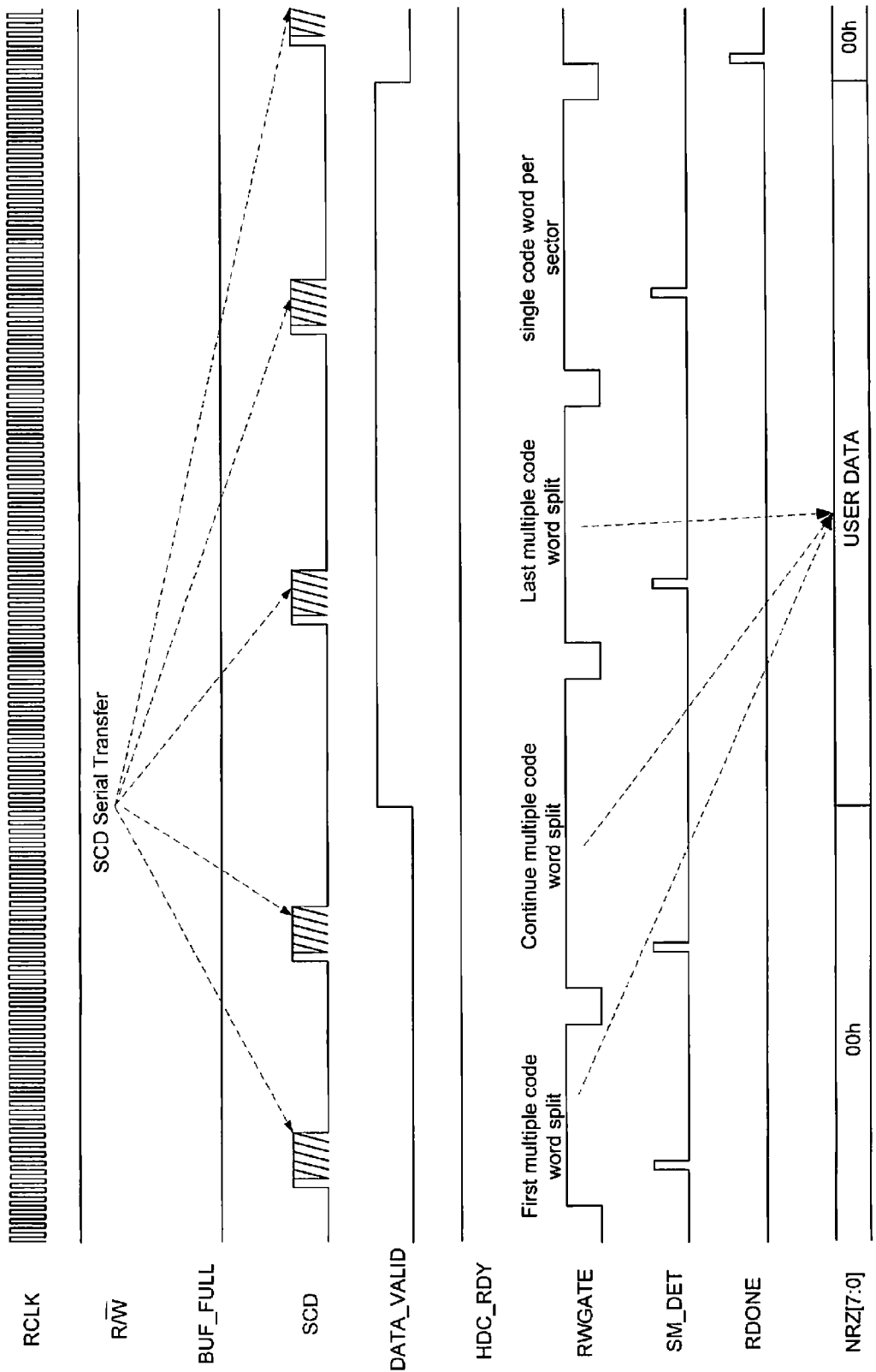
FIG. 13 is a timing diagram for a read operation for multiple codewords per sector with multiple splits. R/W channel 24 operates similarly as in the single codeword per sector with split case in accordance with the first embodiment of the present invention.

FIG. 13 illustrates a timing diagram for a read operation for multiple codewords per sector with multiple splits. R/W channel 24 operates similarly as in the single codeword per sector with split case in accordance with the first embodiment of the present invention. HDC 22 sends the sector control data information via SCD pin at the beginning of each RWGATE. In this read operation, the first codeword is being split into the first two RWGATE's. After R/W channel 24 collects the first completed codeword and completes iterative decoding, it starts sending the decoded user data to HDC 22 along with DATA_VALID which is set to "1" provided that HDC_RDY is set to "1". However, if the gap between the split sector is too far apart, R/W channel 24 buffer may underflow. If underflow happens, R/W channel 24 deasserts DATA_VALID although HDC_RDY is still set to "1". On the other hand, if HDC_RDY is set to "0" and RWGATE is continuously asserted, R/W channel 24 may overflow and force BUF_FULL to "1".

Second Embodiment

Figure 14:
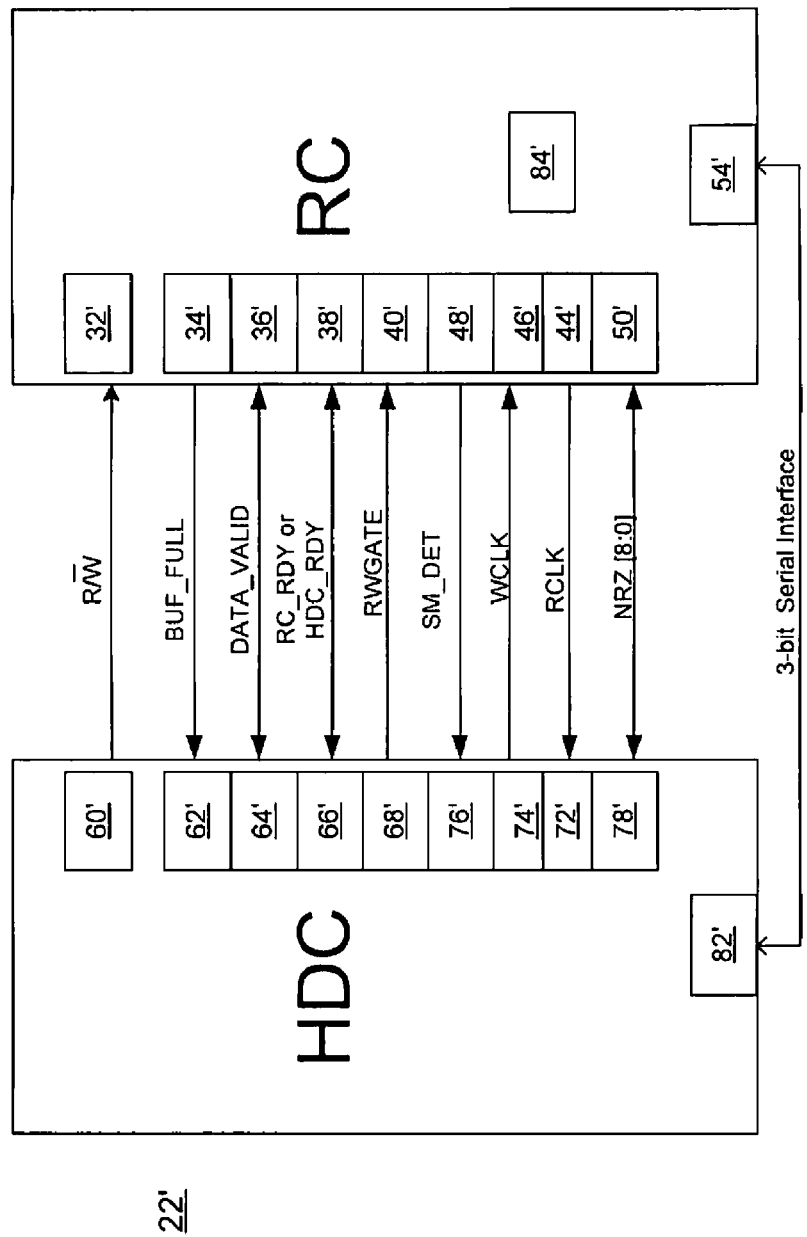
FIG. 14 is a block diagram of an interface between two hardware components, such as an HDC and an RDC or R/W channel, in accordance with a second embodiment of the invention.

FIG. 14 illustrates a second embodiment of the present invention. The second embodiment is similar to the first embodiment with the following differences, the second embodiment does not have the SCD signal and associated circuitry, the second embodiment has an additional one RCLK cycle drop on RWGATE during a read operation. Moreover, in the second embodiment there is an insertion of an SF_HEADER signal by HDC 22' before each user data stream or split data stream, and an insertion of an END_SEC-TOR signal by HDC 22' at the end of each data stream. In the second embodiment there is a restriction of codeword size modifications through a regular 3-bit serial interface. A more detailed discussion is provided hereinbelow.

Each of HDC 22' and the R/W channel 24' include appropriate circuitry for transmitting and receiving the various signals, data and mode selection information between the two hardware components. For example, HDC 22' includes a R/W transmit circuit 60' that transmits the R/W signal to R/W receiver circuit 32' on R/W channel 24', a data valid transceiver circuit 64' that transmits the DATA_VALID signal to and receives the DATA_VALID signal from a data valid transceiver circuit 36' on R/W channel 24'. A ready transceiver 66' is provided in HDC 22' to transmit HDC_RDY signal to and receive RC_RDY signal from a ready transceiver circuit 38' on R/W channel 24'. HDC 22' also comprises a RWGATE transmit circuit 68' which transmits the RWGATE signal to RWGATE receive circuit 40' of R/W channel 24'. HDC 22' also includes a write clock transmit circuit 74' to transmit the WCLK signal to write clock receive circuit 46' on R/W channel 24'. HDC 22' comprises a SM transceiver 76' which transmits the SM_DET or SM_ST signal to and receives the SM_DET or SM_ST signal from the SM transceiver 48' on R/W channel 24'. HDC 22' and R/W channel 24' comprise respective NRZ transceivers 78 'and 50 ', respectively, for exchanging NRZ data and serial transceivers 82' and 54' respectively for exchanging serial data. R/W channel 24' comprises a buffer full transmit circuit 34' to transmit the BUF_FULL signal to a buffer full receive circuit 62' on HDC 22', a receive clock transmit circuit 44' to transmit RCLK signal to a receive clock receive circuit 72' on HDC 22'.

As noted above. signal and data transmitting, receiving and transceiving circuits are generally known, and based on the teachings provided herein, one skilled in the art would be able to construct and implement transmitting and receiving circuits to carry out the specific signaling protocol described herein.

The interface 20' of the second embodiment provides for multiple-sector read and write delays; one codeword size per drive (preferred but not limited to); multiple splits per sector; maximum one split per codeword; and data recovery between first sync mark and second sync mark. The second embodiment is similar to the first embodiment except that there is no SCD signal and more functionality is provided by the RWGATE signal. In terms of pin count, second embodiment requires one fewer pins than first embodiment. In comparison to the conventional interface between an HDC and an R/W channel, the second embodiment has additional 3 pins to make the data transfer operations occur stepwise as explained below.

During a write operation, HDC 22' transfers a block of user data to the R/W channel 24' through the 9-bit NRZ data bus for encoding before it asserts the RWGATE signal. HDC 22' waits for the R/W channel 24' to signal the end of the encoding process and then it asserts the RWGATE signal to flush out the data inside the R/W channel buffer.

During a read operation, HDC 22' asserts the RWGATE signal first to allow the R/W channel 24' to read data for iterative decoding. After the R/W channel 24' completes the decoding process and HDC_RDY is set to one, the R/W channel 24' transfers the user data to HDC 22''' through the 9-bit NRZ data bus.

The four additional signals for this two-step process during the read and write operations are R/W_, BUF_FULL, DATA_VALID, and HDC_RDY/RC_RDY. A detailed description of these pins is listed in the Table 2 below.

| Signal | Type | Description |
| --- | --- | --- |
| $\overline{RW}$ | Input to R/W channel 24' | 0: = Write operation.<br>1: = Read operation.<br>Alternatively, this signal can be replaced by internal register programming through the regular 3-bit Serial Interface. |
| BUF_FULL | Output from R/W channel 24' | Indicates channel internal buffer is almost full. Once it goes high, only 8 more bytes of data can be transferred.<br>During a write operation, if BUF_FULL goes high, HDC 22' either asserts the RWGATE to flush out the data inside the R/W channel 24' buffer or resets the R/W channel 24'. Otherwise, the R/W channel 24' will continue to wait.<br>During a read operation, BUF_FULL goes high only when HDC 22' is not ready for data transfer and RWGATE stays high. HDC 22' will either assert HDC_RDY signal or reset the R/W channel 24'. |
| DATA_VALID | bi-directional | During a write operation, DATA_VALID is an input signal to R/W channel 24' and DATA_VALID indicates the 9-bit NRZ data bus is valid when DATA_VALID goes high. Therefore, R/W channel 24' can latch the data from the bus correctly at the rising edge of WCLK.<br>During a read operation, DATA_VALID is an output signal and DATA_VALID indicates the 9-bit NRZ data bus is valid when it goes high. Therefore, HDC 22' can latch the data from the bus correctly at the rising edge of RCLK. |
| RC_RDY or HDC_RDY | bi-directional | During a write operation, RC_RDY is an output from R/W channel 24'. RC_RDY goes high when the R/W channel 24' is ready for HDC 22' to assert RWGATE.<br>During a read operation, HDC_RDY is an input signal to R/W channel 24'. HDC_RDY goes high when HDC 22' is ready for the R/W channel 24' to assert DATA_VALID. |
| RWGATE | Input to R/W channel 24' | $\overline{RW}$ = 0, RWGATE = WGATE<br>$\overline{RW}$ = 1, RWGATE = RGATE<br>For a read operation, the codeword size is previously programmed into a R/W channel 24' internal control register through the regular 3-bit serial interface. HDC 22' asserts RWGATE as a normal RGATE. HDC 22' starts counting RCLK cycles when it detects the SM_DET. When HDC 22''' counter value is equal to the number of expected read bytes (written in HDC 22''' table), one RCLK cycle is dropped on the RWGATE. The number of RCLK cycles between the SM_DET pulse and the one RCLK cycle drop of RWGATE is used to determine the read byte length expected from this RWGATE. At this point, HDC 22' sends the byte length to R/W channel 24'. |
| RCLK | Output from R/W channel 24' | Constant width equal to 8 times the R/W channel 24' bit clock. |
| WCLK | Input to R/W channel 24' | Same clock frequency as RCLK but different phase. |
| SM_DET | Output from R/W channel 24' | During a read operation, SM_DET is asserted by the R/W channel 24' to indicate that Sync Mark is found after RWGATE is asserted. |
| NRZ[8:0] | bi-directional | During a write operation, NRZ [8:0] are inputs to R/W channel 24'. NRZ [8] is the parity bit and NRZ [7:0] is either the SF_HEADER or the user data (including permuted ECC/RLL). The number of 00hex in the SF_HEADER determines the actual length of the sync field written into the disk after RWGATE is asserted. Sync Mark is auto-inserted after the sync field during the assertion of RWGATE for write operation. The format of SF_HEADER is {FF,FF,FF,FF,00,00, . . . ,00,00,FF,FF,FF,FF}. At the end of each data stream per sector, HDC 22' inserts the END_SECTOR pattern to indicate the end of the data stream for this sector. The format of the END_SECTOR is {EF,EF,00,00,00,00,EF,EF}. HDC 22' ensures that the user data is in an 8-bit format. If the last user data is less than 8 bits, HDC 22' pads the data up to 8 bits.<br>During a read operation, NRZ [8:0] are output from R/W channel 24'. NRZ [8] is a multi-purpose bit and NRZ [7:0] is the read-back user data. |

Control Data Transfer

Since the second embodiment does not have the SCD signal, HDC 22' does not transfer various control information (codeword size, read/write length counter and split sector size) on the fly. Each time HDC 22' wants to use a different codeword size for each read and write operation, HDC 22' must set up the internal registers of R/W channel 24' apriori through the regular 3-bit serial interface. This would normally slow down read and write operations, however in order to avoid this problem, it is assumed the second embodiment will use one codeword size per drive application. The codeword size is provided at power up from HDC 22' to the registers of R/W channel 24' through the regular 3-bit serial interface. The following sections discuss read/write length counter and split sector size information during write and read operations.

Write Operation Control Data Transfer

Additionally referring to FIGS. 23 and 24, for a write operation, the DATA_VALID is used as a qualifying signal for the NRZ[8:0] bus. For each data stream, HDC 24' sends an SF_HEADER before each user data stream. In the case of a split inside the user data stream, HDC 24' also sends another SF_HEADER in front of each split. Each SF_HEADER consists of 4 bytes FF, followed by N bytes of 00 and then 4 bytes of FF where N has a value of 4 to 32. N is used to indicate the total number of sync fields written to the disk for each RWGATE. The number of bytes received between the SF_HEADER and the END_SECTOR is the total number of bytes expected to write to the disk for a given RWGATE (See FIG. 23). Each END_SECTOR is equal to {EF,EF,00,00,00, 00,EF,EF}. R/W channel 24' has an internal parser 84' (see FIG. 14) for SF_HEADER, user data and the END_SECTOR. This enables the channel to extract write length counter and sector size information.

In the case of a split sector, write length counter and split sector size can be extracted if HDC 22''' provides the data format, as shown in FIG. 24.

Read Operation Control Data Transfer

For a read operation, HDC 22' asserts RWGATE as a normal RGATE. HDC 22' starts counting RCLK cycles when R/W channel 24' detects the SM_DET. When HDC 22' counter value is equal to the number of expected read bytes (written in HDC 22' table), one RCLK cycle is dropped on the RWGATE. The number of RCLK cycles between the SM_DET pulse and the one RCLK cycle drop of RWGATE is used to determine the read byte length expected from this RWGATE. At this point, HDC 22' sends the byte length to the R/W channel 24', as explained in detail herein below.

Figure 15:
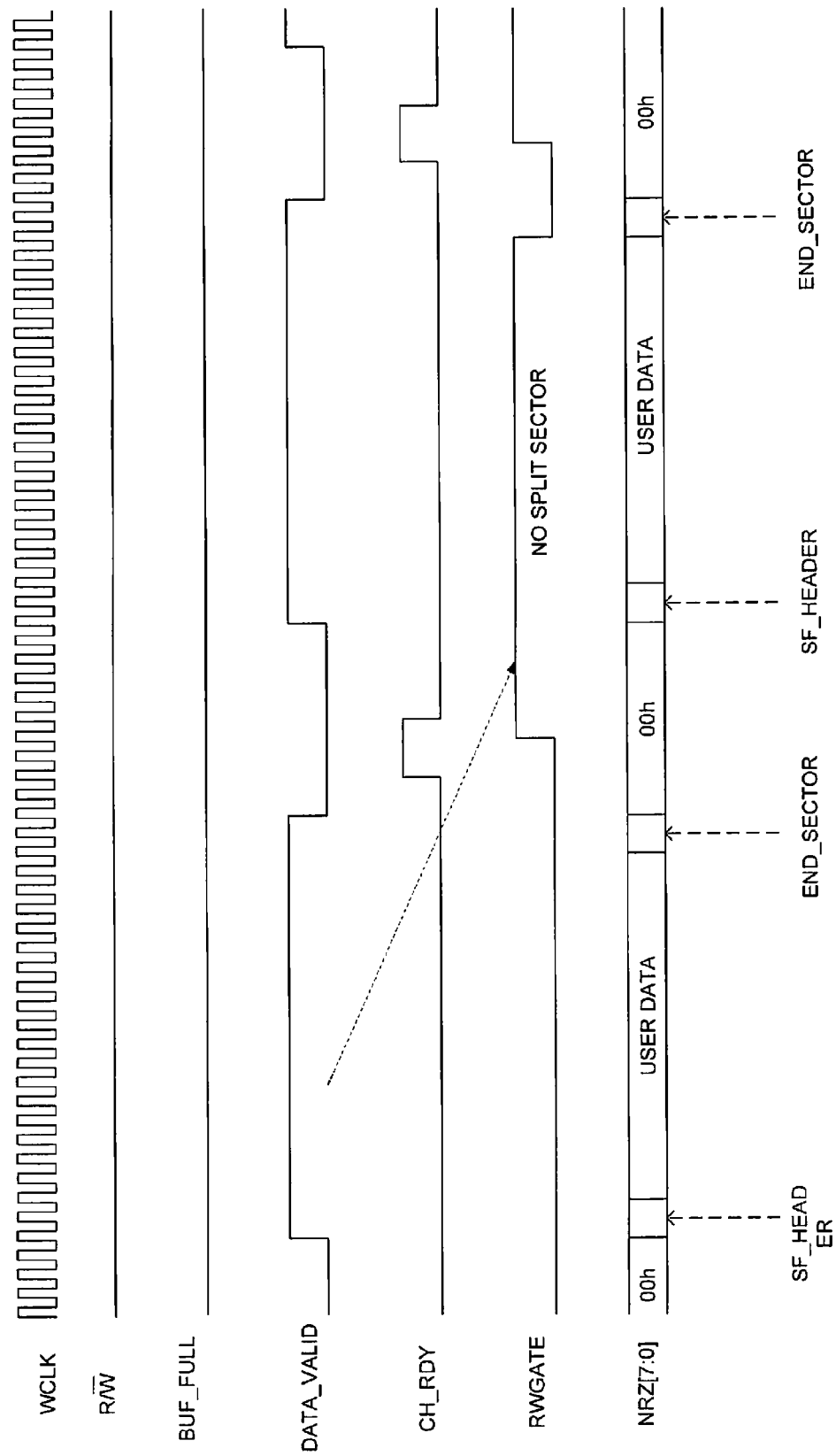
FIG. 15 is a timing diagram for a single codeword per sector without a split for a write operation, in accordance with the second embodiment of the invention.

FIG. 15 is a timing diagram of a write operation of a single codeword per sector without a split. The R/W channel 24' receives the sector control information from the data stream which is parsed internally, as discussed in above. When the DATA_VALID signal is asserted, the data stream on the NRZ bus is qualified. As mentioned previously, the codeword size information for this sector is obtained from the internal R/W channel registers, which were previously programmed, such as, during initialization or power up.

After R/W channel 24' finishes the iterative encoding, CH_RDY is asserted by R/W channel 24' to indicate readiness to transfer the encoded data. Then HDC 22' asserts RWGATE. The R/W channel 24' first sends out the Sync Field pattern and then the Sync Mark pattern. The length of the Sync Field pattern is obtained from internal registers after the data stream passes through parser 84'. At the end of RWGATE drop, one to four bytes of Write pad data is sent to the preamp (not shown).

Figure 16:
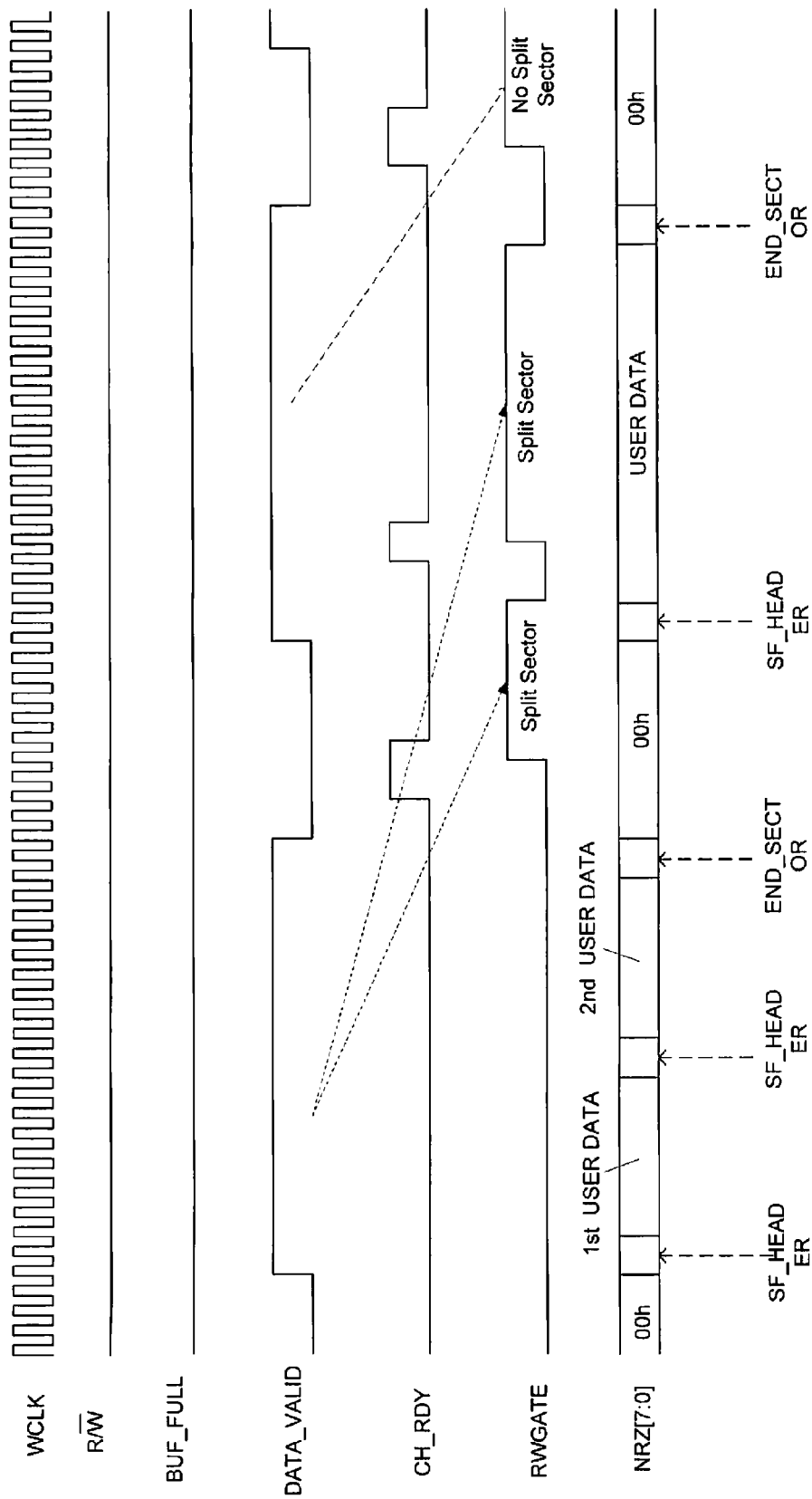
FIG. 16 is a timing diagram for single codeword per sector with split for a write operation, in accordance with the second embodiment of the invention.

FIG. 16 is a timing diagram of a write operation of a single codeword per sector with 1 split. Firstly, the entire codeword of user data is transferred to R/W channel 24'. HDC 22' uses DATA_VALID to qualify the NRZ data bus. After DATA_VALID assertion, R/W channel 24' obtains various sector control data through parser 84'.

Figure 17:
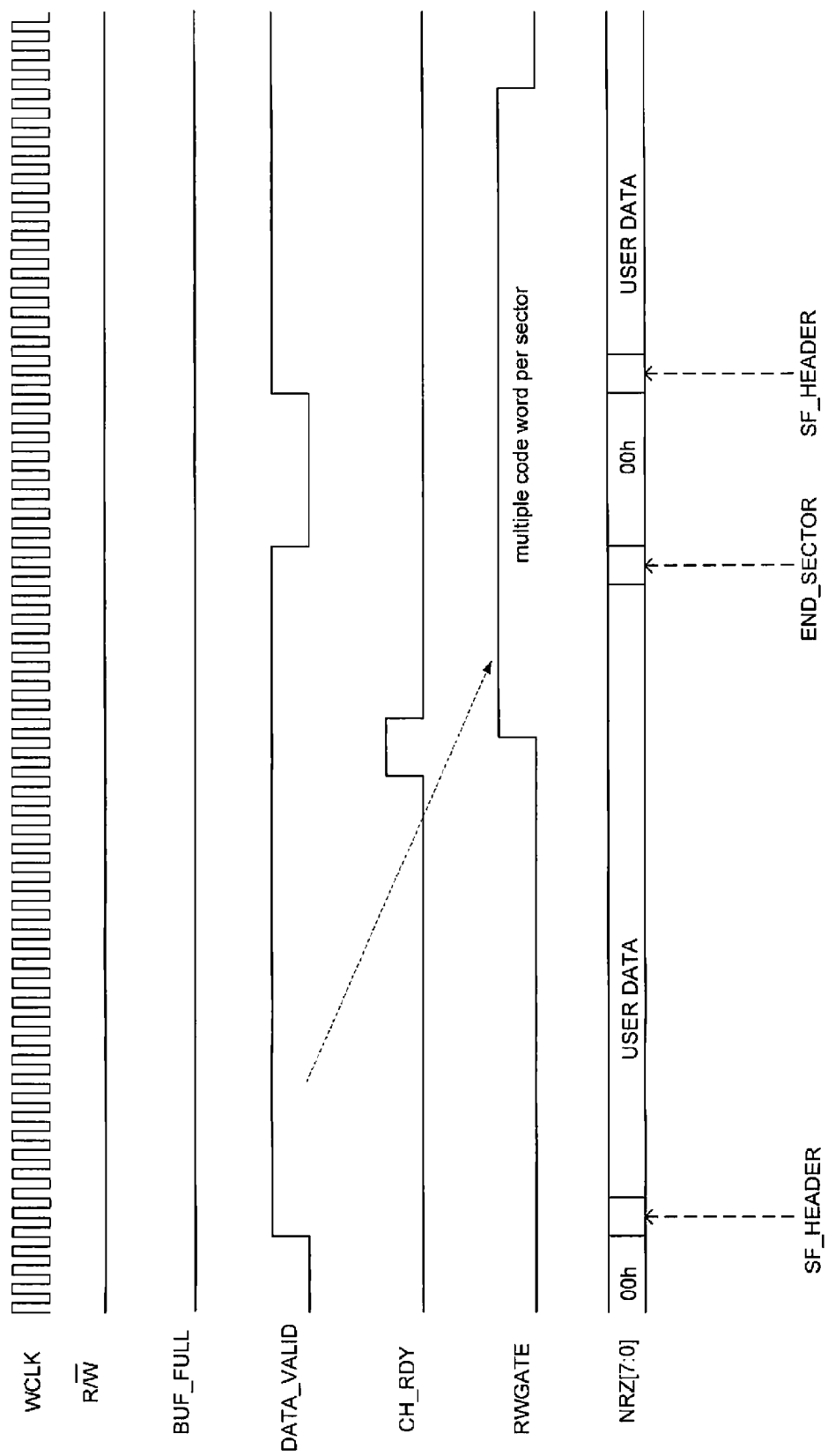
FIG. 17 is a timing diagram for multiple codewords per sector without split for a write operation, in accordance with the second embodiment of the invention.

FIG. 17 is a timing diagram of a write operation having multiple codewords per sector without any splits. This write operation is the same as the write operation for a single codeword per sector case except CH_RDY is set to '1' having a latency of 10 bytes per additional codeword. Once RWGATE is asserted by HDC 22' after CH_RDY goes high, R/W channel 24' writes out the data continuously. Therefore, the R/W channel 24' has a longer latency and larger buffer to handle the multiple-codeword-per-sector case. In addition, HDC 22' continuously transfers data to the R/W channel 24' in order to avoid buffer underflow. If buffer underflow occurs, the write operation may fail.

Figure 18:
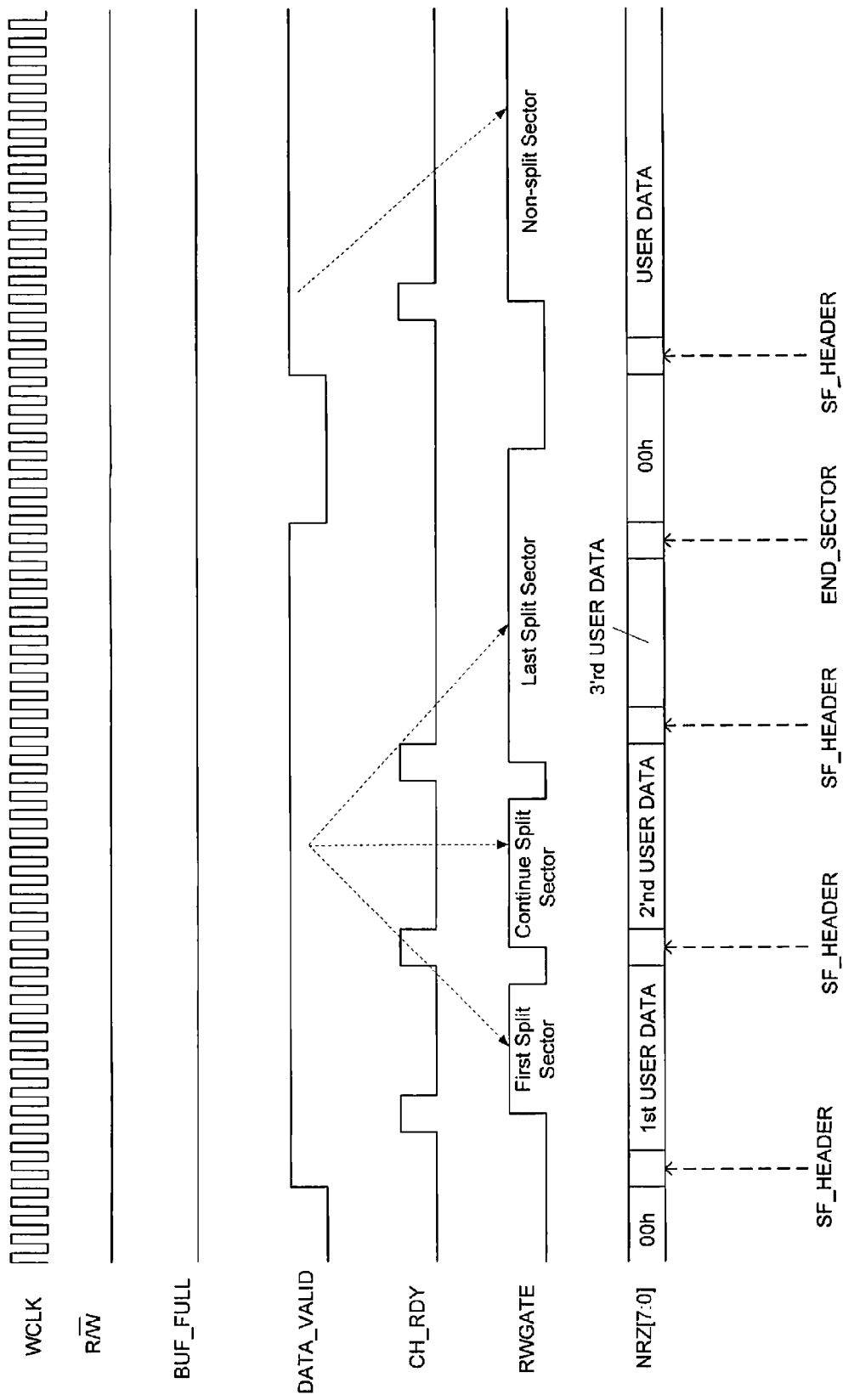
FIG. 18 is a timing diagram for multiple codewords per sector with multiple splits for a write operation, in accordance with the second embodiment of the invention.

FIG. 18 is a timing diagram of a write operation having multiple codewords per sector with multiple splits. This write operation is the same as the write operation for a single codeword per sector with one split case except the first CH_RDY comes later due to the R/W channel's buffer underflow requirement.

Figure 19:
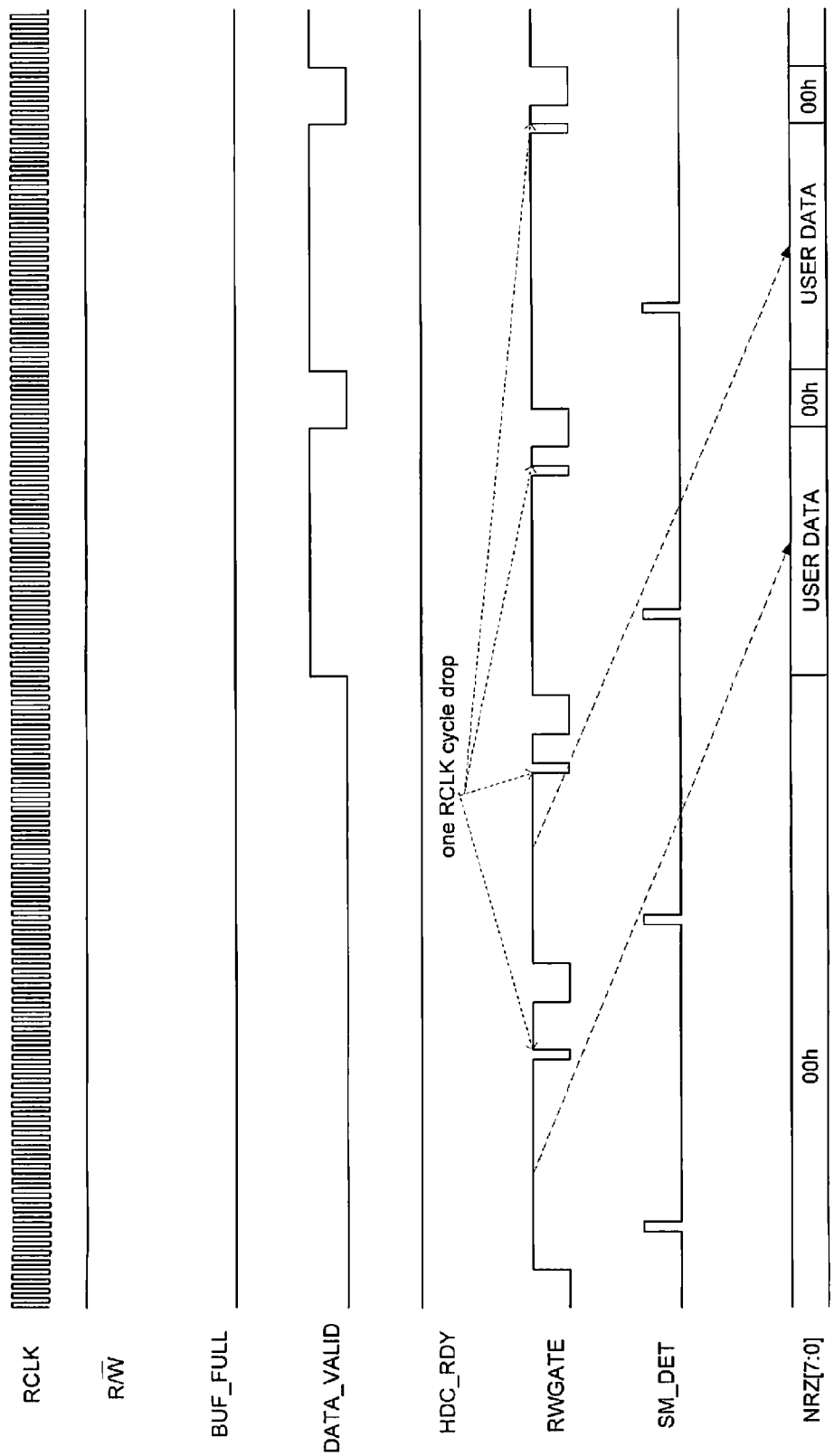
FIG. 19 is a timing diagram for a single codeword per sector without split for a read operation, in accordance with the second embodiment of the invention.

FIG. 19 is a timing diagram of consecutive operations of a single codeword per sector without a split. The codeword size was previously programmed into a R/W channel's internal control register through the 3-bit serial interface. HDC 22' asserts RWGATE as a normal RGATE. HDC 22' starts counting RCLK cycles when HDC 22' detects the SM_DET. When HDC 22''' counter value is equal to the number of expected read bytes (written in HDC 22''' table), one RCLK cycle is dropped on the RWGATE. The number of RCLK cycles between the SM_DET pulse and the one RCLK cycle drop of RWGATE is used to determine the read byte length expected from this RWGATE. At this point, HDC 22' sends the byte length to R/W channel 24'.

After R/W channel 24' completes decoding and HDC_RDY is set to '1', R/W channel 24' starts to send the user data to HDC 22''' via the NRZ data bus. DATA_VALID must also be asserted.

Figure 20:
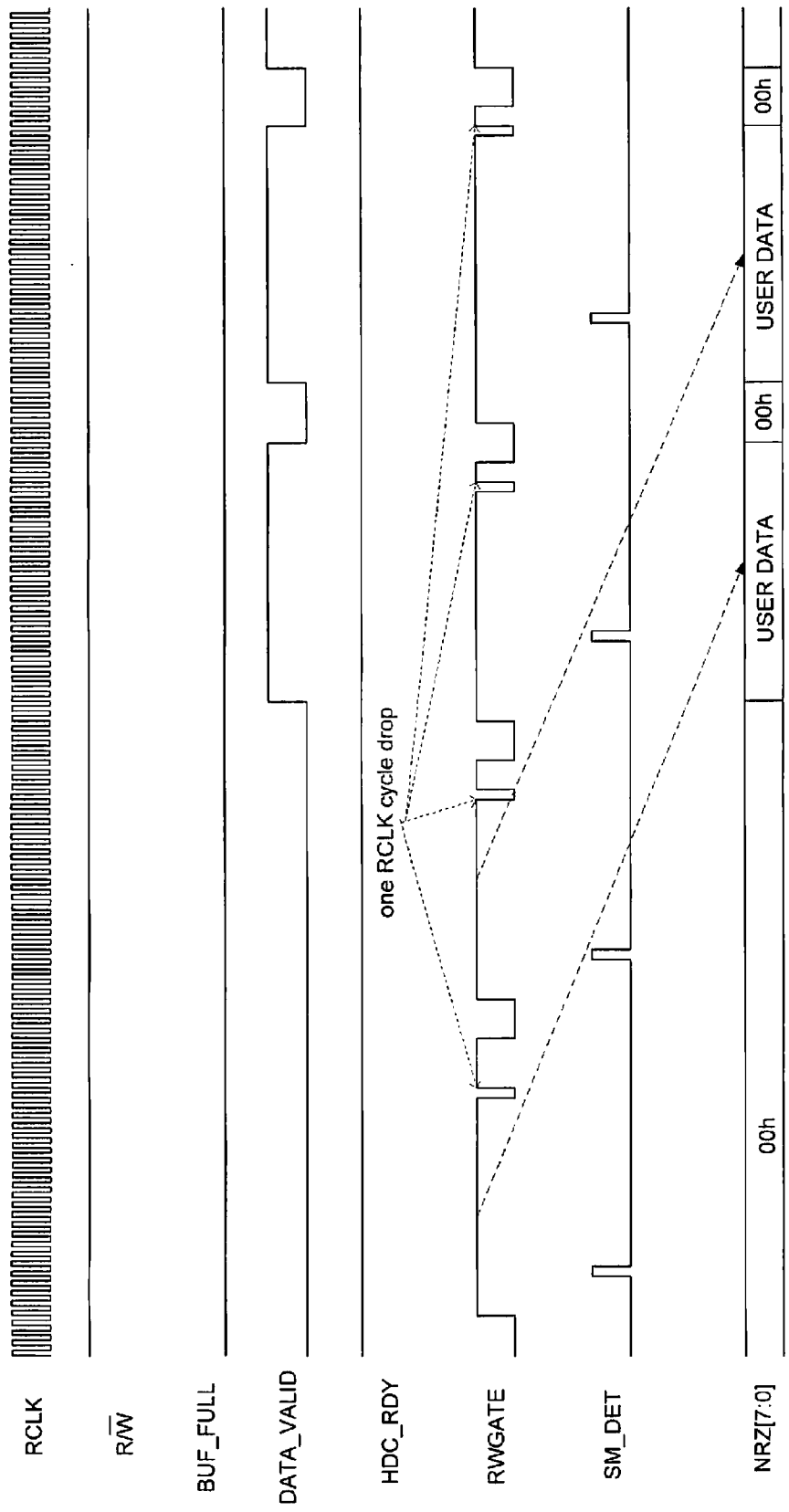
FIG. 20 is a timing diagram for a single codeword per sector with split for a read operation, in accordance with the second embodiment of the invention.

FIG. 20 is a timing diagram of consecutive operations of a single codeword per sector with a split. After collecting the first-split and the last-split sectors, R/W channel 24' merges the two split sectors and then transfers the decoded data to HDC 22' via the NRZ data bus.

Figure 21:
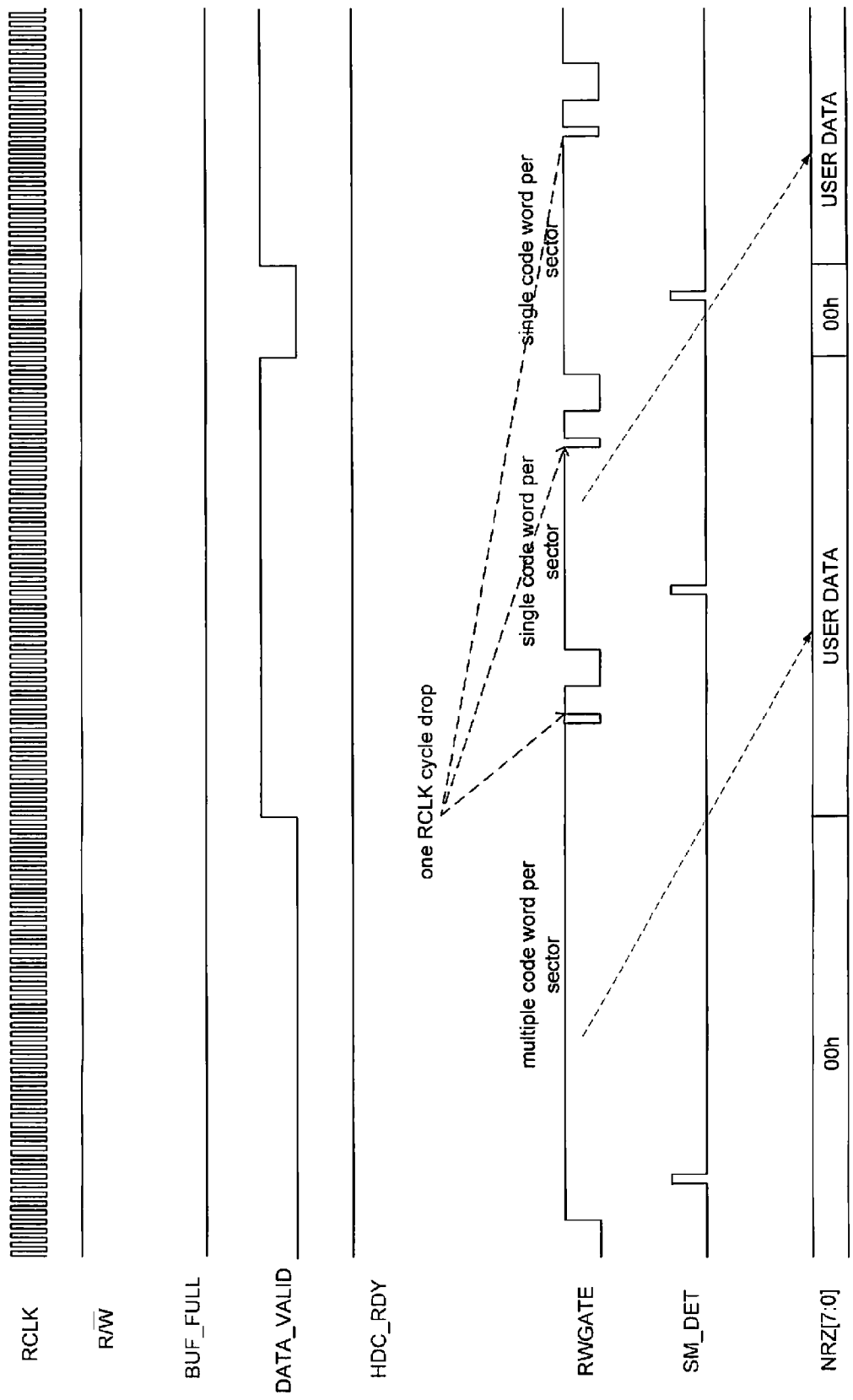
FIG. 21 is a timing diagram for multiple codewords per sector without split for a read operation, in accordance with the second embodiment of the invention.

FIG. 21 is a timing diagram of a read operation of multiple codewords per sector without a split. The codeword size was previously programmed into a R/W channel internal control register through the 3-bit serial interface. HDC 22' asserts RWGATE as a normal RGATE. HDC 22' starts counting RCLK cycles when HDC 22' detects the SM_DET. When HDC 22''' counter value is equal to the number of expected read bytes (written in HDC 22''' table), one RCLK cycle is dropped on the RWGATE. The number of RCLK cycles between the SM_DET pulse and the one RCLK cycle drop of RWGATE is used to determine the read byte length expected from this RWGATE. At this point, HDC 22' sends the byte length to R/W channel 24'.

As soon as the R/W channel 24' completes decoding one codeword, R/W channel 24' asserts DATA_VALID and transfers the user data to HDC 22' via the NRZ data bus. If HDC_RDY is not set to '1' after a fixed time RWGATE is not asserted and the R/W channel buffer will continue to read the data from the media. Consequently, the R/W channel buffer may experience overflow.

Figure 22:
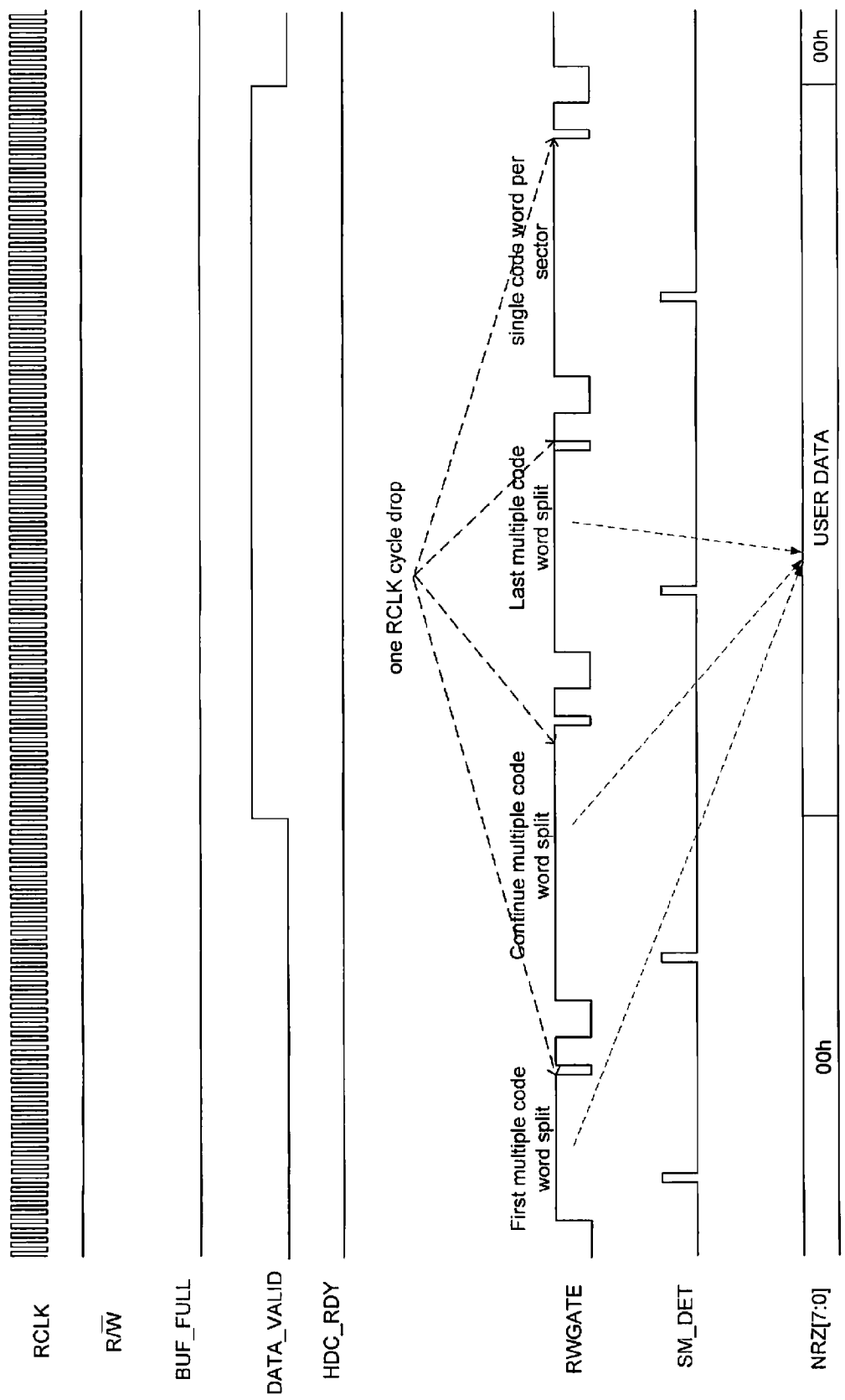
FIG. 22 is a timing diagram for multiple codewords per sector with multiple splits for a read operation, in accordance with the second embodiment of the invention.

FIG. 22 is a timing diagram of a read operation of multiple codewords per sector with multiple splits. In this read operation, the first codeword is divided into two RWGATEs. After R/W channel 24' collects the first completed codeword and completes iterative decoding, R/W channel 24'. starts sending the decoded user data to HDC 22'. The DATA_VALID is set to '1' and HDC_RDY is set to '1'. However, if the gap between the split sector is too large, the R/W channel buffer may underflow. If underflow occurs, R/W channel 24' drops DATA_VALID even if HDC_RDY is still set to '1'. On the other hand, if HDC_RDY is set to '0' and RWGATE is continuously asserted, R/W channel 24' may overflow and force BUF_FULL to '1'.

Third Embodiment

Figure 25:
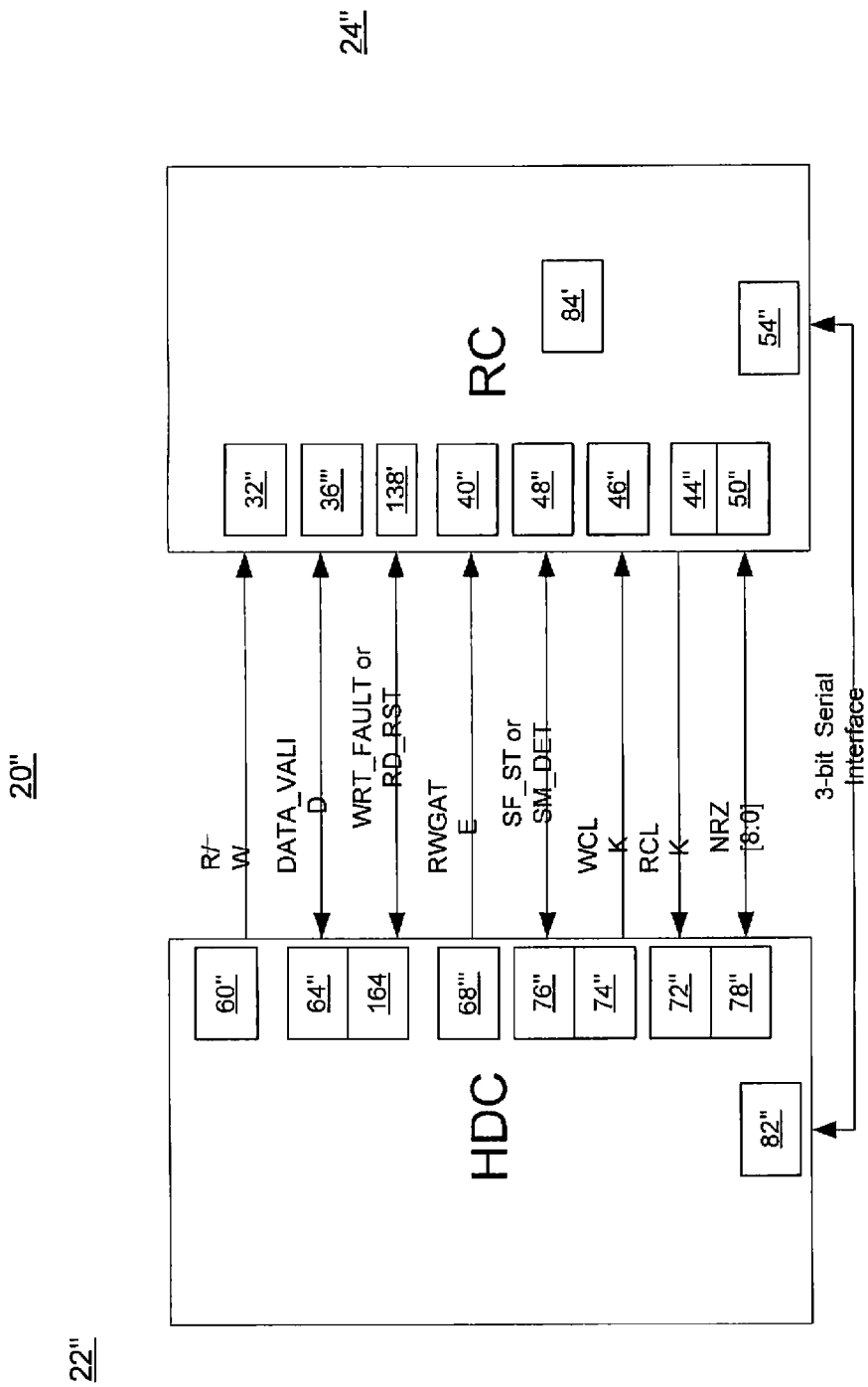
FIG. 25 is a block diagram of an interface between two hardware components, such as an HDC and an RDC or R/W channel, in accordance with a third embodiment of the invention.

FIG. 25 illustrates a third embodiment of the present invention. The third embodiment is similar to the first embodiment with the following differences, the third embodiment does not have the SCD signal and associated circuitry, the third embodiment does not have a CH_RDY/HDC_RDY pin and associated circuitry, the third embodiment has fault condition handling, the third embodiment has the option to use a register to set the sync field size. In the third embodiment RCLK is not required to equal 8 times the channel clock, the third embodiment provides for the use of the register to set the write padding data length. The third embodiment does not require the passing of the write length counter information, and third embodiment provides for indirect passing of the read length counter information by RWGATE and the third embodiment provides for restriction of codeword size modifications through a standard 3-bit serial interface. A more detailed discussion is provided hereinbelow.

Referring again to FIG. 25, each of HDC 22" and the R/W channel 24" includes appropriate circuitry for transmitting and receiving the various signals, data and mode selection information between the two hardware components. For example, HDC 22" includes a R/W transmit circuit 60" that transmits the R/W signal to R/W receiver circuit 32" on R/W channel 24", a data valid transceiver circuit 64" that transmits the DATA_VALID signal to and receives the DATA_VALID signal from a data valid transceiver circuit 36" on R/W channel 24". A read reset transceiver 164 is provided in HDC 22" to transmit the RD_RST signal to and receive the WRT_FAULT signal from a write fault transceiver circuit 138 on R/W channel 24'. HDC 22" also comprises a RWGATE transmit circuit 68" which transmits the RWGATE signal to RWGATE receive circuit 40" of R/W channel 24'. HDC 22" also includes a write clock transmit circuit 74" to transmit the WCLK signal to write clock receive circuit 46" on R/W channel 24". HDC 22" comprises a SM_DET transceiver 76" which transmits the SM_DET signal to and receives the SF_ST signal from the SF_ST transceiver 48" on R/W channel 24". HDC 22" and R/W channel 24" comprise respective NRZ transceivers 78" and 50", respectively, for exchanging NRZ data and serial transceivers 82" and 54" respectively for exchanging serial data. R/W channel 24" comprises a receive clock transmit circuit 44" to transmit RCLK signal to a receive clock receive circuit 72" on HDC 22'.

As noted above. signal and data transmitting, receiving and transceiving circuits are generally known, and based on the teachings provided herein, one skilled in the art would be able to construct and implement transmitting and receiving circuits to carry out the specific signaling protocol described herein.

The interface 20" of the third embodiment provides for multiple-sector read and write delays; one codeword size per drive (preferred but not limited to); multiple splits per sector; maximum one split per codeword; and data recovery between first sync mark and third sync mark.

During a write operation, HDC 22''' first transfers a block of user data to the Read Channel (RC) through the 9-bit NRZ data bus for encoding. The 9-bit NRZ data is qualified with the DATA_VALID signal throughout the transfer. When the DATA_VALID signal is set to 1, the 9-bit NRZ data is considered to be valid data, ready for R/W CHANNEL 24''' to latch into its working buffer. HDC 22''' then waits for a fixed delay prior before asserting RWGATE (which can occur any time after the fixed delay) to flush out the encoded data inside R/W channel 24''' buffer. The fixed delay, which is calculated from the assertion of the DATA_VALID signal, is required for R/W channel 24''' to finish encoding one codeword.

During a read operation, HDC 22" asserts RWGATE to allow R/W channel 24" to read data for iterative decoding. As soon as one codeword is completely decoded, R/W channel 24" transfers the decoded data through the 9-bit NRZ data bus to HDC 24". The 9-bit NRZ data is qualified with the DATA_VALID signal throughout the transfer. When the DATA_VALID signal is set to 1, the 9-bit NRZ data is considered to be valid, ready for HDC 24" to latch in.

The third embodiment comprises the following three signals for a two-step process during read and write operations:

R/W_;
DATA_VALID; and
WRT_FAULT/RD_RST

Since the RGATE and WGATE signals are combined into one RWGATE signal, only two pins are effectively added. A detailed description of these signals is provided in Table 3 below.

TABLE 3

| Signal | Type | Description |
| --- | --- | --- |
| RW | Input to R/W channel 24" | 0: = Write operation.<br>1: = Read operation.<br>This signal may be replaced by internal register programming through the standard 3-bit serial interface. |
| DATA_VALID | Bi-directional | During a write operation, DATA_VALID is an input signal and indicates that the 9-bit NRZ data bus is valid when it goes high. Therefore, R/W channel 24" can latch the valid data from the bus at the rising edge of WCLK.<br>During a read operation, DATA_VALID is an output signal and indicates the 9-bit NRZ data bus is valid when it goes high. Therefore, HDC 22''' can latch the valid data from the bus at the rising edge of RCLK. |
| WRT_FAULT or RD_RST | Bi-directional | During a write operation, WRT_FAULT is asserted from R/W channel 24''' to HDC if there is an overflow on the internal data buffer, in which case HDC 22''' must redo the write operation for the previous sector. |

TABLE 3-continued

| Signal | Type | Description |
|---|---|---|
| | | During a read operation, RD_RST is asserted from HDC 22''' to R/W channel 24''' under the following conditions:<br>As soon as R/W channel 24''' completes decoding one codeword, it sends the user data to HDC 22''' without any knowledge of HDC 22''' status. If HDC 22''' is not ready to accept the user data, HDC 22''' should issue an RD_RST (minimum of five RCLK cycles) to R/W channel 24''' and redo the read operation.<br>If HDC 22''' receives more or less data than it expected, it issues an RD_RST (minimum of five RCLK cycles) to R/W channel 24''' and redo the read operation. |
| RWGATE | Input to R/W channel 24" | $\overline{RW}$ = 0, RWGATE = WGATE<br>$\overline{RW}$ = 1, RWGATE = RGATE<br>For a read operation, the codeword size is previously programmed into R/W channel 24''' internal control register through the standard 3-bit serial interface. HDC 22" asserts RWGATE as a normal RGATE. HDC 22" starts counting RCLK cycles when it detects SM_DET. When HDC 22''' counter value is equal to the number of expected read bytes (which is stored in HDC 22''' table), RWGATE is deasserted. The number of RCLK cycles between the SM_DET pulse and the deassertion of RWGATE is used to determine the read byte length expected from this RWGATE. At this point, HDC 22''' indirectly sends the byte length to R/W channel 24". |
| RCLK | Output from R/W channel 24" | Most of the time, this is equal to 8 x channel clock. During the assertion of RWGATE, a dynamic clock insertion occurs after the sync mark is found for a read operation. During a write operation, a dynamic clock insertion occurs after sending out the sync mark pattern to the preamp. |
| WCLK | Input to R/W channel 24" | Same clock frequency as RCLK, but different phase. |
| SM_ST or SM_DET | Bi-directional | During a write operation, if the USE_SM_ST bit is set to 1, SM_ST is used to indicate the start of the insertion of a sync mark. Otherwise, the insertion of a sync mark is controlled by an internal register.<br>During a read operation, SM_DET is asserted by R/W channel 24" to indicate that a sync mark was found after RWGATE was asserted. |
| NRZ[8:0] | Bi-directional | During a write operation, NRZ [8:0] are used as inputs. NRZ [8] is the parity bit, and NRZ [7:0] is the user data (including permuted ECC/RLL). HDC 22' is also responsible for ensuring that the user data is in an 8-bit format. If the last user data is less than 8 bits, it should be padded up to 8 bits.<br>During a read operation, NRZ [8:0] are used as outputs. NRZ [8] is a multi-purpose bit, and NRZ [7:0] is the user data. |

Since the third embodiment does not utilize an SCD pin, as in the first embodiment, HDC 22" does not transfer various control information (codeword size, read/write length counter, and split sector size) on the fly. Each time HDC 22" wants to use a different codeword size for each read and write operation, HDC 22" must set up R/W channel 24''' internal registers ahead of time through the standard 3-bit serial interface.

In traditional arrangement read and write operations would normally slow down. However, in accordance with the third embodiment one codeword size per drive application is used to avoid this problem. The codeword size is provided at power-up from HDC 22" to R/W channel 24" registers through the standard 3-bit serial interface.

Fault Condition

The third embodiment requires two steps for each read and write operation.

During a write operation, a block of user data from HDC 22" is transferred to R/W channel 24" for encoding. HDC 22" then asserts RWGATE to flush out the encoded data from R/W channel 24". During a read operation, HDC 22" asserts RWGATE to read in a block of encoded data into R/W channel 24".

After R/W channel 24" completes the iterative decoding process, the block of user data is transferred back to HDC 22". In this mode R/W channel 24" is in a slave mode relative to HDC 22". If HDC 22" fails to follow the proper two-step process for each read and write operation, a fault condition could occur in R/W channel 24".

The following describes the fault handling for each read and write operation.

Write Fault Handling

One Codeword Per Sector

The two-step process for a write operation is as follows:

One codeword size of user data is transferred from HDC 22" to R/W channel 24" for encoding.

HDC 22" asserts RWGATE to flush out encoded data from R/W channel 24".

Under abnormal conditions, if HDC 22''' transfers another single codeword size of user data prior to asserting RWGATE to flush out the previous encoded data, a fault condition occurs. R/W channel 24''' either asserts the WRT_FAULT signal or replaces the current working buffer data with the new user data. The response of R/W channel 24" depends on the register bit setting. If WRT_FAULT is asserted, HDC 22" is responsible for resetting RC24" through the standard 3-bit serial interface and the write operation performed again. If R/W channel 24" replaces the new encoded data with the current encoded data, HDC 22" can resume step 2 to flush out the encoded data inside RC24" working buffer.

Multiple Codewords Per Sector

The two-step process for a write operation is as follows:

Transfer one codeword size of user data from HDC 22" to R/W channel 24" for encoding.

HDC 22" asserts RWGATE to flush out encoded data from R/W channel 24".

Under abnormal conditions, if HDC 22" does not assert RWGATE for a prolonged period of time, an overflow occurs (because the working buffer is only a limited size). When an overflow occurs in the working buffer for a write operation, R/W channel 24" asserts WRT_FAULT. If WRT_FAULT is asserted HDC 22" is responsible for resetting R/W channel 24" through the standard 3-bit serial interface and the write operation is performed again.

Read Fault Handling

One or Multiple Codewords Per Sector

The two-step process for a read operation is as follows:

HDC 22" asserts RWGATE to read in a block of encoded data into R/W channel 24".

User data block is transferred back to HDC 22" after R/W channel 24" completes iterative decoding process.

Since R/W channel 24" has no knowledge of whether HDC 22" is ready to accept decoded data, HDC 22" asserts the RD_RST signal (for a minimum of five RCLK cycles) to reset R/W channel 24" and retry the read operation sequence for the previous sector.

Single Codeword Per Sector without Split

Figure 26:
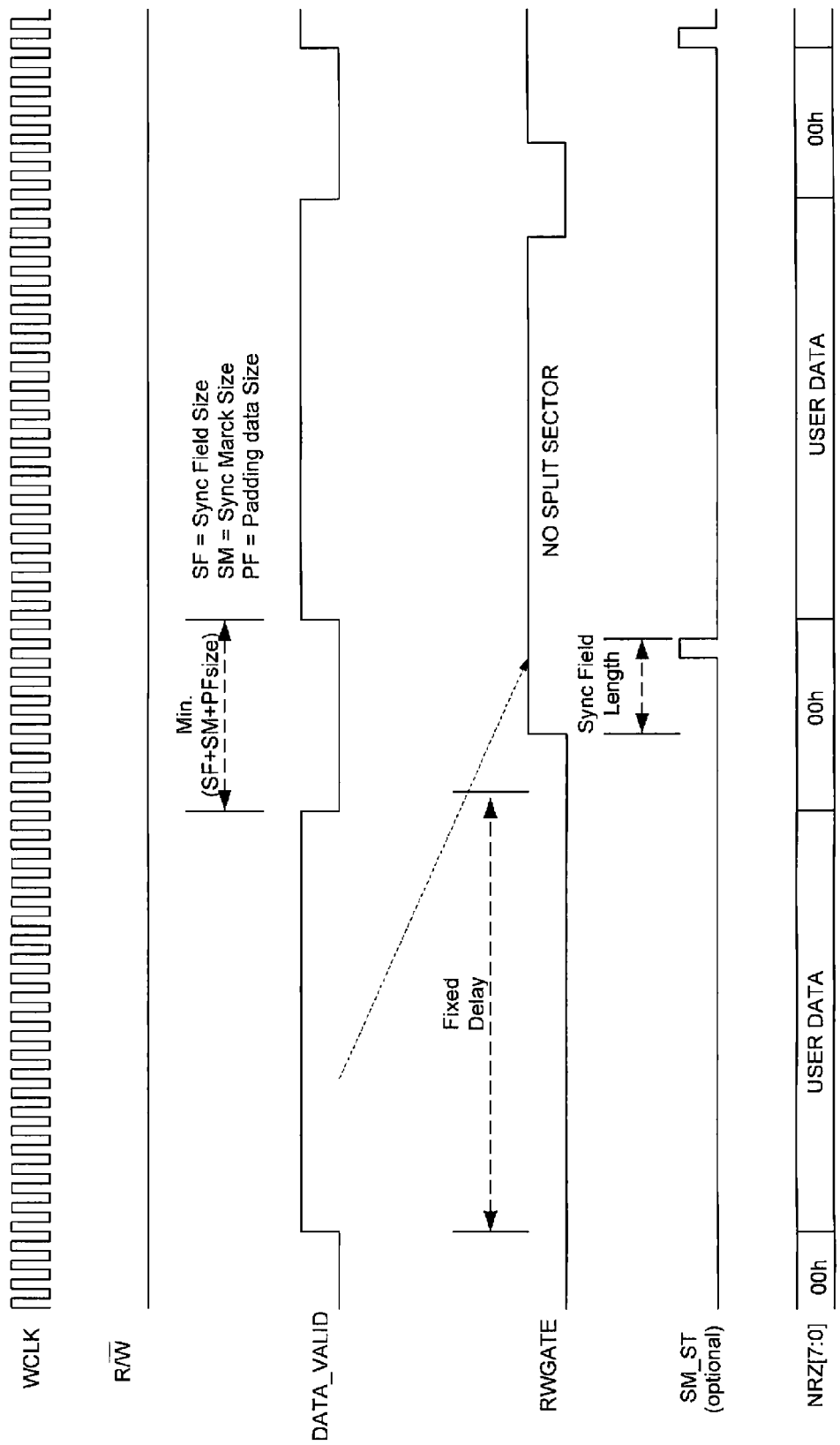
FIG. 26 is a timing diagram for a single codeword per sector without a split for a write operation, in accordance with the third embodiment of the invention.

In FIG. 26, a write operation of one codeword per sector without a split is performed. When the DATA_VALID signal is asserted, the data stream on the NRZ bus is qualified. The codeword size information for this sector is obtained from internal R/W channel registers, which are programmed, for example, at the beginning of a power-up.

After R/W channel 24" completes the iterative encoding (it waits for a fixed delay period), HDC 22" asserts RWGATE. R/W channel 24" first sends out the sync field pattern, then the sync mark pattern. The length of the sync field pattern is obtained from internal registers or by detecting the assertion of SM_ST. At the end of the RWGATE drop, one to four bytes of write pad data is sent to the preamp. The gap between two consecutive DATA_VALID signals are larger than the sum of the Sync Field Size (SF), the Sync Mark Size (SM) and the Padding Data Size (PM).

Single Codeword Per Sector with Split

Figure 27:
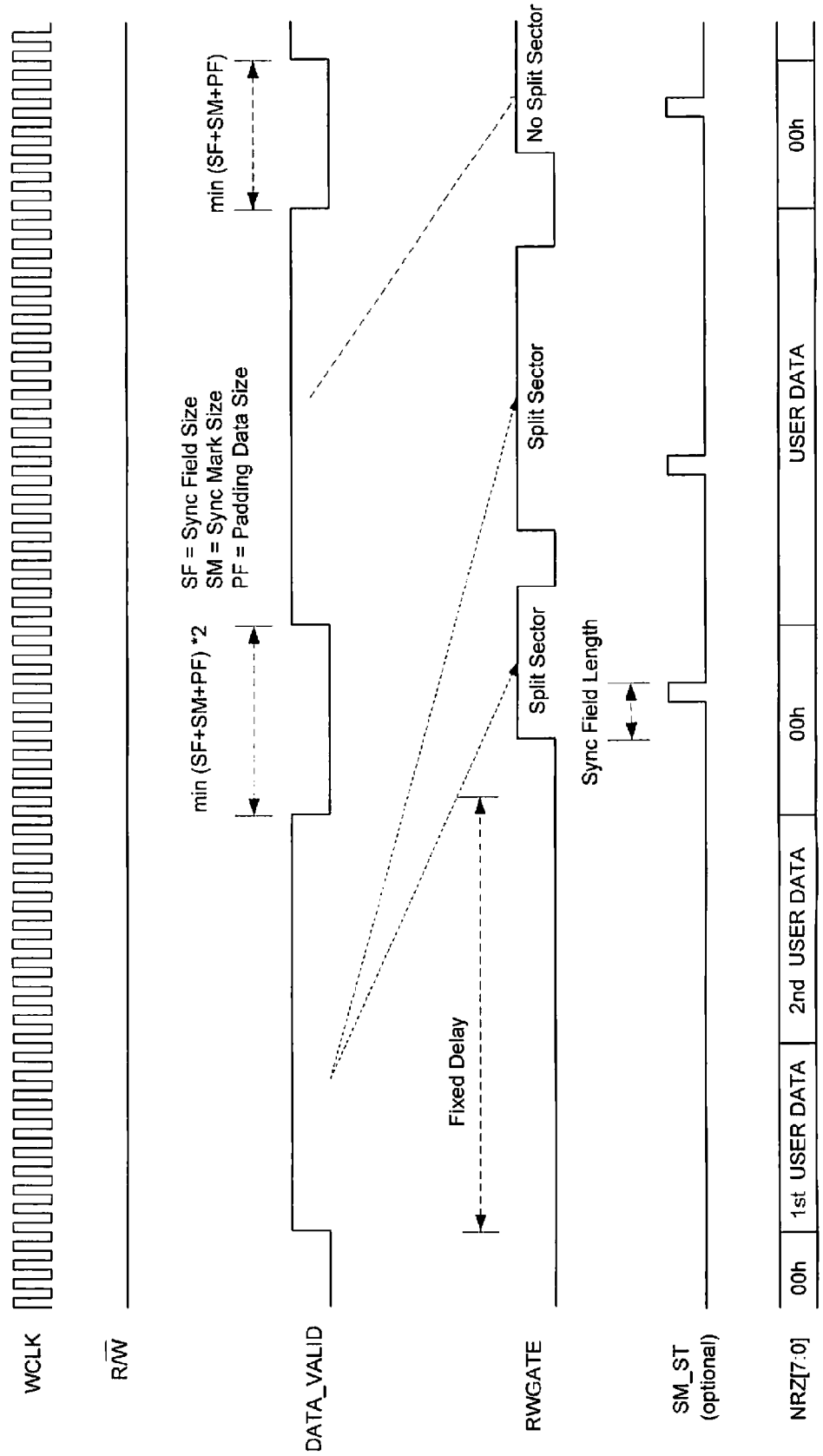
FIG. 27 is a timing diagram for single codeword per sector with split for a write operation, in accordance with the third embodiment of the invention.

In FIG. 27, a write operation of one codeword per sector with one split is performed. First, the entire codeword of user data must be transferred to R/W channel 24" for encoding. When the DATA_VALID signal is asserted, the data stream on the NRZ bus is qualified. The codeword size information for this sector is obtained from internal R/W channel registers, which are programmed at the beginning of a power-up.

After R/W channel 24" completes the iterative encoding (it waits for a fixed delay period), HDC 22" asserts RWGATE. R/W channel 24" first sends out the sync field pattern, then the sync mark pattern. The length of the sync field pattern is obtained from internal registers or by detecting the assertion of SM_ST. At the end of the deassertion of RWGATE, one to four bytes of write pad data is sent to the preamp. Since RWGATE is asserted twice for one codeword, the gap between two consecutive DATA_VALID pulses must be larger than 2(SF+SM+PF).

Multiple Codewords Per Sector without Split

Figure 28:
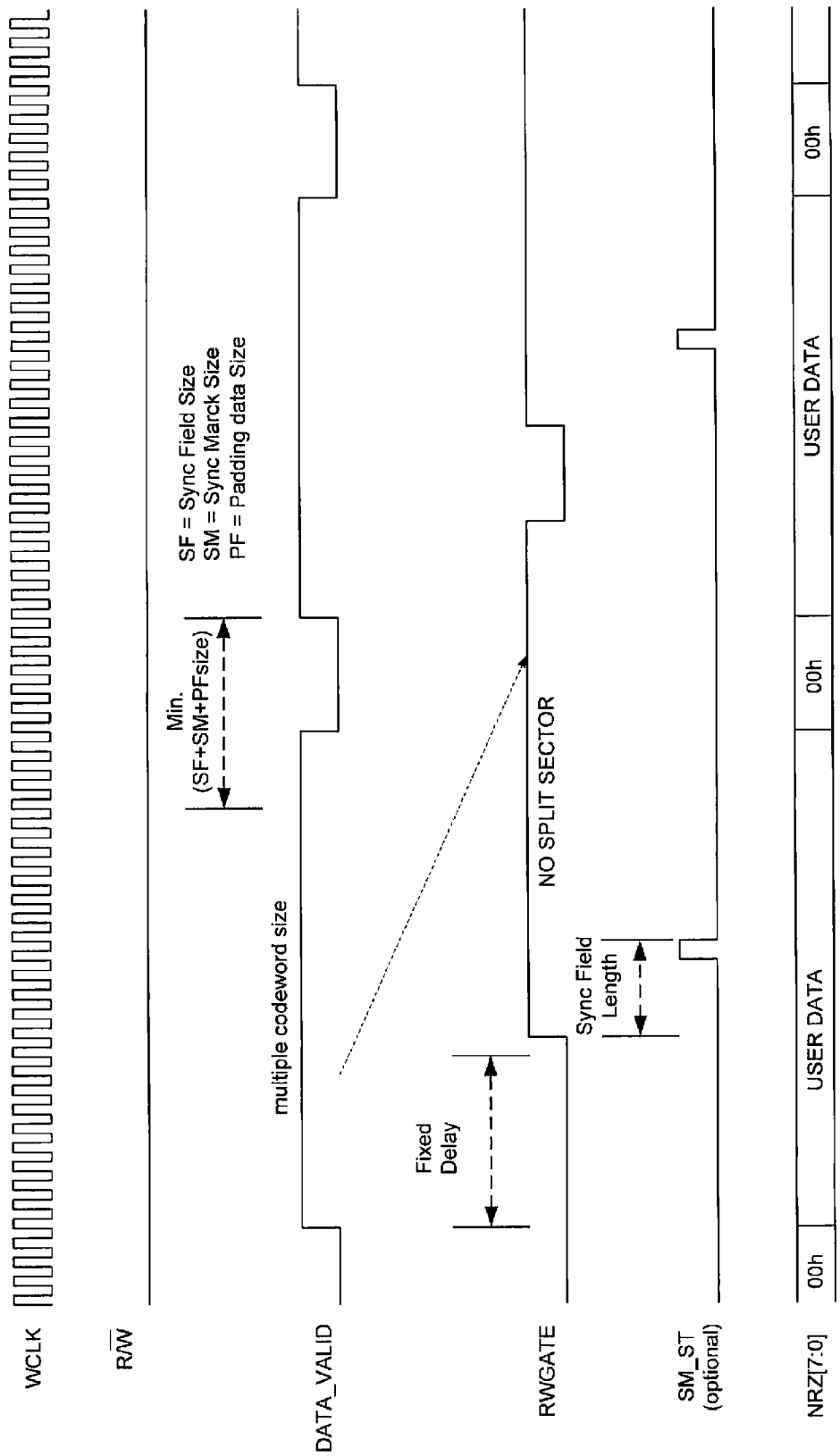
FIG. 28 is a timing diagram for multiple codewords per sector without split for a write operation, in accordance with the third embodiment of the invention.

FIG. 28 illustrates a write operation of multiple codewords per sector without splits being performed. Because a clock insertion is ongoing after a sync mark is inserted, there is no difference between one codeword per sector without split and multiple codewords per sector without split. The fixed delay is substantially identical for both cases.

Multiple Codewords Per Sector with Multiple Splits

Figure 29:
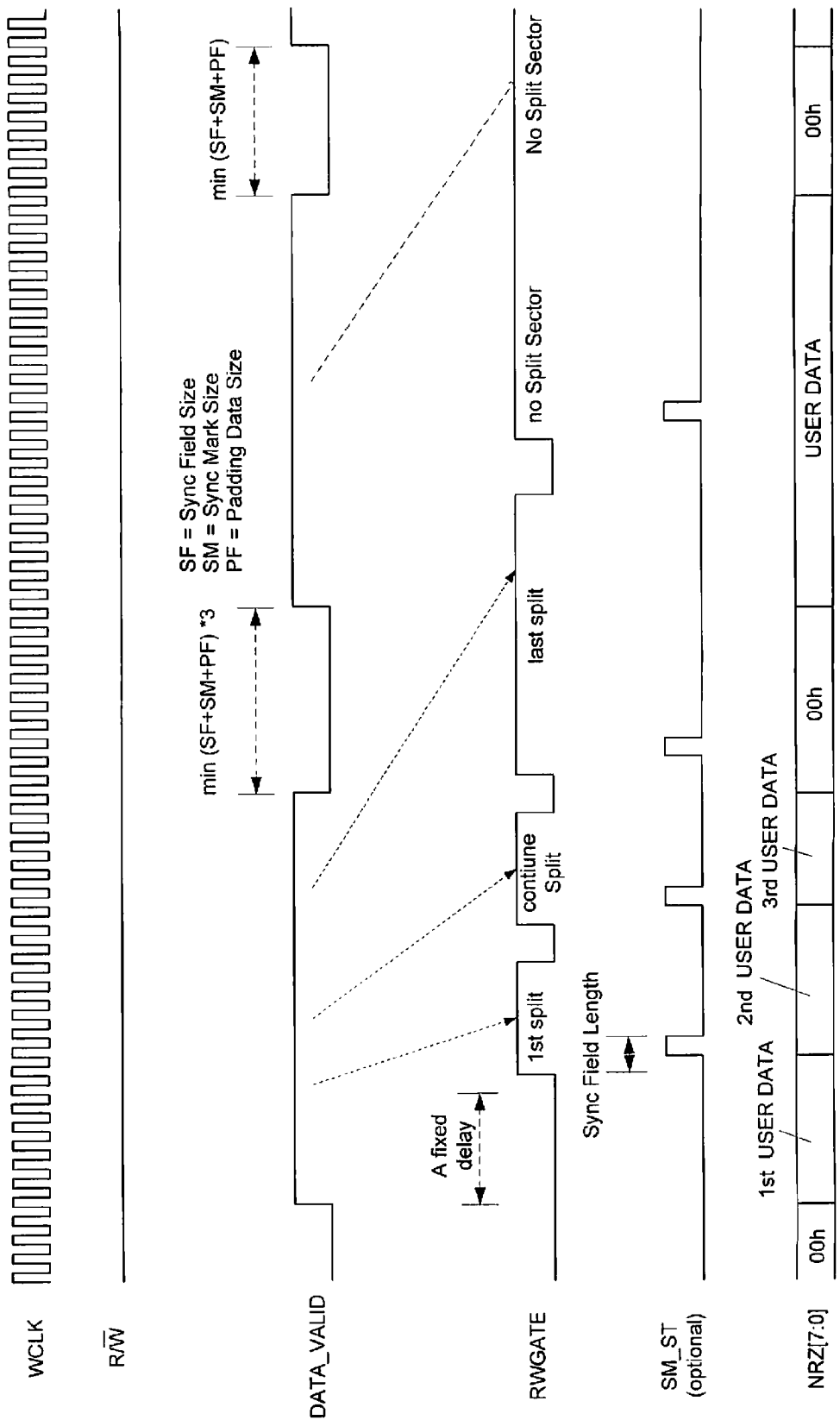
FIG. 29 is a timing diagram for multiple codewords per sector with multiple splits for a write operation, in accordance with the third embodiment of the invention.

In FIG. 29, a write operation of multiple codewords per sector with multiple splits is performed. It is similar to one codeword per sector with one split except that the minimum gap between two consecutive DATA_VALID pulses is equal to NUMBER_OF_SPLITx(SF+SM+PM). The WRT_FAULT signal is asserted by R/W channel 24" if the working buffer overflows, which can occur when the gap between successive RWGATEs exceeds the amount that R/W channel 24'" buffer can accept.

Single Codeword Per Sector without Split

Figure 30:
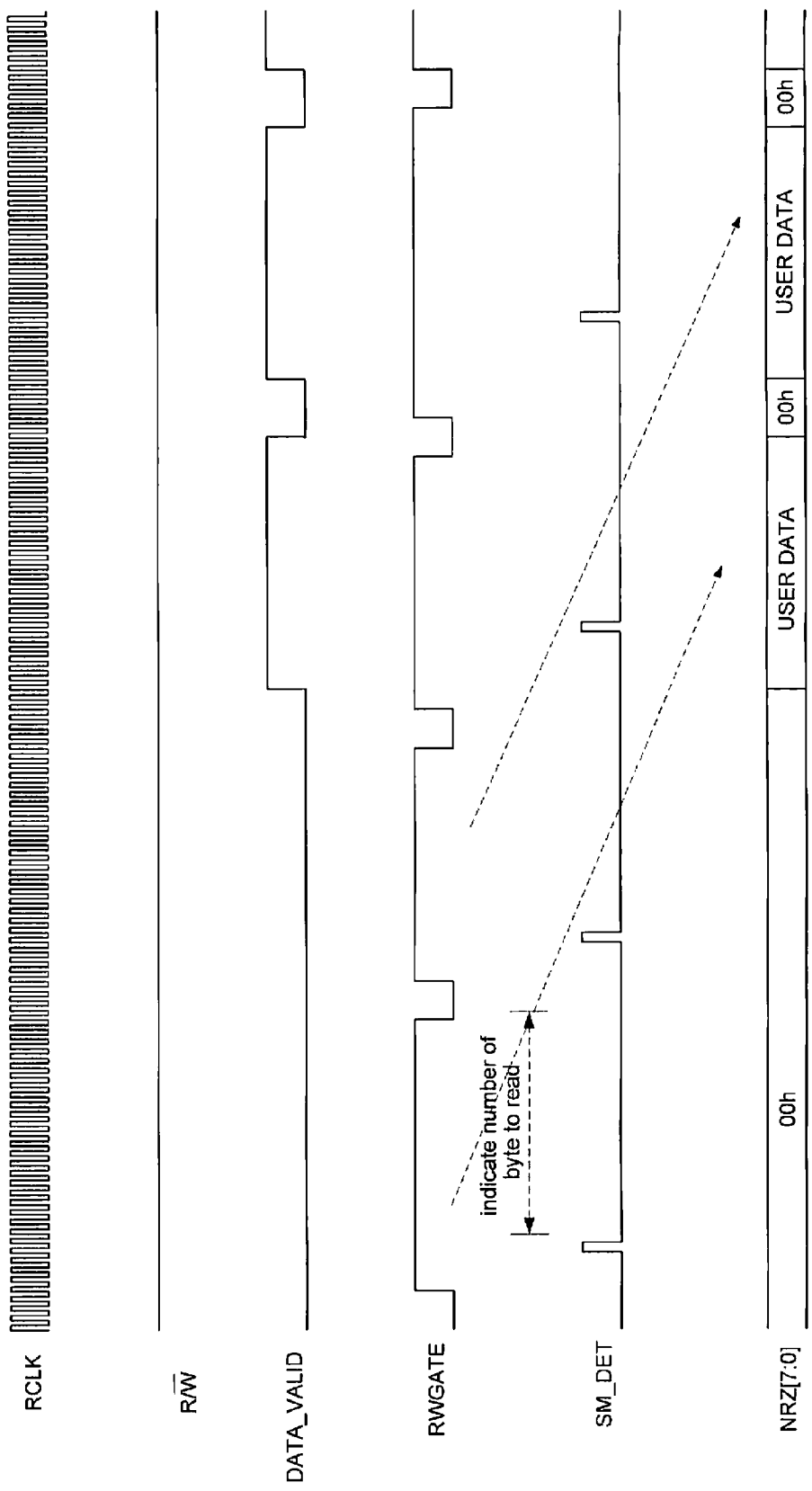
FIG. 30 is a timing diagram for multiple codewords per sector with multiple splits for a write operation, in accordance with the third embodiment of the invention.

FIG. 30 shows consecutive read operations of a single codeword per sector without a split being performed. The codeword size was previously programmed into an internal R/W channel control register through the standard 3-bit serial interface. HDC 22" asserts RWGATE as a normal RGATE. HDC 22" starts counting RCLK cycles when it detects SM_DET. When HDC 22'" counter value equals the number of expected read bytes (as stored in HDC 22'" table), RWGATE is deasserted. The number of RCLK cycles between the SM_DET pulse and the deassertion of RWGATE is used to determine the read byte length expected from this RWGATE. At this point, HDC 22'" indirectly sends the byte length to R/W channel 24". After R/W channel 24" completes decoding, R/W channel 24" starts to send the user data to HDC 22" via the NRZ data bus.

Single Codeword Per Sector with Split

Figure 31:
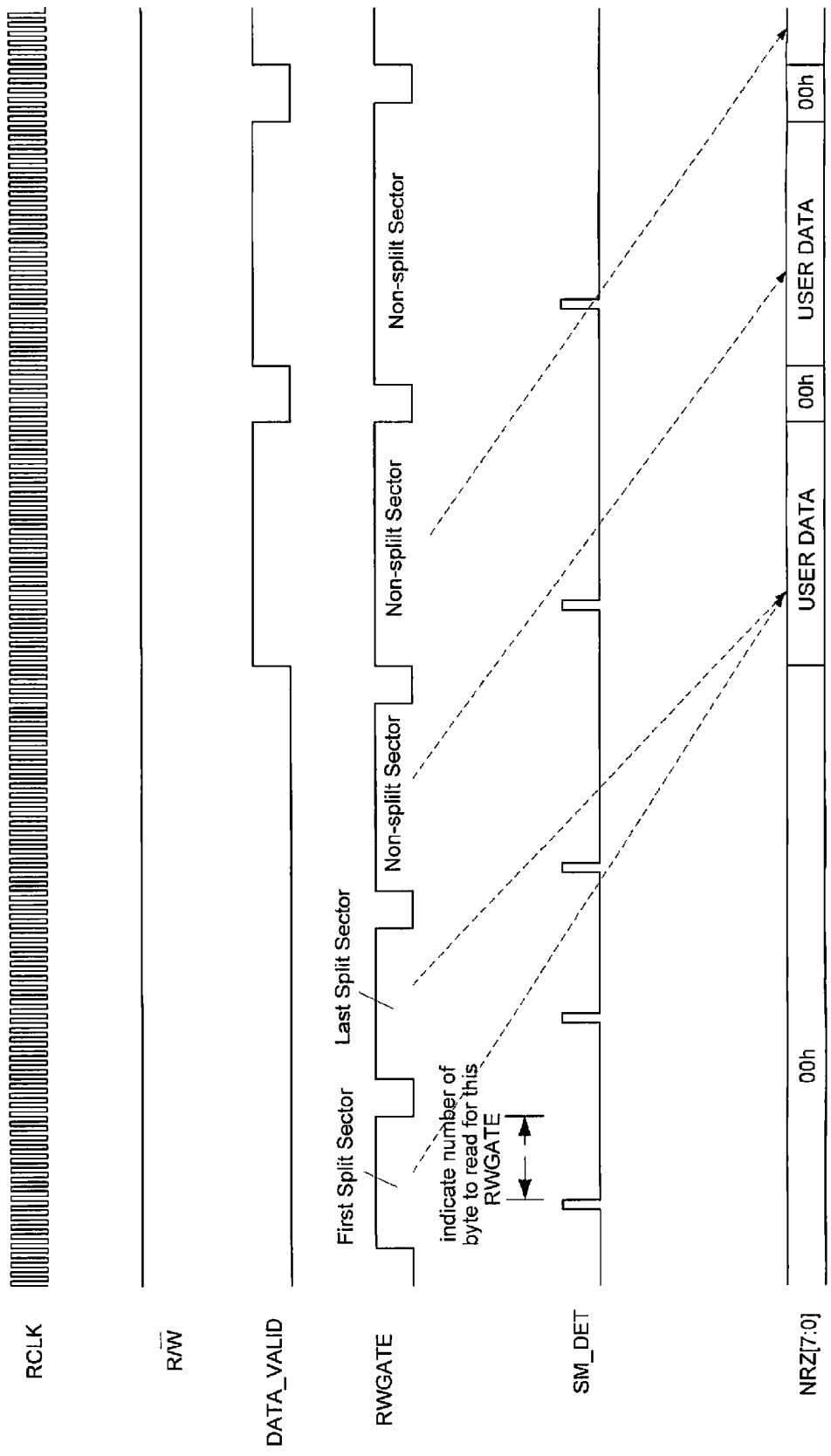
FIG. 31 is a timing diagram for a single codeword per sector with split for a read operation, in accordance with the third embodiment of the invention.

In FIG. 31, consecutive read operations of one codeword per sector with a split are performed. After collecting the first- and last-split sectors, R/W channel 24" merges the two split sectors and transfers the decoded data to HDC 22" via the NRZ data bus.

Multiple Codewords Per Sector without Split

Figure 32:
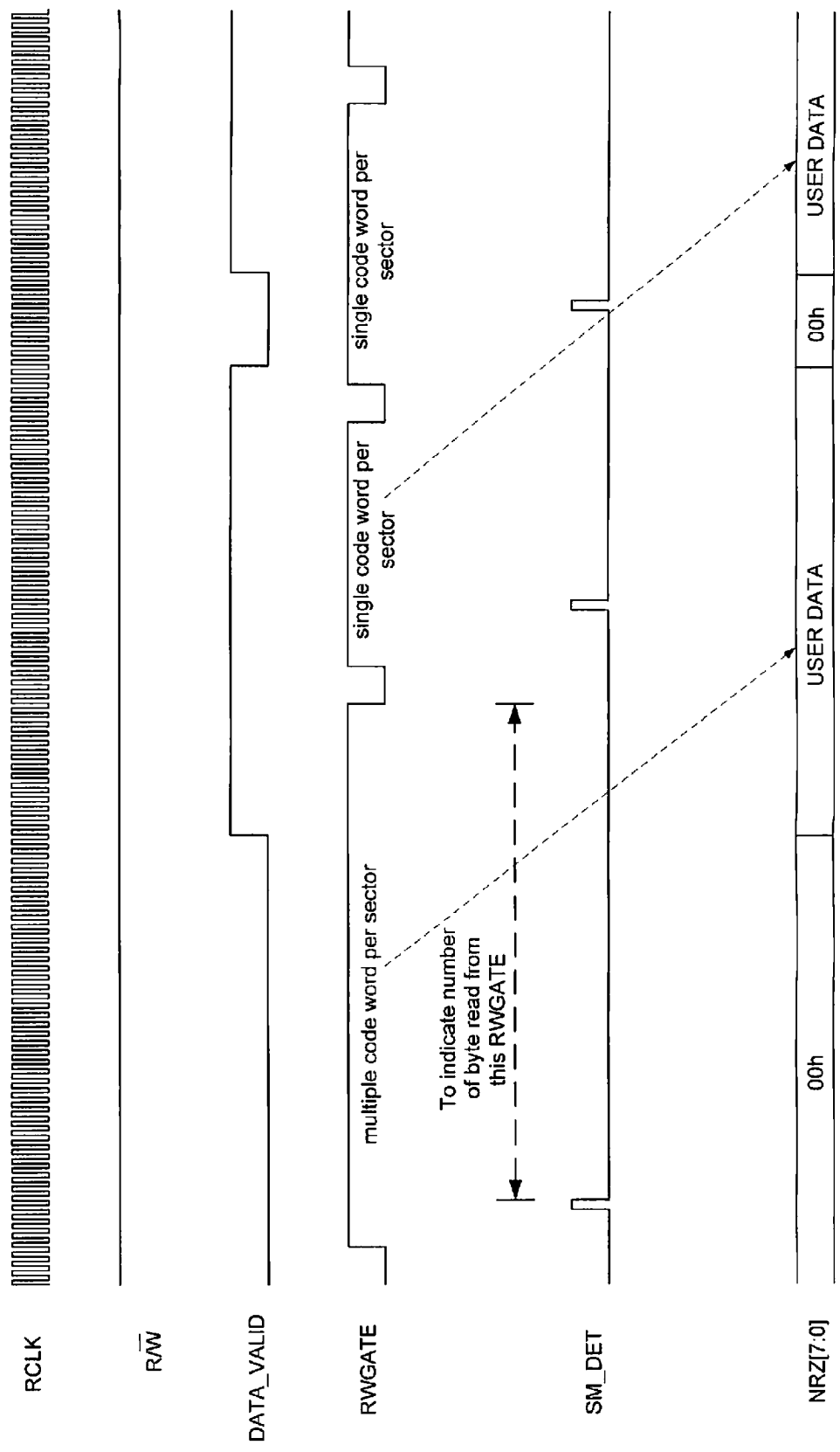
FIG. 32 is a timing diagram for multiple codewords per sector without split for a read operation, in accordance with the third embodiment of the invention.

FIG. 32 illustrates a read operation of multiple codewords per sector without a split being performed. The codeword size was previously programmed into an internal R/W channel control register through the standard 3-bit serial interface. HDC 22" asserts RWGATE as a normal RGATE. HDC 22" starts counting RCLK cycles when it detects SM_DET. When HDC 22'" counter value equals the number of expected read bytes (as stored in HDC 22'" table), RWGATE is then deasserted. The number of RCLK cycles between the SM_DET pulse and the deassertion of RWGATE is used to determine the read byte length expected from this RWGATE. At this point, HDC 22"indirectly sends the byte length to R/W channel 24". As soon as R/W channel 24" completes decoding one codeword, it asserts DATA_VALID and transfers the user data to HDC 22'" via the NRZ data bus.

Multiple Codewords Per Sector with Multiple Splits

Figure 33:
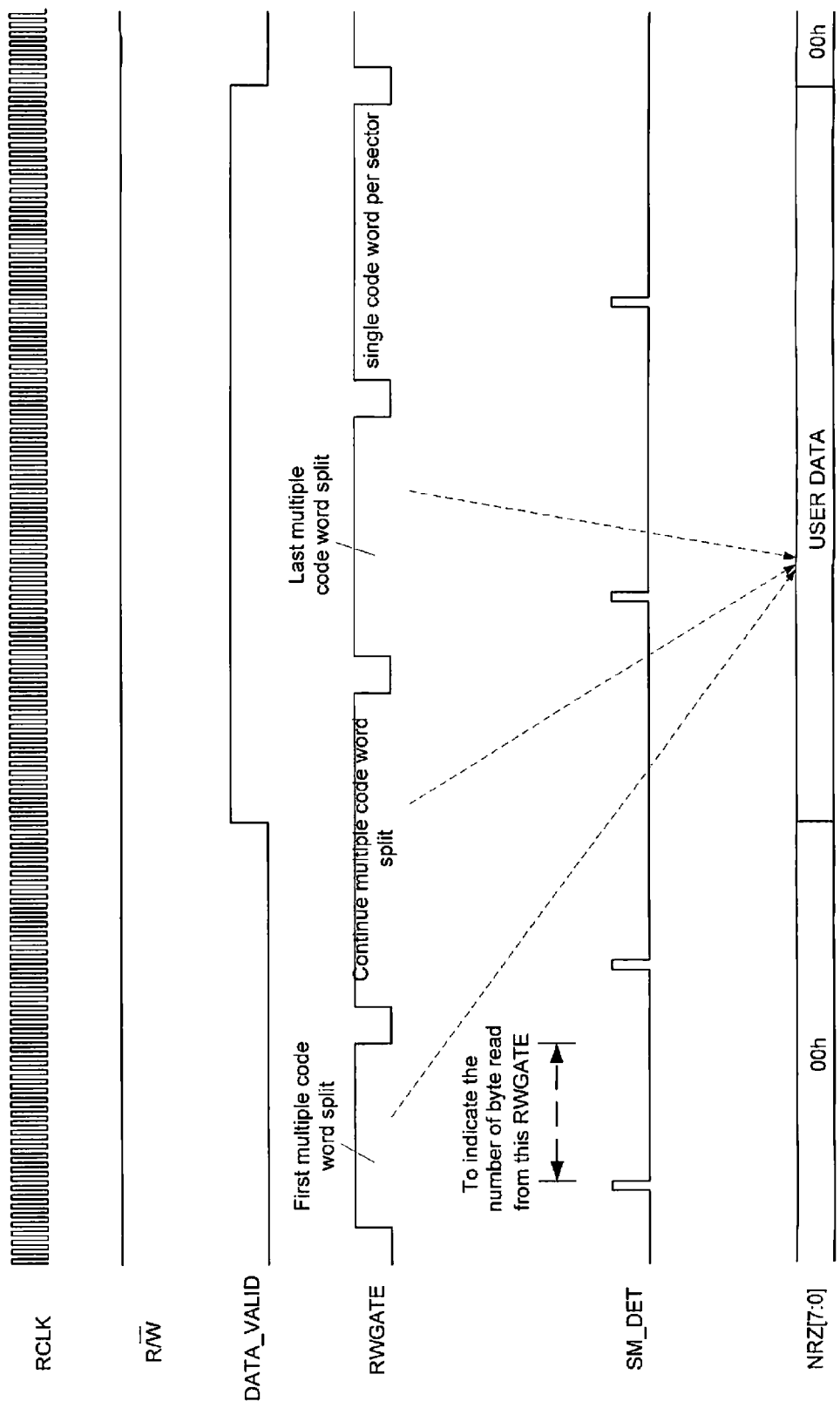
FIG. 33 is a timing diagram for multiple codewords per sector with multiple splits for a read operation, in accordance with the second embodiment of the invention.

In FIG. 33, a read operation with multiple codewords per sector with multiple splits is performed. In this case, the first codeword is divided into two RWGATEs. After R/W channel 24" collects the first completed codeword and completes iterative decoding, it begins sending the decoded user data to HDC 22" and the DATA_VALID must be set to 1.

Fourth Embodiment

Figure 34:
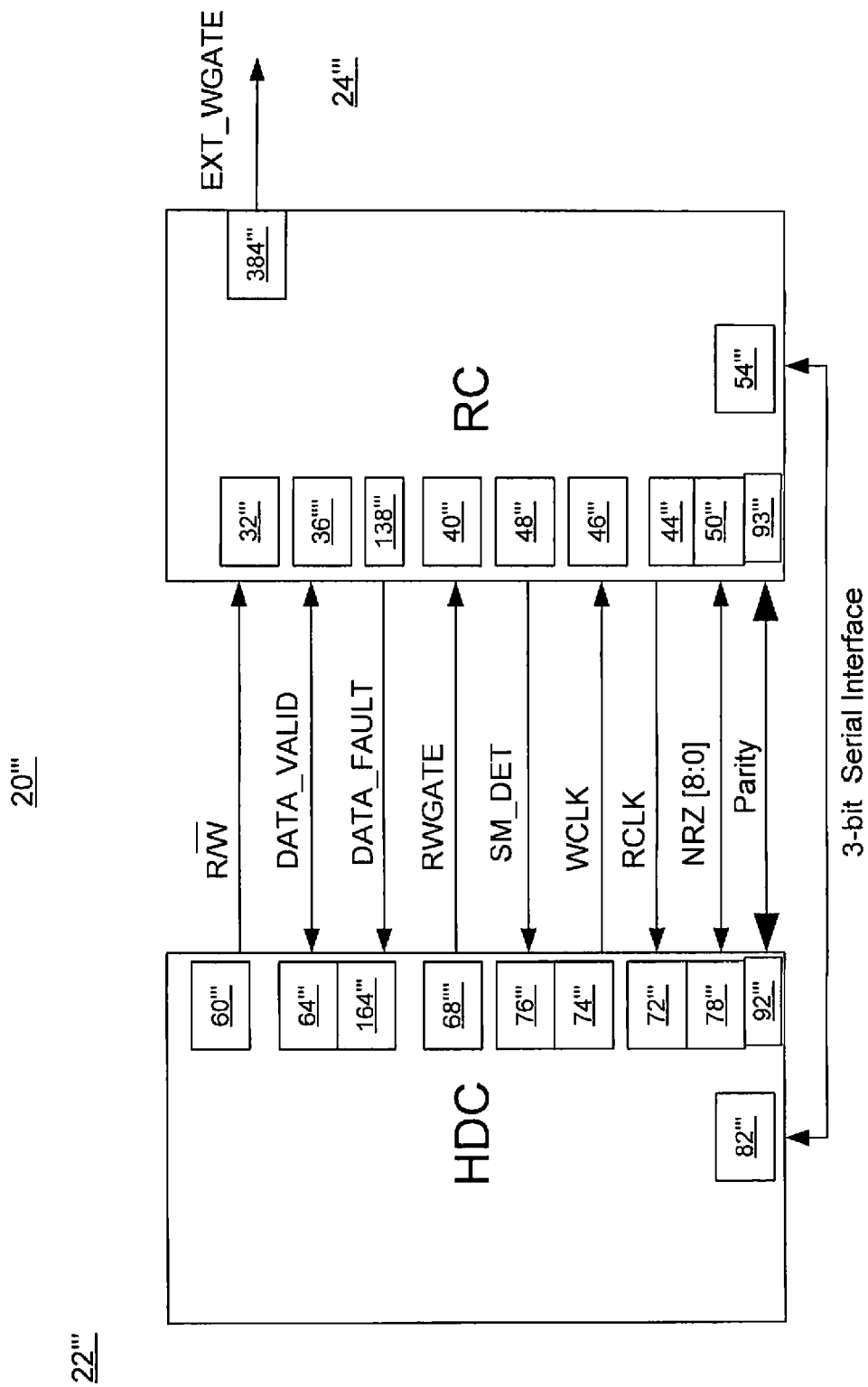
FIG. 34 is a block diagram of an interface between two hardware components, such as an HDC and an RDC or R/W channel, in accordance with a fourth embodiment of the invention.

FIG. 34 is illustrative of the fourth embodiment which is a subset of the first embodiment and provides for multiple-sector read and write delays, one codeword size per drive (preferred but not limited), multiple splits per sector, maximum one split per codeword, data recovery between first sync mark and second sync mark, fault handling, and synchronize read and write operation.

Referring again to FIG. 34, each of HDC 22'" and the R/W channel 24'" includes appropriate circuitry for transmitting and receiving the various signals, data and mode selection information between the two hardware components. For example, HDC 22'" includes a R/W transmit circuit 60'" that transmits the R/W signal to R/W receiver circuit 32'" on R/W channel 24'", a data valid transceiver circuit 64'" that transmits the DATA_VALID signal to and receives the DATA_VALID signal from a data valid transceiver circuit 36'" on R/W channel 24'". A DATA_FAULT receiver 164'" is provided in HDC 22'" to receive the DATA_FAULT signal to from DATA_FAULT transmit circuit 138'" on R/W channel 24'''. HDC 22''' also comprises a RWGATE transmit circuit 68''' which transmits the RWGATE signal to RWGATE receive circuit 40''' of R/W channel 24'''. HDC 22''' also includes a write clock transmit circuit 74''' to transmit the WCLK signal to write clock receive circuit 46''' on R/W channel 24'''. HDC 22''' comprises a SM_DET receiver 76''' which receives the SM_DET signal from the SM_DET transmitter 48''' on R/W channel 24'''. HDC 22''' and R/W channel 24''' comprise respective NRZ transceivers 78''' and 50''', respectively, for exchanging NRZ data and serial transceivers 82''' and 54''' respectively for exchanging serial data. R/W channel 24''' comprises a receive clock transmit circuit 44''' to transmit RCLK signal to a receive clock receive circuit 72''' on HDC 22'''. HDC 22''' includes a data valid transceiver circuit 64''' that transmits a parity signal to and receives the parity signal from a parity transceiver circuit 36''' on R/W channel 24'''. R/W channel 24''' comprises a EXT_WGATE transmitter 384''' to generate the EXT_WGATE to control a preamplifier (not shown). When EXT_WGATE is asserted the preamplifier is set to write data onto the media, when deasserted data can be read from the media.

A detailed description of these signals is provided in Table 4 below.

TABLE 4

R/W channel 24''' Signal Definition

| Signal | Type | Description |
| --- | --- | --- |
| R/W_ | Input to R/W channel 24''' | 0: = Write operation.<br>1: = Read operation.<br>Alternatively, this signal can be replaced by internal register programming through the standard 3-bit serial interface. |
| DATA_VALID | Bi-directional | During a write operation, DATA_VALID is an input signal to R/W channel 24''' and it indicates the 8-bit NRZ data bus is valid when it is asserted. Therefore, R/W channel 24'' can latch the data from the bus correctly at the rising edge of WCLK. When DATA_VALID is de-asserted, R/W channel 24''' can latch one more data from the NRZ data bus correctly.<br>During a read operation, DATA_VALID is an output signal from R/W channel 24''' and it indicates the 8-bit NRZ data bus is valid when it is asserted. Therefore, HDC 22''' can latch the data from the bus correctly at the rising edge of RCLK. When DATA_VALID is de-asserted, HDC 22''' can latch one more data from the NRZ data bus correctly. |
| DATA_FAULT | Output from R/W channel 24''' | DATA_FAULT is an output signal from R/W channel 24''' that is used to indicate an abnormal transaction happen between HDC 22''' and R/W channel 24'''. When DATA_FAULT is asserted by R/W channel 24''', HDC 22''' reads the DATA_FAULT_REG through the 3-bit regular serial register to find out what cause the fault. After reading the DATA_FAULT_REG, the DATA_FAULT_REG will automatic clear itself and the DATA_FAULT is de-asserted.<br>List of fault conditions:<br>(1) R/W channel Encoder buffer overflow<br>(2) R/W channel Encoder buffer underflow<br>(3) Boundary codeword check fail for DATA_VALID during Write operation<br>(4) Boundary codeword check fail for RWGATE during Write operation<br>(5) Boundary codeword check fail for RWGATE during Read operation<br>(6) Boundary codeword check fail during merger the split sector in Read operation<br>(7) Parity Error |
| RWGATE | Input to R/W channel 24''' | RWGATE is always synchronized with WCLK. The total number of WCLKs elapsed during the assertion of RWGATE is equal to total number of bytes of data expected to be written or read during this assertion of RWGATE. During a write operation, the RWGATE is asserted as a conventional WGATE except the duration of this assertion is only equal to the actual data length in terms of WCLK. During the read operation, the RWGATE is asserted as a conventional RGATE except the duration of this assertion is only equal to the actual data length in terms of WCLK. |
| RCLK | Output from R/W channel 24''' | Most of the time, RCLK is either 8 x channel clock or 10 x channel clock (i.e. 888888810).<br>During write operations, another level of dynamic clock insertion occurs after sending out the sync mark pattern to the preamp.<br>During a read operation, another level of dynamic clock insertion occurs after the sync mark is found for a read operation. |
| WCLK | Input to R/W channel 24''' | Same clock frequency as RCLK, but different phase. |
| SM_DET | Bi-directional | During a read operation, one SM_DET is asserted by R/W channel 24''' to indicate that a sync mark 1 was found after RWGATE was asserted.<br>During a read operation, two SM_DET is asserted by R/W channel 24''' to indicate that a sync mark 2 was found after RWGATE was asserted. |
| NRZ[7:0] | Bi-directional | During a write operation, NRZ [7:0] is the user data (either including permuted ECC/RLL or not) which is synchronized with WCLK.<br>During a read operation, NRZ [7:0] are used as outputs from R/W channel 24'''. NRZ [8] is a multi-purpose bit, and NRZ [7:0] is the user data and it is synchronize with RCLK. |
| PARITY | Bi-directional | Parity is used as multiple function signal, one of the functions is used as parity which is generated from the NRZ[7:0] bus. During a Write operation, it is synchronized with WCLK. During a Read operation, it is synchronized with RCLK. |
| EXT_WGATE | Output from R/W channel 24''' | During the Write operation, EXT_WGATE is generated from R/W channel 24'''. Since the length of Sync Filed, Sync Mark and the padding data is pre-programmed., R/W channel 24''' generates the EXT_WGATE from appropriately extending the RWGATE. |

In accordance with the fourth embodiment, read and write operations are performed in a synchronized manner as follows.

The following is the sequence of a write operation. Firstly, HDC 22''' asserts the R/W_signal to 0. HDC 22''' then waits for a first predetermined time, referred to as "Fixed Delay 1", and HDC 22''' then asserts DATA_VALID to "1". User data is valid on the 8-bit NRZ bus, and is latched at the rising edge of WCLK by R/W channel 24'''. When HDC 22''' de-asserts DATA_VALID; one additional user data is valid on the 8-bit NRZ bus, which is latched at the rising edge of WCLK by R/W channel 24'''. R/W channel 24''' checks the codeword boundary. If the total size of user data received by R/W channel 24''' is different from the pre-programmed codeword size, R/W channel 24''' asserts DATA_FAULT. Once DATA_FAULT is asserted, it can be cleared by reading the DATA_FAULT_REG through the 3-bit serial interface. After HDC 22''' deasserts DATA_VALID, HDC 22''' waits for a second predetermined time, referred to as "Fixed Delay 2". (i.e. a block of encoded data is stored in a working SRAM buffer of R/W channel 24''')

HDC 22''' positions the head over the desired track of the media. RWGATE is asserted by HDC 24", and R/W channel 24" asserts the EXT_WGATE. R/W channel 24''' counts the total number of WCLKs elapsed from this RWGATE to determine the total number of user data expected to be written onto the media for this write operation. In combination with the pre-programmed information of sync field (PLO), sync mark, code table and padding data, R/W channel 24''' can exactly determine how to extend the EXT_WGATE. Right after the RWGATE is asserted, DATA_VALID is asserted by HDC 22'''. While R/W channel 24''' latches the new user data at the rising edge of WLCK, R/W channel 24''' provides the encoded data to the media.

After the completion of the EXT_WGATE, a new block of encoded data is stored into the buffer of R/W channel 24''' and the previous stored encoded data has already been written into the media. For next write operation, HDC 22''' only needs to position the head on the desired media and continue from there. If HDC 22''' changes from a write operation to a read operation and back to a write operation, HDC needs to start from the beginning.

The following is the sequence of a read operation.

HDC 22''' assets R/W_to "1", and HDC 22''' waits for "Fixed Delay 1". HDC 24" then positions the head over the desirable track. RWGATE is asserted from HDC 22", and R/W channel immediately asserts an internal RGATE. R/W channel 24''' counts the total number WCLKs elapsed from this RWGATE to determine the total number of user data expected to read from the media for this read operation. RGATE is an extended version of RWGATE. In combination with the pre-programmed information of sync field, sync mark, code table and padding data, R/W channel 24''' can determine how to extend the RGATE.

As soon as one codeword is completely decoded by R/W channel 24", DATA_VALID is asserted by R/W channel 24'''. The decoded data is sent to the 8-bit NRZ bus for HDC 22''' to latch in at the rising edge of RCLK. After the de-assertion of DATA_VALID by R/W channel 24", HDC 22''' latches one more decoded data on the 8-bit NRZ bus. Each time R/W channel 24''' transfers only one codeword of data through the 8-bit NRZ bus. Therefore, HDC 22''' checks the boundary condition every time it receives data from R/W channel 24'''. For another read operation, HDC 22''' only needs to start from positioning the head step described above. Only when HDC 22''' performs a read operation followed by a write operation and back to another read operation, HDC 22" must start from the beginning.

Control Data Transfer

As compared to the first embodiment, the fourth embodiment does not have the SCD pin. As such, HDC 22''' can not transfer various control information (codeword size, read/write length counter, and split sector size) on the fly. In the fourth embodiment, each time HDC 22''' wants to use a different codeword size for each read and write operation, HDC 22''' must set up the R/W channel internal registers in advance through the standard 3-bit serial interface.

This would normally slow down read and write operations. However, it is preferred that the fourth embodiment use one codeword size per drive application to avoid any such degraded performance. The codeword size is preferably provided at power-up from HDC 22''' to the R/W channel registers through the standard 3-bit serial interface.

Fault Condition

The fourth embodiment requires two steps for each read and write operation. During a write operation, a block of user data from HDC 22''' is transferred to R/W channel 24''' for encoding, and HDC 22''' then asserts RWGATE to flush out the encoded data from R/W channel 24'''. During a read operation, HDC 22''' asserts RWGATE to read in a block of encoded data into R/W channel 24'''.

After R/W channel 24''' completes the iterative decoding process, the block of user data is transferred back to HDC 22'''. R/W channel 24''' is actually working in slave mode relative to HDC 22'''. If HDC 22''' fails to follow the proper two-step process for each read and write operation, a fault condition could occur in R/W channel 24'''.

The following describes the fault handling for the read and write operations.

Write Fault Handling

One Codeword Per Sector

The two-step process for a write operation is as follows:

Transfer one codeword size of user data from HDC 22''' to R/W channel 24''' for encoding, and HDC 22''' asserts RWGATE to flush out encoded data from R/W channel 24'''.

If HDC 22''' transfers another single codeword size of user data without asserting RWGATE to flush out the previous encoded data it may cause the working buffer overflow, and R/W channel 24''' asserts the DATA_FAULT signal.

If HDC 22''' asserts the RWGATE without prior transferring any codewords to R/W channel 24''' for encoding, it may cause a working buffer underflow. As a result, R/W channel 24''' asserts the DATA_FAULT signal.

If DATA_FAULT is asserted, HDC 22''' may read the DATA_FAULT_REG through the standard 3-bit serial interface to determine what is the cause of the DATA_FAULT. Once HDC 22''' reads the DATA_FAULT_REG, the DATA_FAULT is automatically reset.

Multiple Codewords Per Sector

The two-step process for a write operation is as follows:

One codeword size of user data is transferred from HDC 22''' to R/W channel 24''' for encoding, and HDC 22" asserts RWGATE to flush out encoded data from R/W channel 24'''. If HDC 22''' does not assert RWGATE for a prolonged period, an overflow may occur (because the working buffer has only a limited size). When an overflow occurs in the working buffer for a write operation, R/W channel 24''' asserts DATA_FAULT. If DATA_FAULT is asserted, HDC 22''' may read the DATA_FAULT_REG through the standard 3-bit serial interface to determine the cause or the DATA_FAULT. Once HDC 22''' reads the DATA_FAULT_REG, the DATA_FAULT is automatically reset.

Boundary Condition Check

Each time when HDC 22' asserts the DATA_VALID signal, the length of DATA_VALID is equal to codeword size −1 byte. If R/W channel 24''' does not latch the correct number of bytes, DATA_FAULT is asserted.

Additionally, if the length of RWGATE does not end in the codeword boundary for non-split case, DATA_FAULT is asserted. In the case of a split sector, if the two consecutive combinations of RWGATE does not meet the codeword boundary condition. DATA_FAULT is asserted.

If DATA_FAULT is asserted, HDC 22''' may read the DATA_FAULT_REG through the standard 3-bit serial interface to determine the cause of the DATA_FAULT. Once HDC 22''' reads the DATA_FAULT_REG, the DATA_FAULT is automatically reset.

Read Fault Handling

One or Multiple Codewords Per Sector

The two-step process for a read operation is as follows:

HDC 22''' asserts RWGATE to read in a block of encoded data into R/W channel 24''' and user data block is transferred to HDC 22''' after R/W channel 24''' completes iterative decoding process.

Each time R/W channel 24''' sends the user data to HDC 22''' in terms of one codeword size. HDC 22''' checks the boundary condition for each transfer. If any error is found, HDC 22''' can retry the read operation again or reset R/W channel 24''' with the RW_signal.

One or Multiple Codewords Per Sector with Split

During the merger of split sections of a read operation, R/W channel 24''' counts the total amount of combined data. If the result is not met the boundary condition requirement, a DATA_FAULT signal is asserted.

If DATA_FAULT is asserted, HDC 22''' may read the DATA_FAULT_REG through the standard 3-bit serial interface to determine the cause of the DATA_FAULT. Once HDC 22''' reads the DATA_FAULT_REG, the DATA_FAULT is automatically reset.

Write Operation

Single Codeword Per Sector Write Operation

Figure 35:
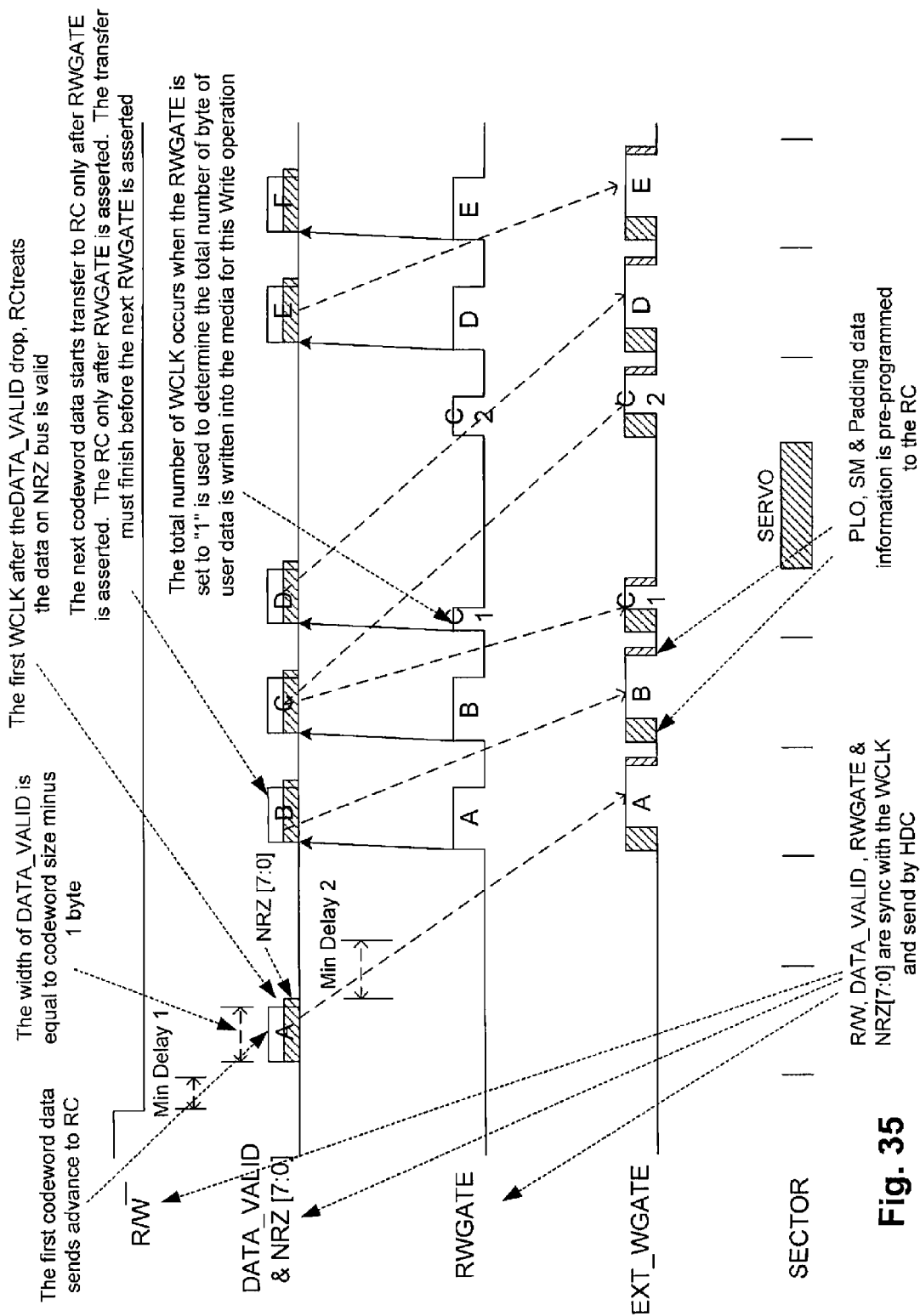
FIG. 35 is a timing diagram for a single codeword per sector for a write operation, in accordance with the fourth embodiment of the invention.

FIG. 35 is a timing diagram of a single codeword per sector write operation. A write operation of one codeword per sector is performed when R/W_is set to "0" from "1" by HDC 22''' which is an indication to start a write operation. After waiting for a "fixed delay 1" as shown in FIG. 35, HDC 22''' asserts the DATA_VALID and sends the user data "A" onto the 8-bit NRZ bus. R/W channel 24''' latches each byte of user data "A" over the 8-bit NRZ bus at the rising edge of WCLK. The length of DATA_VALID should equal to (codeword size −1)*WCLK. After HDC 22''' de-asserts DATA_VALID, R/W channel 24''' can latch the last byte of valid data "A" from the 8-bit NRZ bus. Then a boundary codeword condition check is performed by R/W channel 24'''. If the total number of user data latched by R/W channel 24''' is not equal to the pre-programmed codeword size, an error is found, and DATA_FAULT signal will be asserted by R/W channel 24'''. Otherwise, HDC 22''' completes the transmission of the whole user data "A" to R/W channel 24''' for encoding. The encoded data "A" is stored inside the working buffer of R/W channel 24'''.

After waiting for a "fixed delay 2", HDC 22''' positions the head over the desirable track. HDC 22''' asserts the RWGATE to flush out the encoded data "A" inside the working buffer of R/W channel 24'''. Immediately following the assertion of RWGATE, HDC 22''' asserts the DATA_VALID and transmits the user data "B" via the 8-bit NRZ bus. R/W channel 24''' (1) latches each byte of user data "B" over the 8-bit NRZ bus at the rising edge of WCLK, (2) flushes out the encoded data "A" from its working buffer, and (3) asserts the EXT_W-GATE concurrently. R/W channel 24''' will automatically insert the PLO, Sync Mark and Padding data during the write operation for each sector. The length of the RWGATE only indicates the total number of data to be written into media for this Write operation. R/W channel 24''' counts the total number of WCLKs elapsed for this RWGATE to determine how much data is written onto the media. Therefore, the length of EXT_WGATE must be longer than the DATA_VALID. Before finishing writing the encoded data "A" to the media, a new encoded data "B" is stored inside the working buffer. R/W channel performs the boundary codeword condition check for data "B". Every time when HDC 22''' finishes transferring one codeword of data to R/W channel 24'', a boundary codeword is performed from R/W channel 24'''.

When HDC 22''' flushes out the encoded data inside R/W channel 24'', it also sends the next user data for R/W channel 24''' to be encoded. As long as HDC 22''' follows this sequence, R/W channel 24''' can perform back to back synchronized write operations.

In case HDC 22''' switches from a write operation to a read operation, HDC 22''' must flush out the pre-encoded data stored inside R/W channel 24''' working buffer. When HDC 22''' switches back from a read operation to a write operation, HDC 22''' pre-sends one codeword data to R/W channel 24''' first before performing the synchronized write operation as describe above.

FIG. 35 is a timing diagram of a write operation with a split sector. In this example, the user data "C" is split into two portions, namely data "C1" and data "C2". Since the whole user data "C" is already pre-send to R/W channel 24''' for encoding. When HDC 22''' asserts the RWGATE that has the length less than one codeword size, R/W channel 24''' automatically switches to split sector mode. In the preferred embodiment R/W channel 24''' permits only allow one split per codeword. The number of user data written for the "C1" is determine by the number of WCLKs elapsed under the current RWGATE, and it is used to flush out the encoded data "C1" portion. The number of user data written for the "C2" is determined by the number of WCLKs elapsed under the next RWGATE, and is used to flush out the encoded data "C2" portion. If the total length of these 2 RWGATEs is not equal to the codeword size, an error condition has occurred, and DATA_FAULT will be asserted by R/W channel 24'''.

Multiple Codewords Per Sector Write Operation

Figure 36:
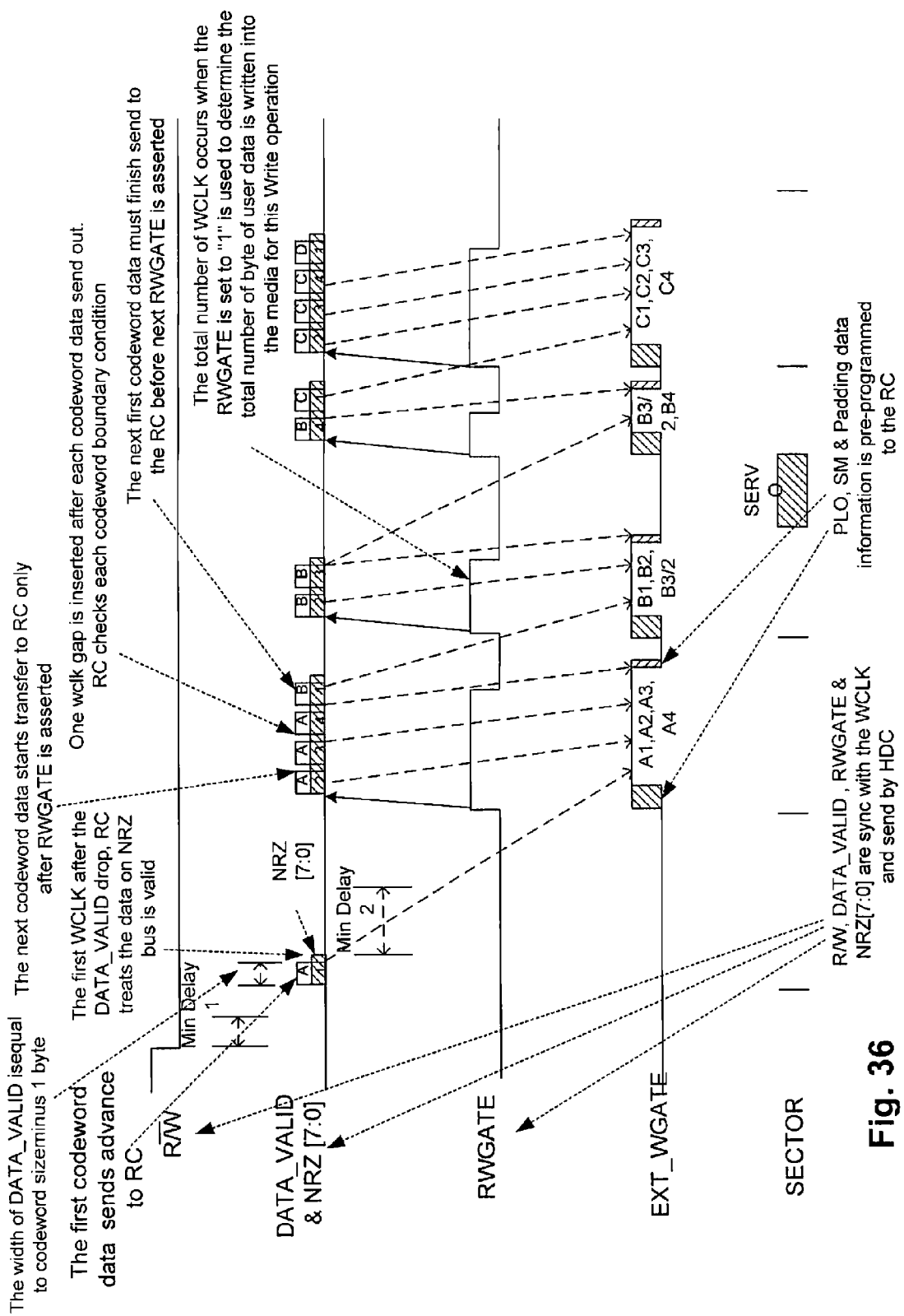
FIG. 36 is a timing diagram for multiple codewords per sector for a write operation, in accordance with the fourth embodiment of the invention.

FIG. 36 illustrates a timing diagram of a write operation having multiple codewords. In such a write operation, R/W_ is set to "0" from "1" by HDC 22''' which indicates a start of the write operation. After waiting for a "fixed delay 1" as shown in FIG. 36, HDC 22''' asserts the DATA_VALID and puts the valid user data "A1" onto the 8-bit NRZ bus. R/W channel 24''' latches each byte of user data "A1" over the 8-bit NRZ bus at the rising edge of WCLK. The length of DATA_VALID is equal to (codeword size −1)*WCLK. After HDC 22''' de-asserts the DATA_VALID, R/W channel 24''' latches the last byte of valid data "A" from the 8-bit NRZ bus. Then a boundary codeword condition check is performed by R/W channel 24'''. If the total number of user data latched by R/W channel 24''' is not equal to the pre-programmed codeword size, an error condition is determined, and a DATA_FAULT signal will be asserted. Otherwise, HDC 22''' completes the transmission of the remaining data "A1" to R/W channel 24''' for encoding. The encoded data "A1" is stored inside the working buffer of R/W channel 24'''

After waiting for a "fixed delay 2", HDC 22'' positions the head over the desirable track. HDC 22''' asserts the RWGATE to flush out the encoded data "A1" inside the working buffer of R/W channel 24'''. Immediately following the assertion of RWGATE, HDC 24''' asserts the DATA_VALID and moves the valid user data "A2" onto the 8-bit NRZ bus. R/W channel 24''' (1) latches each byte of user data "A2" over the 8-bit NRZ bus at the rising edge of WCLK, (2) flushes out the encoded data "A1" from its working buffer, and (3) asserts the EXT_WGATE concurrently. R/W channel 24''' will automatically insert the Sync Field (PLO), Sync Mark and Padding data during the Write operation for each sector. The length of the RWGATE indicates the total number of data to be written onto media for this write operation. R/W channel 24''' counts the total number of WCLKs elapsed for this RWGATE to determine how much data is written onto the media. Therefore, the length of EXT_WGATE must be longer than the DATA_VALID. Before finishing writing the encoded data "A1" to the media, the next encoded data "A2" is stored inside the working buffer. R/W channel 24''' performs the boundary codeword condition check for data "A2". Since the RWGATE is still asserted by HDC 22''' more than one codeword is being transmitted, and R/W channel 24''' automatically switches to the multi-codeword mode. The encoded data "A2" will continue to flush out right after the encoded data "A1". In FIG. 36, 4 codewords per sector is shown. Before finishing the writing of the encoded "A2" to the media, a new encoded data "A3" is stored inside the working buffer. The encoded data "A3" will continue to follow the encoded data "A2" to be written onto the media. Every time when HDC 22''' finishes, one codeword of data is transferred to R/W channel 24'''. The process repeats until the last encode data "A4" is finally sent to the media. At this point, R/W channel 24''' still has one encoded codeword data "B1" stored in its working buffer.

Since every time HDC 22''' flushes out the encoded data inside R/W channel 24''' the next user data for R/W channel 24''' is also sent to be encoded. As long as HDC 22''' follows this sequence, R/W channel 24''' can perform back to back synchronized write operations for multiple codewords per sector. In case HDC 22''' switches from a write operation to a read operations, HDC 22''' preferably flushes out the pre-encoded data stored inside the working buffer R/W channel 24'''. When HDC 22''' switches back from a read operation to a write operation, HDC 22''' preferably pre-sends one codeword data to R/W channel 24''' first before performing the synchronized write operation as described above.

FIG. 36 also illustrates a split sector. The user data "B1, B2,B3,B4" is split into data "B1,B2,B3/2" and data "B3/2, B4". R/W channel 24''' performs the write operation for data "B1", "B2" similarly as above description. Since the whole user data "B3" is already pre-sent to R/W channel 24''' for encoding, when HDC 22''' asserts the RWGATE, which has the length less than 3 codeword size, R/W channel 24''' auto—switches to split sector mode. In the preferred embodiment, R/W channel 24''' only allows one split per codeword. The number of user data written for the "B1,B2,B3/2" is determined by the number of WCLKs elapsed under this RWGATE, and is used to flush out the encoded data corresponding to the "B1,B2,B3/2" portion. The number of user data written for the "B3/2,B4" is determined by the number of WCLKs elapsed under the next RWGATE, and is used to flush out the encoded data "B3/2,B4" portion. If total combined length of these 2 RWGATE is not equal to 4 codeword size, an error has occurred, and a DATA_FAULT signal will be asserted by R/W channel 24'''.

Read Operation

Single Codeword Per Sector Read Operation

Figure 37:
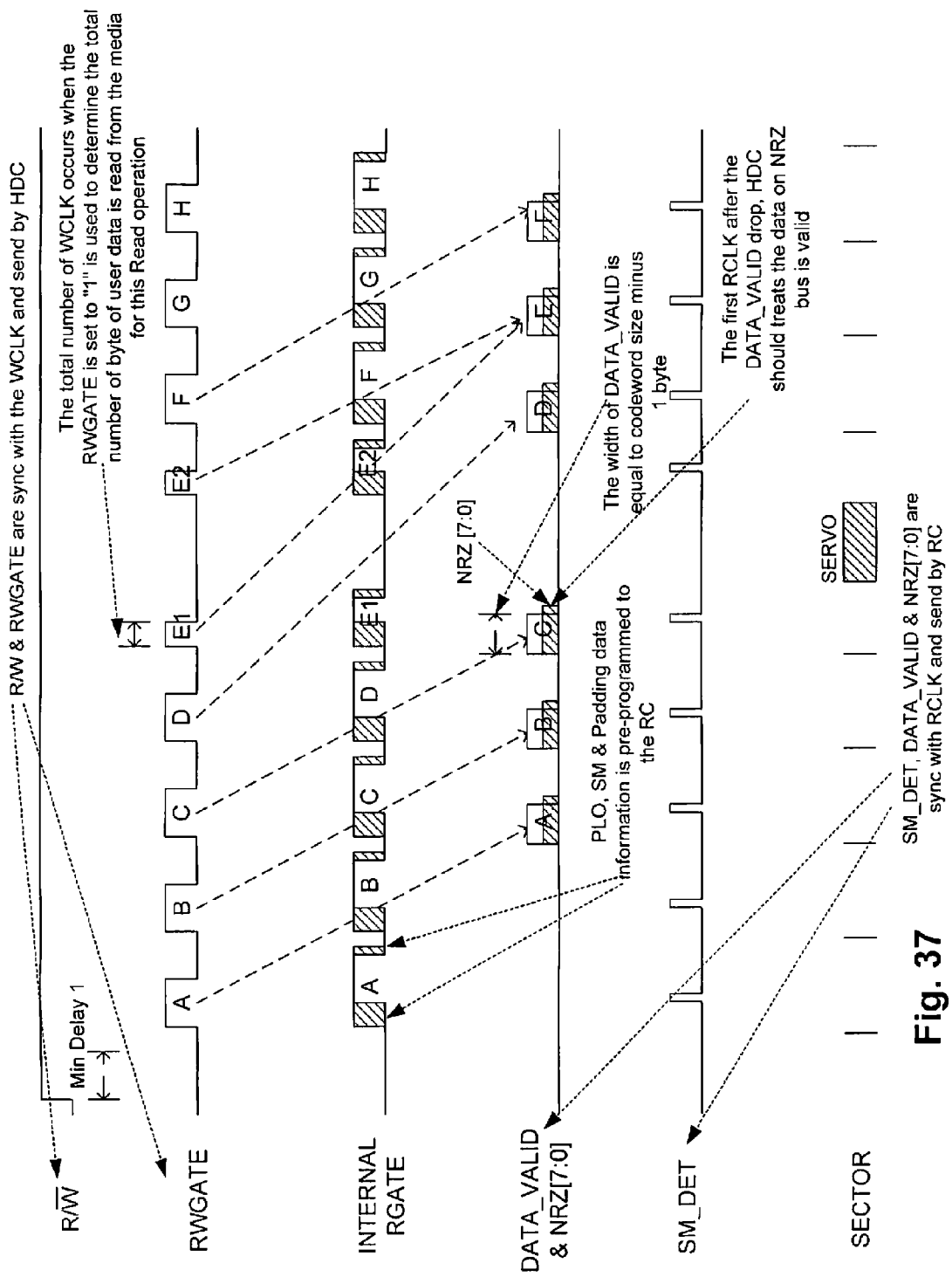
FIG. 37 is a timing diagram for a single codeword per sector for a read operation, in accordance with the fourth embodiment of the invention.

FIG. 37 illustrates a timing diagram of a single codeword per sector read operation. A read operation of a single codeword per sector is performed when R/W_is set to "1" from "0" by HDC 22''' that is indicated to start a read operation. After waiting for a "fixed delay 1" as shown in FIG. 37, HDC 22''' positions the head over the desirable track and asserts the RWGATE for data "A". The total number of WCLKs elapsed under this RWGATE is equal to total number user data expected from this read operation. As soon as R/W channel 24''' detects the assertion of RWGATE, R/W channel 24''' asserts the internal RGATE. RGATE is an extended version of RWGATE for a read operation. Since the Sync Field (PLO), Sync Mark and Padding data are pre-programmed into the registers of R/W channel 24'', R/W channel 24''' can be easy to extend the RGATE from RWGATE. As soon as iterative decoding is completed for data "A", R/W channel 24''' asserts DATA_VALID and sends the decoded data "A" back to HDC 22'''. HDC 22''' then latches each byte of data "A" at the rising edge of RCLK. The number of WCLKs under each DATA_VALID is equal to codeword size −1. After the de-assertion of DATA_VALID, HDC 22'' latches the last valid byte of decoded data "A". If the total number of bytes latched by HDC 22''' for each DATA_VALID is not equal to codeword size, an error has occurred. HDC 22''' handles the abnormal condition, by for example, retrying the read operation.

For a split sector read operation, HDC 22'' asserts the RWGATE twice to read the split sectors, as shown on FIG. 37. After HDC 22''' positions the head over the desirable track and asserts the first RWGATE for data "E1". The total number of WCLKs elapsed for this RWGATE is equal to the number of bytes expected to be read for this read operation. If the WCLKs under this RWGATE is less than one codeword size, R/W channel 24''' automatically switches to the split sector mode. R/W channel 24''' will wait for the next RWGATE to be asserted for data "E2". In the preferred embodiment, only one split per codeword is allowed. After combining the data during these RWGATEs, R/W channel 24''' will continue to perform the iterative decoding. When the decoding has been completed, the whole decoded codeword data "E" is sent to HDC 22''' through the 8-bit NRZ bus. In case the total combination of data "E1" and "E2" does not equal to codeword size boundary. a DATA_FAULT will be asserted by R/W channel 24'''. After completion of the iterative decoding, R/W channel 24''' automatically sends the decoded data to HDC 22'''. Of course, HDC 22''' must have an appropriately sized buffer before assertion of RWGATE.

Multiple Codewords Per Sector Read Operation

Figure 38:
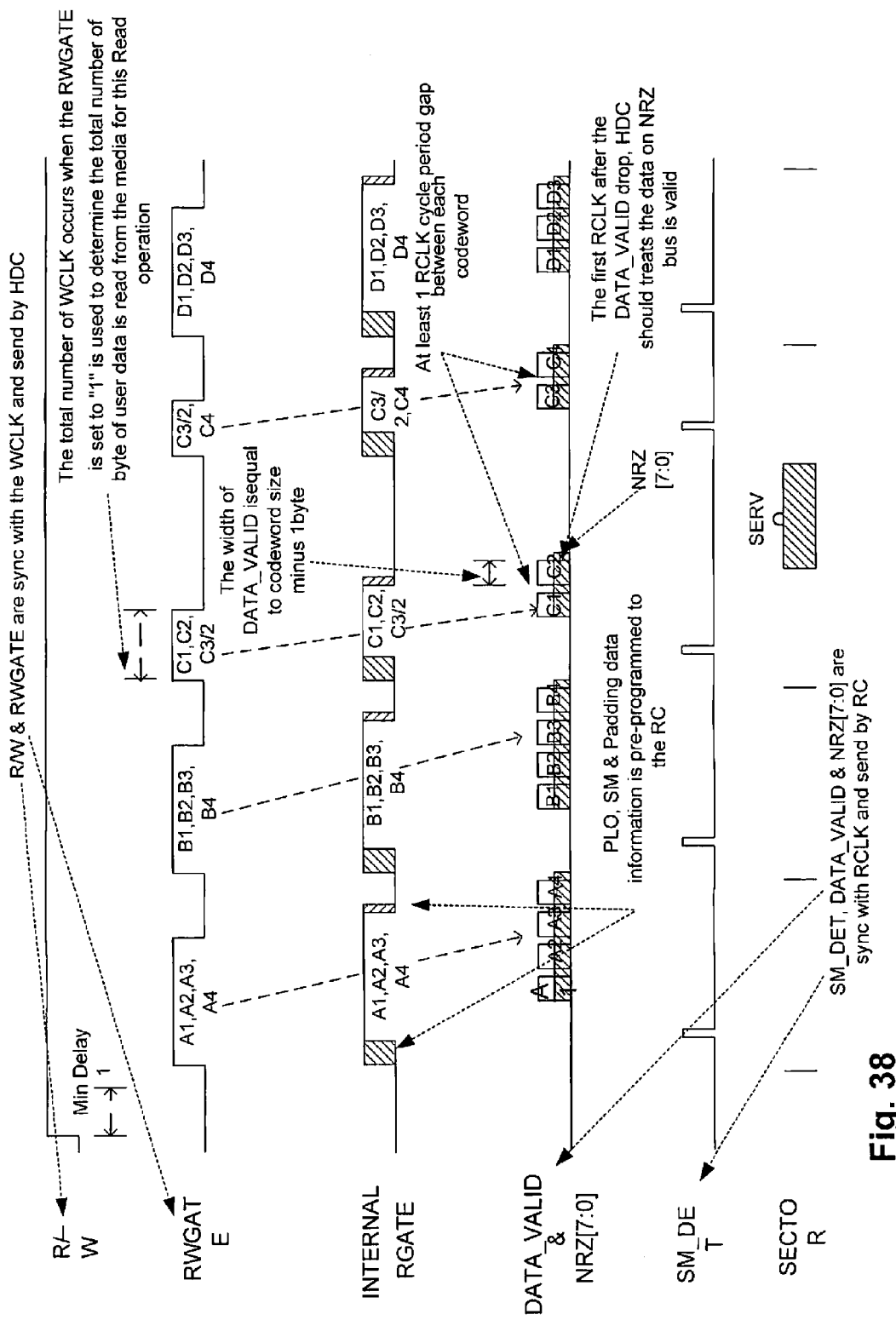
FIG. 38 is a timing diagram for multiple codewords per sector for a read operation, in accordance with the fourth embodiment of the invention.

FIG. 38 illustrates a read operation having multiple codewords per sector. In this read operation, R/W_ is set to "1" from "0" by HDC 22''' which indicates a start of a read operation. After waiting for a "fixed delay 1" as shown in FIG. 38, HDC 22''' positions the head over a desirable track and asserts the RWGATE for data "A1,A2,A3,A4". The total number of WCLKs elapsed under this RWGATE is equal to the total number of user data expected from this read operation. As soon as R/W channel 24''' detects the assertion of this RWGATE, R/W channel 24''' asserts the internal RGATE, which is an extended version of RWGATE for the read operation. Since the Sync Field (PLO), Sync Mark and Padding data are pre-programmed into R/W channel 24''' registers, R/W channel 24''' can easily extend the RGATE from the RWGATE. As soon as iterative decoding has completed for data "A1", R/W channel 24''' asserts DATA_VALID and sends the decoded data "A1" to HDC 22'''. HDC 22''' latches each byte of data "A1" at the rising edge of RCLK. The number of WCLKs under each DATA_VALID is equal to codeword size −1. After the de-assertion of DATA_VALID, HDC 22''' latches the last byte of decoded data "A1". If the total number of bytes latched by HDC 22''' for each DATA_

VALID is not equal to codeword size, an error has occurred. HDC 22''' request a retry of this read operation in response to this error condition. Since the length of RWGATE is longer than one codeword size, R/W channel 24''' automatically switches into the multi-codeword mode. The data "A1,A2, A3,A4" is decoded in a pipeline style. In other words, the decoded data "A2" follow the decoded data "A1". Since the length of DATA_VALID is always codeword size −1, it allows HDC 22''' to check the boundary condition for each data "A1", "A2", "A3", and "A4".

In case of split sector read operation, HDC 22''' asserts the RWGATE twice to read the split sectors as shown on FIG. 38. After HDC 22''' positions the head over the desirable track and asserts the first RWGATE for data "C1,C2,C3/2", the total number of WCLKs elapsed for this RWGATE is equal to the number of bytes expected to be read for this read operation. After counting the total number of WCLKs under this RWGATE which is not in codeword size boundary and it is greater than one codeword size, R/W channel 24''' automatically switches into the split sector mode. As soon as one codeword is completely decoded, R/W channel 24''' will assert the DATA_VALID and sends the decoded data to HDC 22'''. Since the data "C1,C2,C3/2" is processed in a pipelined manner by R/W channel 24''', data "C1,C2" is sent to HDC 22''' first. For the data "C3/2", R/W channel 24''' will wait for the next RWGATE before decoding the "C3/2". Once the next RWGATE is asserted for data "C3/2,C4", the data "C3" is decoded. As soon as R/W channel 24''' finishes the decoding process for data "C3", R/W channel 24''' asserts the DATA_VALID and sends the data "C3" to HDC 22'''. The data "C4" is decoded as described above.

R/W channel 24''' can perform back to back read operations. As soon as R/W channel 24''' finishes decoding one codeword under the split sector read case, the decoded data is automatically sent to HDC 22'''. HDC 22''' insures that it can receive the data before asserting the RWGATE.

The interface signaling protocol of the present invention may be controlled by a processor operating in accordance with a program of instructions, which may be in the form of software. Alternatively, the program of instructions may be implemented with discrete logic components, application specific integrated circuits (ASICs), digital signal processors, or the like. Based on the teachings herein, one skilled in the art would be able to implement an appropriate instruction program in either software or hardware for carrying out the interface signaling protocol of the present invention.

While embodiments of the invention have been described, it will be apparent to those skilled in the art in light of the foregoing description that many further alternatives, modifications and variations are possible. The invention described herein is intended to embrace all such alternatives, modifications and variations as may fall within the spirit and scope of the appended claims.

What is claimed is:

1. An interface that supports a signaling protocol between a first hardware component and a second hardware component, the interface comprising:
   a first pin to provide a write clock signal sourced from the first hardware component to the second hardware component during a write operation;
   a second pin to receive a read clock signal sourced from the second hardware component during a read operation; and
   a third pin to provide a first gate control signal sourced from the first hardware component to the second hardware component, the first gate control signal to synchronize data transfer between the first hardware component and the second hardware component during both the write operation and the read operation, the first gate control signal being asserted during both the write operation and the read operation,
   wherein the first gate control signal is gated based on the write clock signal or the read clock signal.

2. The interface of claim 1, wherein:
   the first hardware component comprises a hard disk controller; and
   the second hardware component comprises a read channel or a read/write channel.

3. The interface of claim 1, further comprising:
   a fourth pin to receive a buffer-full signal sourced from the second hardware component during the write operation, the buffer-full signal indicating that an internal buffer of the second hardware component is almost full.

4. The interface of claim 3, further comprising:
   a fifth pin to support transfer of serial control information from the first hardware component to the second hardware component during both the read operation and the write operation.

5. The interface of claim 4, wherein the serial control information comprises:
   a START bit;
   a predetermined number of bits of control data following the START bit; and
   an END bit following the predetermined number of bits of control data.

6. The interface of claim 5, wherein an unlimited number of predetermined bits of control data can be sent from the first hardware component to the second hardware component based on a corresponding value of the END bit.

7. The interface of claim 5, wherein the control data indicates one or more of:
   codeword size information;
   a start of a sync mark and a start of write padding data during the write operation; or
   whether a sync mark was detected during the read operation.

8. The interface of claim 1, wherein only the third pin is used to provide the first gate control signal to the second hardware component during both the write operation and the read operation.

9. The interface of claim 1, wherein the third pin communicates both a read gate signal and a write gate signal.

10. A method of interfacing a first hardware component and a second hardware component, the method comprising:
    providing a write clock signal sourced from the first hardware component to the second hardware component during a write operation;
    receiving a read clock signal sourced from the second hardware component during a read operation; and
    providing a first gate control signal sourced from the first hardware component to the second hardware component, the first gate control signal to synchronize data transfer between the first hardware component and the second hardware component during both the write operation and the read operation, the first gate control signal being asserted during both the write operation and the read operation,
    wherein the first gate control signal is gated based on the write clock signal or the read clock signal.

11. The method of claim 10, wherein:
    the first hardware component comprises a hard disk controller; and
    the second hardware component comprises a read channel or a read/write channel.

12. The method of claim 10, further comprising receiving a buffer-full signal sourced from the second hardware component during the write operation, the buffer-full signal indicating that an internal buffer of the second hardware component is almost full.

13. The method of claim 10, further comprising transferring serial control information from the first hardware component to the second hardware component during both the read operation and the write operation.

14. The method of claim 13, wherein the serial control information comprises:
   a START bit;
   a predetermined number of bits of control data following the START bit; and
   an END bit following the predetermined number of bits of control data.

15. The method of claim 14, wherein the control data indicates one or more of:
   codeword size information;
   a start of a sync mark and a start of write padding data during the write operation; or
   whether a sync mark was detected during the read operation.

16. The method of claim 14, wherein an unlimited number of predetermined bits of control data can be sent from the first hardware component to the second hardware component based on a corresponding value of the END bit.

17. The method of claim 10, wherein a single pin is used to provide the first gate control signal to the second hardware component during both the write operation and the read operation.

* * * * *